(12) United States Patent
Feng et al.

(10) Patent No.: US 12,334,020 B2
(45) Date of Patent: Jun. 17, 2025

(54) SHIFT REGISTER UNIT, GATE DRIVING CIRCUIT, AND GATE DRIVING METHOD

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Dacheng Zhang, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/031,560

(22) PCT Filed: May 24, 2022

(86) PCT No.: PCT/CN2022/094697
§ 371 (c)(1),
(2) Date: Apr. 12, 2023

(87) PCT Pub. No.: WO2023/225847
PCT Pub. Date: Nov. 30, 2023

(65) Prior Publication Data
US 2024/0371328 A1     Nov. 7, 2024

(51) Int. Cl.
*G09G 3/3266*     (2016.01)
*G11C 19/28*     (2006.01)

(52) U.S. Cl.
CPC ........... *G09G 3/3266* (2013.01); *G11C 19/28* (2013.01); *G09G 2310/0286* (2013.01); *G09G 2310/061* (2013.01); *G09G 2310/08* (2013.01)

(58) Field of Classification Search
CPC ......... G09G 3/3266; G09G 2310/0286; G09G 2310/061; G09G 2310/08; G11C 19/28
See application file for complete search history.

(56) References Cited

U.S. PATENT DOCUMENTS

| | | |
|---|---|---|
| 2007/0195920 A1 | 8/2007 | Tobita |
| 2009/0304139 A1 | 12/2009 | Tsai et al. |

(Continued)

FOREIGN PATENT DOCUMENTS

| | | |
|---|---|---|
| CN | 108932930 A | 12/2018 |
| CN | 109166527 A | 1/2019 |

(Continued)

*Primary Examiner* — Premal R Patel
(74) *Attorney, Agent, or Firm* — HOUTTEMAN LAW LLC

(57) ABSTRACT

The present disclosure provides shift register unit, including: sensing control circuit connected to sensing signal input terminal, random signal input terminal, and sensing control node, and configured to write signal provided by sensing signal input terminal to sensing control node in response to active level signal provided by random signal input terminal; first sensing input circuit connected to clock control signal input terminal, sensing control node, and first pull-up node, and configured to write signal provided by clock control signal input terminal to first pull-up node only in response to active level signal at sensing control node; and first driving output circuit connected to first pull-up node, first driving clock signal input terminal, and first driving signal output terminal, and configured to write signal provided by first driving clock signal input terminal to first driving signal output terminal in response to active level signal at first pull-up node.

19 Claims, 39 Drawing Sheets

(56) References Cited

U.S. PATENT DOCUMENTS

| | | |
|---|---|---|
| 2018/0337682 A1 | 11/2018 | Takasugi et al. |
| 2020/0074907 A1 | 3/2020 | Tagawa et al. |
| 2020/0135286 A1* | 4/2020 | Li ........................ G09G 3/3266 |
| 2021/0065630 A1* | 3/2021 | Feng ...................... G11C 19/28 |
| 2021/0201768 A1 | 7/2021 | Jo |

FOREIGN PATENT DOCUMENTS

| | | |
|---|---|---|
| CN | 109658865 A | 4/2019 |
| CN | 109935185 A | 6/2019 |
| CN | 109935198 A | 6/2019 |
| CN | 109935201 A | 6/2019 |
| CN | 109935204 A | 6/2019 |
| CN | 110428772 A | 11/2019 |
| CN | 110517637 A | 11/2019 |
| CN | 110858469 A | 3/2020 |
| CN | 111243543 A | 6/2020 |
| CN | 111312140 A | 6/2020 |
| CN | 112447133 A | 3/2021 |
| CN | 112447141 A | 3/2021 |
| CN | 113140187 A | 7/2021 |
| JP | 2010108567 A | 5/2010 |
| JP | 2014174220 A | 9/2014 |
| WO | 2011114562 A1 | 9/2011 |
| WO | WO-2020038125 A1 * | 2/2020 ........... G09G 3/2092 |

* cited by examiner

SHIFT REGISTER UNIT, GATE DRIVING CIRCUIT, AND GATE DRIVING METHOD

CROSS-REFERENCE TO RELATED APPLICATION

This is a National Phase Application filed under 35 U.S.C. 371 as a national stage of PCT/CN2022/094697, filed on May 24, 2022, the contents of which are incorporated herein by reference in their entirety.

TECHNICAL FIELD

The present disclosure relates to the display field, and in particular, to a shift register unit, a gate driving circuit, and a gate driving method.

BACKGROUND

Active Matrix Organic Light Emitting Diode (AMOLED) panels have been applied more and more widely. A pixel display device in an AMOLED is an Organic Light-Emitting Diode (OLED), and the AMOLED can emit light by driving a thin film transistor to generate a driving current in a saturated state, and driving a light-emitting device by the driving current to emit light.

SUMMARY

In a first aspect, the embodiments of the present disclosure provide a shift register unit, including:
  a sensing control circuit connected to a sensing signal input terminal, a random signal input terminal, and a sensing control node, and configured to write a signal provided by the sensing signal input terminal to the sensing control node in response to control of an active level signal provided by the random signal input terminal;
  a first sensing input circuit connected to a clock control signal input terminal, the sensing control node, and a first pull-up node, and configured to write a signal provided by the clock control signal input terminal to the first pull-up node only in response to control of an active level signal at the sensing control node; and
  a first driving output circuit connected to the first pull-up node, a first driving clock signal input terminal, and a first driving signal output terminal, and configured to write a signal provided by the first driving clock signal input terminal to the first driving signal output terminal in response to control of an active level signal at the first pull-up node.

In some embodiments, the first sensing input circuit includes: a second transistor; and
  a control electrode of the second transistor is connected to the sensing control node, a first electrode of the second transistor is connected to the clock control signal input terminal, and a second electrode of the second transistor is connected to the first pull-up node.

In some embodiments, the shift register unit further includes:
  a first display input circuit connected to a display signal input terminal, a third power supply terminal, and the first pull-up node, and configured to write an active level signal provided by the third power supply terminal to the first pull-up node in response to control of an active level signal provided by the display signal input terminal;
  a second driving output circuit connected to the first pull-up node, a second driving clock signal input terminal, and a second driving signal output terminal, and configured to write a signal provided by the second driving clock signal input terminal to the second driving signal output terminal in response to control of an active level signal at the first pull-up node; and
  a first cascade output circuit connected to the first pull-up node, a first cascade clock signal input terminal, and a first cascade signal output terminal, and configured to write a signal provided by the first cascade clock signal input terminal to the first cascade signal output terminal in response to control of an active level signal at the first pull-up node.

In some embodiments, the shift register unit further includes:
  a first voltage control circuit connected to the third power supply terminal, the first pull-up node, and a first voltage control node, and configured to write an active level signal provided by the third power supply terminal to the first voltage control node in response to control of an active level signal at the first pull-up node; and
  the shift register unit further includes: a first sensing input anti-leakage circuit, wherein the first sensing input circuit is connected to the clock control signal input terminal through the first sensing input anti-leakage circuit, and is connected to the first sensing input anti-leakage circuit at a first sensing input anti-leakage node, and the first sensing input anti-leakage node is connected to the first voltage control node; and
  the first sensing input anti-leakage circuit is connected to the sensing control node, and is configured to form a path between the first sensing input anti-leakage node and the clock control signal input terminal in response to control of an active level signal at the sensing control node, and cut off the path between the first sensing input anti-leakage node and the clock control signal input terminal in response to control of an inactive level signal at the sensing control node.

In some embodiments, the first voltage control circuit includes: a twentieth transistor;
  a control electrode of the twentieth transistor is connected to the first pull-up node, a first electrode of the twentieth transistor is connected to the third power supply terminal, and a second electrode of the twentieth transistor is connected to the first voltage control node;
  the first sensing input anti-leakage circuit includes: a third transistor; and
  a control electrode of the third transistor is connected to the sensing control node, a first electrode of the third transistor is connected to the clock control signal input terminal, and a second electrode of the third transistor is connected to the first sensing input anti-leakage node.

In some embodiments, the shift register unit further includes: a first sensing input anti-leakage circuit, wherein the first sensing input circuit is connected to the clock control signal input terminal through the first sensing input anti-leakage circuit, and is connected to the first sensing input anti-leakage circuit at a first sensing input anti-leakage node; and
  the first sensing input anti-leakage circuit is connected to a preset input control signal input terminal and the first cascade signal output terminal, and is configured to form a path between the first sensing input anti-leakage node and the clock control signal input terminal in response to control of an active level signal provided by the preset input control signal input terminal, cut off the path between the first sensing input anti-leakage node and the clock control signal input terminal in response to control of an inactive level signal provided by the preset input control signal input terminal, and write an active level signal to the first sensing input anti-leakage node in response to control of an active level signal provided by the first cascade signal output terminal when the path between the first sensing input anti-leakage node and the clock control signal input terminal is cut off.

In some embodiments, the first sensing input anti-leakage circuit includes: a third transistor and a fourth transistor;
- a control electrode of the third transistor is connected to the preset input control signal input terminal, a first electrode of the third transistor is connected to the clock control signal input terminal, and a second electrode of the third transistor is connected to the first sensing input anti-leakage node; and
- a control electrode and a first electrode of the fourth transistor are both connected to the first cascade signal output terminal, and a second electrode of the fourth transistor is connected to the first sensing input anti-leakage node.

In some embodiments, the shift register unit further includes:
- a first global reset circuit connected to a global reset signal input terminal, a second power supply terminal, and the first pull-up node, and configured to write an inactive level signal provided by the second power supply terminal to the first pull-up node in response to control of an active level signal provided by the global reset signal input terminal;
- a first display reset circuit connected to a display reset signal input terminal, the second power supply terminal, and the first pull-up node, and configured to write an inactive level signal provided by the second power supply terminal to the first pull-up node in response to control of an active level signal provided by the display reset signal input terminal;
- a first pull-down control circuit connected to the second power supply terminal, a fifth power supply terminal, the first pull-up node, and a first pull-down node, and configured to write a voltage having a phase opposite to that of a voltage at the first pull-up node to the first pull-down node; and
- a first pull-up noise reduction circuit connected to the second power supply terminal, the first pull-up node, and the first pull-down node, and configured to write an inactive level signal provided by the second power supply terminal to the first pull-up node in response to control of an active level signal at the first pull-down node;
- the first cascade output circuit is further connected to the first pull-down node and the second power supply terminal, and is further configured to write an inactive level signal provided by the second power supply terminal to the first cascade signal output terminal in response to control of an active level signal at the first pull-down node;
- the first driving output circuit is further connected to the first pull-down node and a fourth power supply terminal, and is further configured to write an inactive level signal provided by the fourth power supply terminal to the first driving signal output terminal in response to control of an active level signal at the first pull-down node; and
- the second driving output circuit is further connected to the first pull-down node and the fourth power supply terminal, and is further configured to write an inactive level signal provided by the fourth power supply terminal to the second driving signal output terminal in response to control of an active level signal at the first pull-down node.

In some embodiments, the shift register unit further includes:
- a first voltage control circuit connected to the third power supply terminal, the first pull-up node, and a first voltage control node, and configured to write an active level signal provided by the third power supply terminal to the first voltage control node in response to control of an active level signal at the first pull-up node; and
- the shift register unit further includes: at least one of a first anti-leakage circuit, a second anti-leakage circuit, and a third anti-leakage circuit;
- the first global reset circuit is connected to the second power supply terminal through the first anti-leakage circuit, and is connected to the first anti-leakage circuit at a first anti-leakage node, and the first anti-leakage node is connected to the first voltage control node; and the first anti-leakage circuit is connected to the global reset signal input terminal, and is configured to form a path between the first anti-leakage node and the second power supply terminal in response to control of an active level signal provided by the global reset signal input terminal, and cut off the path between the first anti-leakage node and the second power supply terminal in response to control of an inactive level signal provided by the global reset signal input terminal;
- the first display reset circuit is connected to the second power supply terminal through the second anti-leakage circuit, and is connected to the second anti-leakage circuit at a second anti-leakage node, and the second anti-leakage node is connected to the first voltage control node; and the second anti-leakage circuit is connected to the display reset signal input terminal, and is configured to form a path between the second anti-leakage node and the second power supply terminal in response to control of an active level signal provided by the display reset signal input terminal, and cut off the path between the second anti-leakage node and the second power supply terminal in response to control of an inactive level signal provided by the display reset signal input terminal; and the first pull-up noise reduction circuit is connected to the second power supply terminal through the third anti-leakage circuit, and is connected to the third anti-leakage circuit at a third anti-leakage node, and the third anti-leakage node is connected to the first voltage control node; and the third anti-leakage circuit is connected to the first pull-down node, and is configured to form a path between the third anti-leakage node and the second power supply terminal in response to control of an active level signal at the first pull-down node, and cut off the path between the third anti-leakage node and the second power supply terminal in response to control of an inactive level signal at the first pull-down node.

In some embodiments, the shift register unit further includes:
- a first sensing reset circuit connected to a sensing reset signal input terminal, the sensing control node, the first pull-up node, and a second power supply terminal, and configured to write an inactive level signal provided by the second power supply terminal to the first pull-up node in response to control of a signal provided by the sensing reset signal input terminal and an active level signal at the sensing control node.

In some embodiments, the first sensing reset circuit includes:
- a first sensing reset control circuit connected to the sensing reset signal input terminal, a first sensing reset control node, the sensing control node, and the second power supply terminal, and configured to write an active level signal at the sensing control node to the first sensing reset control node in response to control of an inactive level signal provided by the sensing reset signal input terminal and the active level signal at the sensing control node; and
- a first switch circuit connected to the first sensing reset control node, the first pull-up node, and the second power supply terminal, and configured to form a path between the second power supply terminal and the first pull-up node in response to control of an active level signal at the first sensing reset control node, and cut off the path between the second power supply terminal and the first pull-up node in response to control of an inactive level signal at the first sensing reset control node.

In some embodiments, the first sensing reset control circuit includes: a seventy-first transistor and a seventy-second transistor, and the first switch circuit includes: a seventy-third transistor;
- a control electrode and a first electrode of the seventy-first transistor are both connected to the sensing control node, and a second electrode of the seventy-first transistor is connected to the first sensing reset control node;
- a control electrode of the seventy-second transistor is connected to the sensing reset signal input terminal, a first electrode of the seventy-second transistor is connected to the first sensing reset control node, and a second electrode of the seventy-second transistor is connected to the second power supply terminal; and
- a control electrode of the seventy-third transistor is connected to the first sensing reset control node, a first electrode of the seventy-third transistor is connected to the first pull-up node, and a second electrode of the seventy-third transistor is connected to the second power supply terminal.

In some embodiments, the shift register unit further includes:
- a first voltage control circuit connected to a third power supply terminal, the first pull-up node, and a first voltage control node, and configured to write an active level signal provided by the third power supply terminal to the first voltage control node in response to control of an active level signal at the first pull-up node; and
- the shift register unit further includes: a first sensing reset anti-leakage circuit, and the first switch circuit is connected to the second power supply terminal through the first sensing reset anti-leakage circuit, and is connected to the first sensing reset anti-leakage circuit at a first sensing reset anti-leakage node, and the first sensing reset anti-leakage node is connected to the first voltage control node; and
- the first sensing reset anti-leakage circuit is connected to the first sensing reset control node, and is configured to form a path between the first sensing reset anti-leakage node and the second power supply terminal in response to control of an active level signal at the first sensing reset control node, and cut off the path between the first sensing reset anti-leakage node and the second power supply terminal in response to control of an inactive level signal at the first sensing reset control node.

In some embodiments, the first voltage control circuit includes: a twentieth transistor;
- a control electrode of the twentieth transistor is connected to the first pull-up node, a first electrode of the twentieth transistor is connected to the third power supply terminal, and a second electrode of the twentieth transistor is connected to the first voltage control node;
- the first sensing reset anti-leakage circuit includes: a seventy-fourth transistor; and
- a control electrode of the seventy-fourth transistor is connected to the first sensing reset control node, a first electrode of the seventy-fourth transistor is connected to the first sensing reset anti-leakage node, and a second electrode of the seventy-fourth transistor is connected to the second power supply terminal.

In some embodiments, the first sensing reset circuit includes: a second switch circuit and a third switch circuit connected in series between the first pull-up node and a second power supply terminal, and the second switch circuit is between the third switch circuit and the first pull-up node;
- one of the second switch circuit and the third switch circuit is connected to the sensing reset signal input terminal, and the other is connected to the sensing control node; and
- the second switch circuit and the third switch circuit are configured to form a path between the second power supply terminal and the first pull-up node in response to control of an active level signal provided by the sensing reset signal input terminal and an active level signal at the sensing control node, and cut off the path between the second power supply terminal and the first pull-up node in response to control of a low level signal provided by at least one of the sensing reset signal input terminal and the sensing control node.

In some embodiments, the second switch circuit includes: a seventy-first transistor, and the third switch circuit includes: a seventy-second transistor;
- a control electrode of one of the seventy-first transistor and the seventy-second transistor is connected to the sensing reset signal input terminal, and a control electrode of the other is connected to the sensing control node; and
- a first electrode of the seventy-first transistor is connected to the first pull-up node, a second electrode of the seventy-first transistor is connected to a first electrode of the seventy-second transistor, and a second electrode of the seventy-second transistor is connected to the second power supply terminal.

In some embodiments, the shift register unit further includes:
- a first voltage control circuit connected to a third power supply terminal, the first pull-up node, and a first voltage control node, and configured to write an active level signal provided by the third power supply terminal to the first voltage control node in response to control of an active level signal at the first pull-up node;

the shift register unit further includes: a first sensing reset anti-leakage circuit;

the second switch circuit is connected to the sensing reset signal input terminal, is connected to the third switch circuit through the first sensing reset anti-leakage circuit, and is connected to the first sensing reset anti-leakage circuit at a first sensing reset anti-leakage node, and the first sensing reset anti-leakage node is connected to the first voltage control node; and the first sensing reset anti-leakage circuit is connected to the sensing reset signal input terminal, and is configured to form a path between the first sensing reset anti-leakage node and the third switch circuit in response to control of an active level signal at the sensing reset signal input terminal, and cut off the path between the first sensing reset anti-leakage node and the third switch circuit in response to control of an inactive level signal at the sensing reset signal input terminal; or the third switch circuit is connected to the sensing reset signal input terminal, is connected to the second power supply terminal through the first sensing reset anti-leakage circuit, and is connected to the first sensing reset anti-leakage circuit at the first sensing reset anti-leakage node, and the first sensing reset anti-leakage node is connected to the first voltage control node; and the first sensing reset anti-leakage circuit is connected to the sensing reset signal input terminal, and is configured to form a path between the first sensing reset anti-leakage node and the second power supply terminal in response to control of an active level signal at the sensing reset signal input terminal, and cut off the path between the first sensing reset anti-leakage node and the second power supply terminal in response to control of an inactive level signal at the sensing reset signal input terminal.

In some embodiments, the first voltage control circuit includes: a twentieth transistor;

a control electrode of the twentieth transistor is connected to the first pull-up node, a first electrode of the twentieth transistor is connected to the third power supply terminal, and a second electrode of the twentieth transistor is connected to the first voltage control node;

the first sensing reset anti-leakage circuit includes: a seventy-fourth transistor, a control electrode of the seventy-fourth transistor is connected to the sensing reset signal input terminal, and a first electrode of the seventy-fourth transistor is connected to the first sensing reset anti-leakage node;

in a case where the second switch circuit is connected to the sensing reset signal input terminal, a second electrode of the seventy-fourth transistor is connected to the third switch circuit; and in a case where the third switch circuit is connected to the sensing reset signal input terminal, the second electrode of the seventy-fourth transistor is connected to the second power supply terminal.

In some embodiments, the shift register unit further includes:

a second sensing input circuit connected to the clock control signal input terminal, the sensing control node, and a second pull-up node, and configured to write a signal provided by the clock control signal input terminal to the second pull-up node in response to control of an active level signal at the sensing control node;

a second display input circuit connected to the display signal input terminal and the second pull-up node, and configured to write an active level signal to the second pull-up node in response to control of an active level signal provided by the display signal input terminal;

a third driving output circuit connected to the second pull-up node, a third driving clock signal input terminal, and a third driving signal output terminal, and configured to write a signal provided by the third driving clock signal input terminal to the third driving signal output terminal in response to control of an active level signal at the second pull-up node; and a fourth driving output circuit connected to the second pull-up node, a fourth driving clock signal input terminal, and a fourth driving signal output terminal, and configured to write a signal provided by the fourth driving clock signal input terminal to the fourth driving signal output terminal in response to control of an active level signal at the second pull-up node.

In some embodiments, the second sensing input circuit includes: a thirty-second transistor; and a control electrode of the thirty-second transistor is connected to the sensing control node, a first electrode of the thirty-second transistor is connected to the clock control signal input terminal, and a second electrode of the thirty-second transistor is connected to the second pull-up node.

In some embodiments, in a case where a first sensing input anti-leakage circuit is provided in the shift register unit, the second sensing input circuit is connected to a first sensing input anti-leakage node, so to be connected to a clock control signal input terminal through the first sensing input anti-leakage node and the first sensing input anti-leakage circuit.

In some embodiments, the shift register unit further includes:

a second cascade output circuit connected to the second pull-up node, a second cascade clock signal input terminal, and a second cascade signal output terminal, and configured to write a signal provided by the second cascade clock signal input terminal to the second cascade signal output terminal in response to control of an active level signal at the second pull-up node; and the shift register unit further includes: a second sensing input anti-leakage circuit, wherein the second sensing input circuit is connected to a clock control signal input terminal through the second sensing input anti-leakage circuit, and is connected to the second sensing input anti-leakage circuit at a second sensing input anti-leakage node; and the second sensing input anti-leakage circuit is connected to a preset input control signal input terminal and the second cascade signal output terminal, and is configured to form a path between the second sensing input anti-leakage node and the clock control signal input terminal in response to control of an active level signal provided by the preset input control signal input terminal, cut off the path between the second sensing input anti-leakage node and the clock control signal input terminal in response to control of an inactive level signal provided by the preset input control signal input terminal, and write an active level signal to the second sensing input anti-leakage node in response to control of an active level signal provided by the second cascade signal output terminal when the path between the second sensing input anti-leakage node and the clock control signal input terminal is cut off.

In some embodiments, the second sensing input anti-leakage circuit includes: a thirty-third transistor and a thirty-fourth transistor;

a control electrode of the thirty-third transistor is connected to the preset input control signal input terminal, a first electrode of the thirty-third transistor is connected to the clock control signal input terminal, and a second electrode of the thirty-third transistor is connected to the second sensing input anti-leakage node; and a control electrode and a first electrode of the thirty-fourth transistor are both connected to the second cascade signal output terminal, and a second electrode of the thirty-fourth transistor is connected to the second sensing input anti-leakage node.

In some embodiments, the shift register unit further includes:

a second global reset circuit connected to a global reset signal input terminal, a first inactive level supply terminal, and the second pull-up node, and configured to write an inactive level signal provided by the first inactive level supply terminal to the second pull-up node in response to control of an active level signal provided by the global reset signal input terminal;

a second display reset circuit connected to a display reset signal input terminal, the first inactive level supply terminal, and the second pull-up node, and configured to write an inactive level signal provided by the first inactive level supply terminal to the second pull-up node in response to control of an active level signal provided by the display reset signal input terminal;

a second pull-down control circuit connected to a second power supply terminal, a sixth power supply terminal, the second pull-up node, and a second pull-down node, and configured to write a voltage having an opposite phase relative to a voltage at the second pull-up node to the second pull-down node; and a second pull-up noise reduction circuit connected to the first inactive level supply terminal, the second pull-up node, and the second pull-down node, and configured to write an inactive level signal provided by the first inactive level supply terminal to the second pull-up node in response to control of an active level signal at the second pull-down node; and the third driving output circuit is further connected to the second pull-down node and a fourth power supply terminal, and is further configured to write an inactive level signal provided by the fourth power supply terminal to the third driving signal output terminal in response to control of an active level signal at the second pull-down node; and the fourth driving output circuit is further connected to the second pull-down node and the fourth power supply terminal, and is further configured to write an inactive level signal provided by the fourth power supply terminal to the fourth driving signal output terminal in response to control of an active level signal at the second pull-down node.

In some embodiments, the first inactive level supply terminal is the second power supply terminal;

or, the shift register unit includes a first voltage control circuit, and the first inactive level supply terminal is a first voltage control node connected to the first voltage control circuit.

In some embodiments, the first inactive level supply terminal is the second power supply terminal;

the shift register unit further includes:

a second voltage control circuit connected to an active level supply terminal, the second pull-up node, and a second voltage control node, and configured to write an active level signal provided by the active level supply terminal to the second voltage control node in response to control of an active level signal at the second pull-up node;

the shift register unit further includes: at least one of a fourth anti-leakage circuit, a fifth anti-leakage circuit, and a sixth anti-leakage circuit;

the second global reset circuit is connected to the second power supply terminal through the fourth anti-leakage circuit, and is connected to the fourth anti-leakage circuit at a fourth anti-leakage node, and the fourth anti-leakage node is connected to the second voltage control node; and the fourth anti-leakage circuit is connected to the global reset signal input terminal, and is configured to form a path between the fourth anti-leakage node and the second power supply terminal in response to control of an active level signal provided by the global reset signal input terminal, and cut off the path between the fourth anti-leakage node and the second power supply terminal in response to control of an inactive level signal provided by the global reset signal input terminal;

the second display reset circuit is connected to the second power supply terminal through the fifth anti-leakage circuit, and is connected to the fifth anti-leakage circuit at a fifth anti-leakage node, and the fifth anti-leakage node is connected to the second voltage control node; and the fifth anti-leakage circuit is connected to the display reset signal input terminal, and is configured to form a path between the fifth anti-leakage node and the second power supply terminal in response to control of an active level signal provided by the display reset signal input terminal, and cut off the path between the fifth anti-leakage node and the second power supply terminal in response to control of an inactive level signal provided by the display reset signal input terminal; and the second pull-up noise reduction circuit is connected to the second power supply terminal through the sixth anti-leakage circuit, and is connected to the sixth anti-leakage circuit at a sixth anti-leakage node, and the sixth anti-leakage node is connected to the second voltage control node; and the sixth anti-leakage circuit is connected to the second pull-down node, and is configured to form a path between the sixth anti-leakage node and the second power supply terminal in response to control of an active level signal at the second pull-down node, and cut off the path between the sixth anti-leakage node and the second power supply terminal in response to control of an inactive level signal at the second pull-down node.

In some embodiments, the shift register unit includes a first sensing reset circuit including a first sensing reset control circuit and a first switch circuit; and the shift register unit further includes: a second sensing reset circuit including:

a second sensing reset control circuit connected to a sensing reset signal input terminal, a second sensing reset control node, a second power supply terminal, and the sensing control node, and configured to write an active level signal at the sensing control node to the second sensing reset control node in response to control of an inactive level signal provided by the sensing reset signal input terminal and the active level signal at the sensing control node; and a fourth switch circuit connected to the second sensing reset control node, the second pull-up node, and a second inactive level supply terminal, and configured to form a path between the second inactive level supply terminal and the second pull-up node in response to control of an active level signal at the second sensing reset control node, and cut off the path between the second inactive level supply terminal and the second pull-up node in response to control of an inactive level signal at the second sensing reset control node.

In some embodiments, the second sensing reset control circuit includes: an eighty-first transistor and an eighty-second transistor, and the fourth switch circuit includes: an eighty-third transistor;

a control electrode and a first electrode of the eighty-first transistor are both connected to the sensing control node, and a second electrode of the eighty-first transistor is connected to the second sensing reset control node;

a control electrode of the eighty-second transistor is connected to the sensing reset signal input terminal, a first electrode of the eighty-second transistor is connected to the second sensing reset control node, and a second electrode of the eighty-second transistor is connected to the second power supply terminal; and a control electrode of the eighty-third transistor is connected to the second sensing reset control node, a first electrode of the eighty-third transistor is connected to the second pull-up node, and a second electrode of the eighty-third transistor is connected to the second inactive level supply terminal.

In some embodiments, the second inactive level supply terminal is the second power supply terminal; and the shift register unit further includes:

a second voltage control circuit connected to a third power supply terminal, the second pull-up node, and a second voltage control node, and configured to write an active level signal provided by the third power supply terminal to the second voltage control node in response to control of an active level signal at the second pull-up node;

the shift register unit further includes: a second sensing reset anti-leakage circuit, the fourth switch circuit is connected to the second power supply terminal through the second sensing reset anti-leakage circuit, and is connected to the second sensing reset anti-leakage circuit at a second sensing reset anti-leakage node, and the second sensing reset anti-leakage node is connected to the second voltage control node; and the second sensing reset anti-leakage is connected to the second sensing reset control node, and is configured to form a path between the second sensing reset anti-leakage node and the second power supply terminal in response to control of an active level signal at the second sensing reset control node, and cut off the path between the second sensing reset anti-leakage node and the second power supply terminal in response to control of an inactive level signal at the second sensing reset control node.

In some embodiments, the second voltage control circuit includes: a fiftieth transistor;

a control electrode of the fiftieth transistor is connected to the second pull-up node, a first electrode of the fiftieth transistor is connected to the third power supply terminal, and a second electrode of the fiftieth transistor is connected to the second voltage control node;

the second sensing reset anti-leakage circuit includes: an eighty-fourth transistor; and a control electrode of the eighty-fourth transistor is connected to the second sensing reset control node, a first electrode of the eighty-fourth transistor is connected to the second sensing reset anti-leakage node, and a second electrode of the eighty-fourth transistor is connected to the second power supply terminal.

In some embodiments, the shift register unit includes a first voltage control circuit, wherein the second inactive level supply terminal is a first voltage control node connected to the first voltage control circuit.

In some embodiments, the shift register unit further includes a first sensing reset circuit including a second switch circuit and a third switch circuit; and the shift register unit further includes: a second sensing reset circuit, and the second sensing reset circuit includes: a fifth switch circuit and a sixth switch circuit connected in series between the second pull-up node and a second power supply terminal, and the fifth switch circuit is between the sixth switch circuit and the second pull-up node;

one of the fifth switch circuit and the sixth switch circuit is connected to a sensing reset signal input terminal, and the other is connected to the sensing control node; and the fifth switch circuit and the sixth switch circuit are configured to form a path between the second power supply terminal and the second pull-up node in response to control of an active level signal provided by the sensing reset signal input terminal and an active level signal at the sensing control node, and cut off the path between the second power supply terminal and the second pull-up node in response to control of a low level signal provided by at least one of the sensing reset signal input terminal and the sensing control node.

In some embodiments, the fifth switch circuit includes: an eighty-first transistor, and the sixth switch circuit includes: an eighty-second transistor;

a control electrode of one of the eighty-first transistor and the eighty-second transistor is connected to the sensing reset signal input terminal, and a control electrode of the other is connected to the sensing control node; and a first electrode of the eighty-first transistor is connected to a first pull-up node, a second electrode of the eighty-first transistor is connected to a first electrode of the eighty-second transistor, and a second electrode of the eighty-second transistor is connected to the second power supply terminal.

In some embodiments, the shift register unit further includes:

a second voltage control circuit connected to a third power supply terminal, the second pull-up node, and a second voltage control node, and configured to write an active level signal provided by the third power supply terminal to the second voltage control node in response to control of an active level signal at the second pull-up node; and the shift register unit further includes: a second sensing reset anti-leakage circuit;

the fifth switch circuit is connected to the sensing reset signal input terminal, is connected to the sixth switch circuit through the second sensing reset anti-leakage circuit, and is connected to the second sensing reset anti-leakage circuit at a second sensing reset anti-leakage node, and the second sensing reset anti-leakage node is connected to the second voltage control node; and the second sensing reset anti-leakage circuit is connected to the sensing reset signal input terminal, and is configured to form a path between the second sensing reset anti-leakage node and the sixth switch circuit in response to control of an active level signal at the sensing reset signal input terminal, and cut off the path between the second sensing reset anti-leakage node and the sixth switch circuit in response to control of an inactive level signal at the sensing reset signal input terminal; or the six switch circuit is connected to the sensing reset signal input terminal, is connected to the second power supply terminal through the second sensing reset anti-leakage circuit, and is connected to the second sensing reset anti-leakage circuit at a second sensing reset anti-leakage node, and the second sensing reset anti-leakage node is connected to the second voltage control node; and the second sensing reset anti-leakage circuit is connected to the sensing reset signal input terminal, and is configured to form a path between the second sensing reset anti-leakage node and the second power supply terminal in response to control of an active level signal at the sensing reset signal input terminal, and cut off the path between the second sensing reset anti-leakage node and the second power supply terminal in response to control of an inactive level signal at the sensing reset signal input terminal.

In some embodiments, the second voltage control circuit includes: a fiftieth transistor;
a control electrode of the fiftieth transistor is connected to the second pull-up node, a first electrode of the fiftieth transistor is connected to the third power supply terminal, and a second electrode of the fiftieth transistor is connected to the second voltage control node;

the second sensing reset anti-leakage circuit includes: an eighty-fourth transistor, a control electrode of the eighty-fourth transistor is connected to the second sensing reset control node, and a first electrode of the eighty-fourth transistor is connected to the second sensing reset anti-leakage node;

in a case where the fifth switch circuit is connected to the sensing reset signal input terminal, a second electrode of the eighty-fourth transistor is connected to the third switch circuit; and in a case where the sixth switch circuit is connected to the sensing reset signal input terminal, the second electrode of the eighty-fourth transistor is connected to the second power supply terminal.

In some embodiments, the shift register unit includes a first sensing reset circuit including a second switch circuit and a third switch circuit, wherein the shift register unit further includes a first voltage control circuit; and the shift register unit further includes: a second sensing reset circuit including:
a seventh switch circuit connected to the second pull-up node, a sensing reset signal input terminal, and a first voltage control node connected to the first voltage control circuit, and configured to form a path to between the second pull-up node and the first voltage control node in response to control of an active level signal provided by the sensing reset signal input terminal, and cut off the path between the second pull-up node and the first voltage control node in response to control of an inactive level signal provided by the sensing reset signal input terminal.

In some embodiments, the seventh switch circuit includes: an eighty-fifth transistor; and
a control electrode of the eighty-fifth transistor is connected to the sensing reset signal input terminal, a first electrode of the eighty-fifth transistor is connected to the second pull-up node, and a second electrode of the eighty-fifth transistor is connected to the first voltage control node.

In a second aspect, the embodiments of the present disclosure provide a shift register unit, including:
a sensing control circuit connected to a sensing signal input terminal, a random signal input terminal, and a sensing control node, and configured to write a signal provided by the sensing signal input terminal to the sensing control node in response to control of an active level signal provided by the random signal input terminal;

a first sensing input circuit connected to an active level supply terminal, a clock control signal input terminal, the sensing control node, and a first pull-up node, controlled by a signal at the sensing control node and a signal provided by the clock control signal input terminal, and configured to write an active level signal provided by the active level supply terminal to the first pull-up node in response to control of an active level signal at the sensing control node and an active level signal provided by the clock control signal input terminal;

a first sensing reset circuit connected to a sensing reset signal input terminal, the sensing control node, the first pull-up node, and a second power supply terminal, and configured to write an inactive level signal provided by the second power supply terminal to the first pull-up node in response to control of a signal provided by the sensing reset signal input terminal and an active level signal at the sensing control node; and a first driving output circuit connected to the first pull-up node, a first driving clock signal input terminal, and a first driving signal output terminal, and configured to write a signal provided by the first driving clock signal input terminal to the first driving signal output terminal in response to control of an active level signal at the first pull-up node.

In some embodiments, the active level supply terminal is the clock control signal input terminal.

In a second aspect, the embodiments of the present disclosure provide a gate driving circuit, including: a plurality of shift register units that are cascaded, each of the plurality of shift register units is the shift register unit provided in the first aspect.

In a third aspect, the embodiments of the present disclosure provide a gate driving method based on the shift register unit provided in the first aspect, including:
writing, by the sensing control circuit, a signal provided by the sensing signal input terminal to the sensing control node in response to control of an active level signal provided by the random signal input terminal;

writing, by the first sensing input circuit, a signal provided by the clock control signal input terminal to the first pull-up node in response to control of an active level signal at the sensing control node; and writing, by the first driving output circuit, a signal provided by the first driving clock signal input terminal to the first driving signal output terminal in response to control of an active level signal at the first pull-up node.

In some embodiments, writing, by the sensing control circuit, the signal provided by the sensing signal input terminal to the sensing control node in response to the control of the active level signal provided by the random signal input terminal includes:

writing, by the sensing control circuit, an active level signal provided by the sensing signal input terminal to the sensing control node in response to the control of the active level signal provided by the random signal input terminal; and writing, by the sensing control circuit, an inactive level signal provided by the sensing signal input terminal to the sensing control node in response to the control of the active level signal provided by the random signal input terminal; and before writing, by the sensing control circuit, the active level signal provided by the sensing signal input terminal to the sensing control node in response to the control of the active level signal provided by the random signal input terminal, the gate driving method further includes:

writing, by the first display input circuit, an active level signal provided by the third power supply terminal to the first pull-up node in response to control of an active level signal provided by the display signal input terminal;

writing, by the second driving output circuit, a signal provided by the second driving clock signal input terminal to the second driving signal output terminal in response to control of an active level signal at the first pull-up node, and writing, by the first cascade output circuit, a signal provided by the first cascade clock signal input terminal to the first cascade signal output terminal in response to control of an active level signal at the first pull-up node;

within a period from the step of writing, by the sensing control circuit, the active level signal provided by the sensing signal input terminal to the sensing control node in response to the control of the active level signal provided by the random signal input terminal till a beginning of a sensing output phase, writing, by the first sensing input circuit, an inactive level signal provided by the clock control signal input terminal to the first pull-up node in response to control of an active level signal at the sensing control node;

in the sensing output phase, writing, by the first sensing input circuit, an active level signal provided by the clock control signal input terminal to the first pull-up node in response to control of an active level signal at the sensing control node; and writing, by the sensing control circuit, an inactive level signal provided by the sensing signal input terminal to the sensing control node in response to control of an active level signal provided by the random signal input terminal.

In some embodiments, after writing, by the first driving output circuit, the signal provided by the first driving clock signal input terminal to the first driving signal output terminal in response to the control of the active level signal at the first pull-up node, the gate driving method further includes:

writing, by the first sensing reset circuit, an inactive level signal provided by the second power supply terminal to the first pull-up node in response to control of a signal provided by the sensing reset signal input terminal and an active level signal at the sensing control node.

DETAIL DESCRIPTION OF EMBODIMENTS

Figure 1:
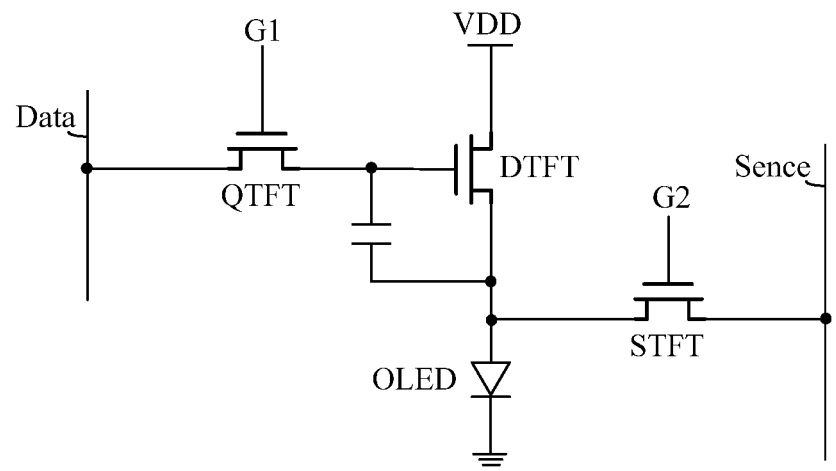
FIG. 1 is a schematic diagram showing a circuit structure of a pixel circuit in an OLED display panel.

In order to enable those of ordinary skill in the art to better understand the technical solutions of the present disclosure, a shift register unit, a gate driving circuit, a display panel, and a display device are described in detail below with reference to the drawings.

The words "first", "second" and the like used in the embodiments of the present disclosure do not denote any order, quantity or importance, but are just used to distinguish between different elements. Similarly, the words "include", "comprise" and the like indicate that an element or object before the words covers the elements or objects listed after the words or the equivalents thereof, rather than excluding other elements or objects. The words "couple", "connect", and the like are not restricted to physical or mechanical connection, but may also indicate electrical connection, whether direct or indirect.

The transistors adopted in the embodiments of the present disclosure may all be thin film transistors or field effect transistors or other devices having the same characteristics. In the embodiments, a coupling mode of a drain electrode and a coupling mode of a source electrode of each transistor are interchangeable. Thus, there is actually no difference between the drain electrode and the source electrode of each transistor in the embodiments of the present disclosure. In the present disclosure, only for distinguishing between two electrodes other than a control electrode (i.e., a gate electrode) of a transistor, one of the two electrodes is referred to as a drain electrode, and the other is referred to as a source electrode. The thin film transistors adopted in the embodiments of the present disclosure may be N-type transistors or P-type transistors. In the embodiments of the present disclosure, when an N-type thin film transistor is adopted, the first electrode thereof may be a source electrode, and the second electrode thereof may be a drain electrode. A case where the thin film transistors are the N-type transistors is taken as an example for illustration in the following embodiments.

In the present disclosure, an "active level signal" refers to a signal capable of controlling a transistor to be turned on after being input to a control electrode of the transistor, and an "inactive level signal" refers to a signal capable of controlling the transistor to be turned off after being input to the control electrode thereof. For an N-type transistor, a high level signal is an active level signal, and a low level signal is an inactive level signal; and for a P-type transistor, a low level signal is an active level signal, and a high level signal is an inactive level signal.

The case where the transistors are N-type transistors is taken as an example for illustration in the following description. In such case, the active level signal refers to a high level signal, and the inactive level signal refers to a low level signal. It should be envisaged that timing of control signals needs to be adjusted accordingly when the P-type transistors are adopted. Specific details are not described herein, but should also fall within the scope of the present disclosure.

Figure 2:
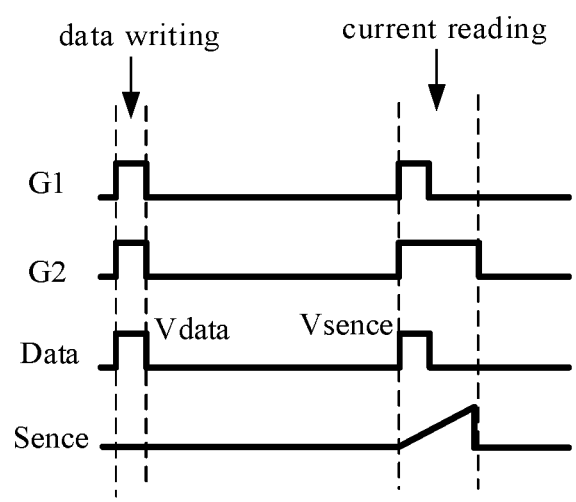
FIG. 2 is a timing diagram of the pixel circuit shown in FIG. 1.

FIG. 1 is a schematic diagram showing a circuit structure of a pixel circuit in an OLED display panel, and FIG. 2 is a timing diagram of the pixel circuit shown in FIG. 1. As shown in FIG. 1 and FIG. 2, for the OLED display panel with an external compensation function, one frame of image can be divided into two phases: a display driving phase and a sensing phase. In the display driving phase, pixel units in each row in the display panel complete display driving; and in the sensing phase, pixel units in a certain row in the display panel complete current extraction (i.e., sensing).

With reference to FIG. 1, the pixel circuit includes a display switching transistor QTFT (having a control electrode connected to a first gate line G1), a driving transistor DTFT, a sensing switching transistor STFT (having a control electrode connected to a second gate line G2), and a storage capacitor Cst. When external compensation needs to be performed on the pixel circuit, the pixel circuit includes at least the following two phases in an operating process: a pixel driving phase (including a data voltage writing process) and a pixel sensing phase (including a current reading process).

In the pixel driving phase, a data voltage Vdata in a data line Data needs to be written to a pixel unit; and in the pixel sensing phase, a test voltage Vsence needs to be written to the pixel unit through the data line Data, and an electrical signal at a drain electrode of the driving transistor needs to be read and input into a signal reading line Sence through the sensing switching transistor STFT. In the current reading process, an active level voltage needs to be written to a gate electrode of the sensing switching transistor STFT through the corresponding second gate line G2. It should be noted that a specific compensation process and a principle of the external compensation performed on the pixel unit in the OLED display panel are not described in detail herein.

For the second gate line G2 configured to control the sensing switching transistor STFT, a corresponding gate driving circuit is disposed at a peripheral region of the display panel, and the gate driving circuit includes a plurality of cascaded shift register units. However, the shift register unit in the related art is relatively complex in circuit structure, and includes a large number of transistors. Therefore, how to simplify the circuit structure of the shift register unit is an urgent technical problem to be solved by those of ordinary skill in the art.

In view of the above technical problem, the embodiments of the present disclosure provide corresponding technical solutions, and the embodiments will be described in detail below with reference to the drawings.

Figure 3:
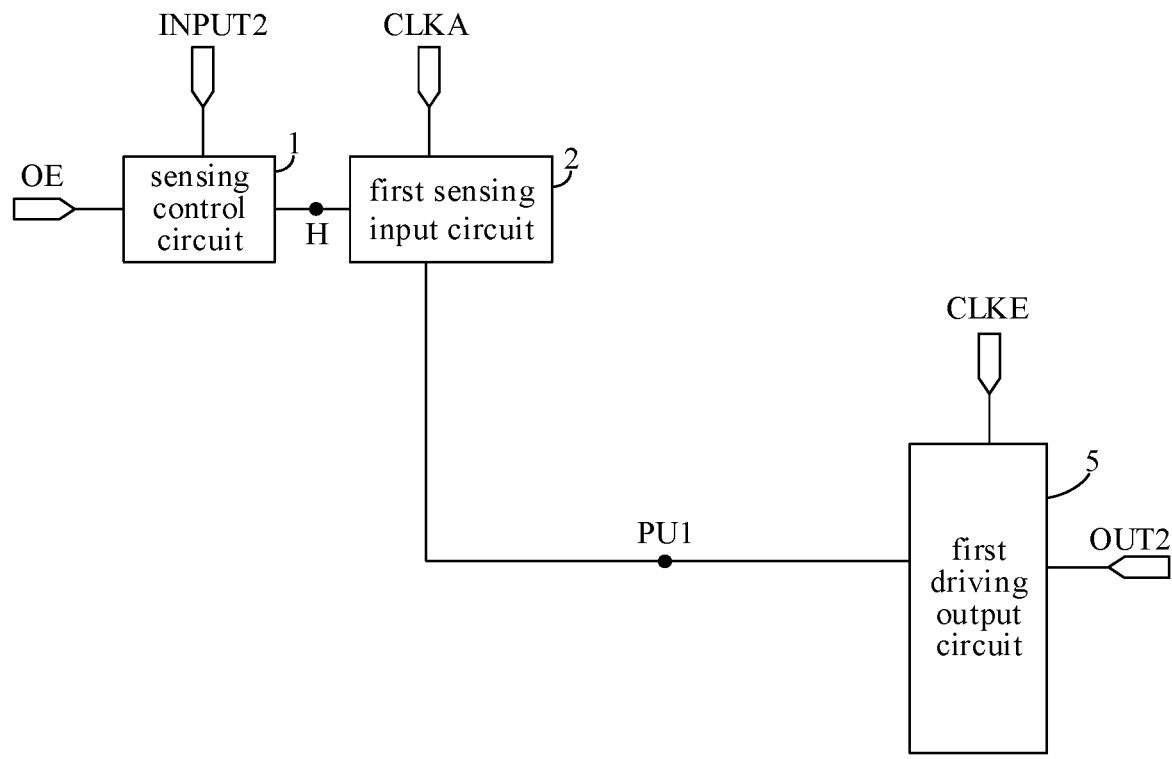
FIG. 3 is a schematic diagram showing a circuit structure of a shift register unit according to the embodiments of the present disclosure.

FIG. 3 is a schematic diagram showing a circuit structure of a shift register unit according to the embodiments of the present disclosure. As shown in FIG. 3, the shift register unit includes: a sensing control circuit 1, a first sensing input circuit 2, and a first driving output circuit 5.

The sensing control circuit 1 is connected to a sensing signal input terminal INPUT2, a random signal input terminal OE, and a sensing control node H, and is configured to write a signal provided by the sensing signal input terminal INPUT2 to the sensing control node H in response to control of an active level signal provided by the random signal input terminal OE.

The first sensing input circuit 2 is connected to a clock control signal input terminal CLKA, the sensing control node H, and a first pull-up node PU1, and is configured to write a signal provided by the clock control signal input terminal CLKA to the first pull-up node PU1 only in response to control of an active level signal at the sensing control node H.

The first driving output circuit 5 is connected to the first pull-up node PU1, a first driving clock signal input terminal CLKE, and a first driving signal output terminal OUT2, and is configured to write a signal provided by the first driving clock signal input terminal CLKE to the first driving signal output terminal OUT2 in response to control of an active level signal at the first pull-up node PU1.

In the related art, the first sensing input circuit 2 is controlled not only by a voltage at the sensing control node H, but also by the signal provided by the clock control signal input terminal. Therefore, the first sensing input circuit 2 in the related art not only needs to be provided with at least one transistor having a gate electrode connected to the sensing control node H, but also needs to be provided with at least one transistor having a gate electrode connected to the clock control signal input terminal CLKA. The first sensing input circuit 2 can write an active level signal (e.g., an active level signal provided by the clock control signal input terminal CLKA, or an operating voltage in an active level state) to the first pull-up node PU1 only when the voltage at the sensing control node H is in an active level state and the signal provided by the clock control signal input terminal CLKA is also in an active level state.

In the technical solution provided by the present disclosure, the first sensing input circuit 2 is controlled only by the voltage at the sensing control node H, and is not controlled by the clock control signal input terminal CLKA, that is, the first sensing input circuit 2 provided by the present disclosure does not need to be provided with the transistor having the gate electrode connected to the clock control signal input terminal CLKA. Therefore, compared with the related art, the technical solution of the present disclosure can effectively reduce the number of the transistors in the first sensing input circuit 2. Thus, the technical solution of the present disclosure can reduce the number of transistors in the shift register unit, and simplify the circuit structure of the shift register unit.

It should be noted that the first sensing input circuit 2 can only write the active level signal to the first pull-up node PU1, but cannot write an inactive level signal to the first pull-up node PU1 in the related art; while in the present disclosure, the first sensing input circuit 2 can not only write the active level signal (the active level signal provided by the clock control signal input terminal CLKA) to the first pull-up node PU1, but also write an inactive level signal (an inactive level signal provided by the clock control signal input terminal CLKA) to the first pull-up node PU1. A detailed description will be given below with reference to specific exemplary embodiments.

Figure 4:
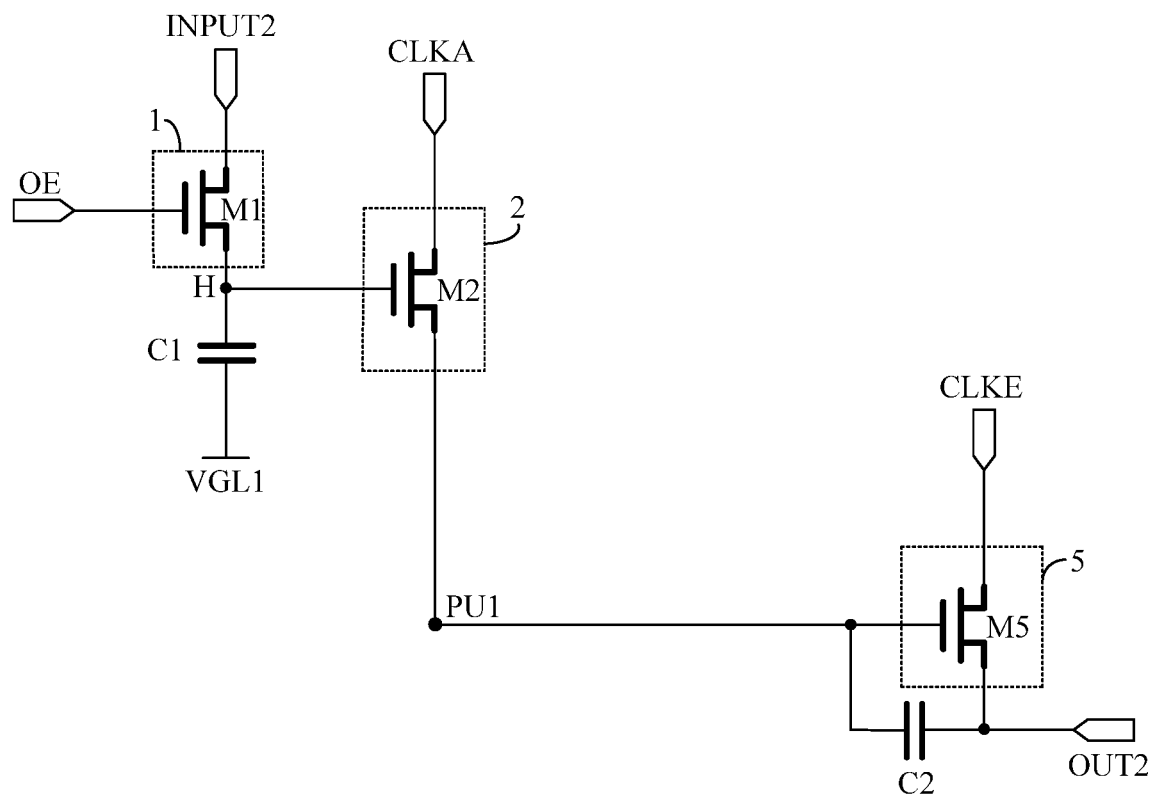
FIG. 4 is a schematic diagram showing another circuit structure of the shift register unit according to the embodiments of the present disclosure.

FIG. 4 is a schematic diagram showing another circuit structure of the shift register unit according to the embodiments of the present disclosure. As shown in FIG. 4, in some embodiments, the first sensing input circuit 2 includes: a second transistor M2; and a control electrode of the second transistor M2 is connected to the sensing control node H, a first electrode of the second transistor M2 is connected to the clock control signal input terminal CLKA, and a second electrode of the second transistor M2 is connected to the first pull-up node PU1.

In order to enable those of ordinary skill in the art to understand the technical solutions of the present disclosure more clearly, the technical solutions of the present disclosure will be described in detail below with reference to the specific exemplary embodiments. A second power supply terminal supplies an inactive level voltage VGL1.

In some embodiments, the sensing control circuit 1 includes a first transistor M1, a control electrode of the first transistor M1 is connected to the random signal input terminal OE, a first electrode of the first transistor M1 is connected to the sensing signal input terminal INPUT2, and a second electrode of the first transistor M1 is connected to the sensing control node H.

The first driving output circuit 5 includes a fifth transistor M5, a control electrode of the fifth transistor M5 is connected to the first pull-up node PU1, a first electrode of the fifth transistor M5 is connected to the first driving clock signal input terminal CLKE, and a second electrode of the fifth transistor M5 is connected to the first driving signal output terminal OUT2.

In some embodiments, a first capacitor C1 capable of stabilizing a voltage at the sensing control node H is disposed at the sensing control node H. A second capacitor C2 capable of stabilizing an output of the first driving signal output terminal OUT2 is disposed at the first driving signal output terminal OUT2.

Figure 5:
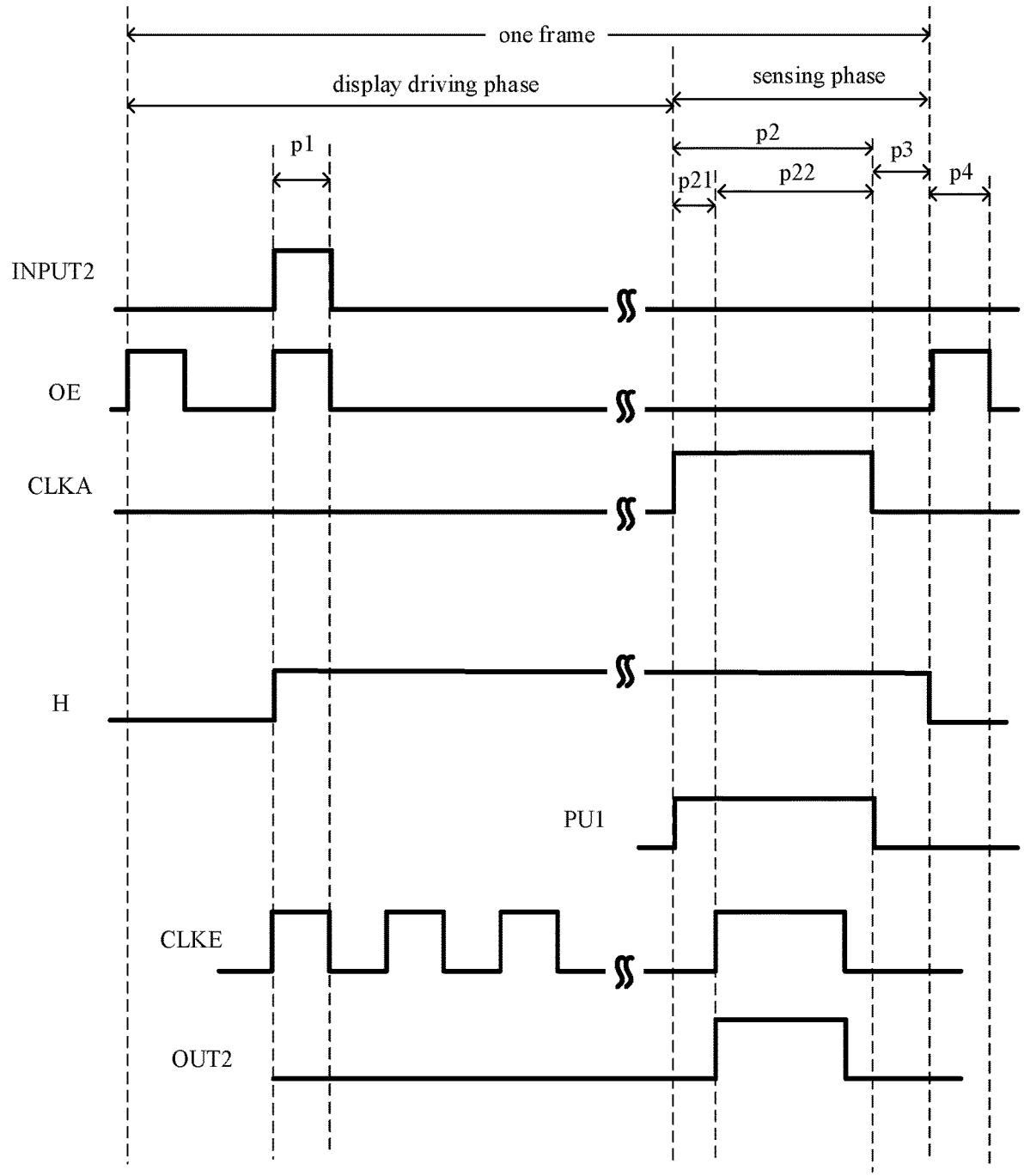
FIG. 5 is a timing diagram of the shift register unit shown in FIG. 4.

FIG. 5 is a timing diagram of the shift register unit shown in FIG. 4. As shown in FIG. 5, in some embodiments, an operating process of the shift register unit includes the following phases.

In a phase p1, the sensing signal input terminal INPUT2 provides a high level signal, the random signal input terminal OE provides a high level signal, and the clock control signal input terminal CLKA provides a low level signal.

At this time, the first transistor M1 is turned on, the high level signal provided by the sensing signal input terminal INPUT2 is written to the sensing control node H, and a voltage at the sensing control node H is in a high level state. Accordingly, the second transistor M2 is turned on, and the low level signal provided by the clock control signal input terminal CLKA is written to the first pull-up node PU1 through the second transistor M2. The first pull-up node PU1 is in a low level state, and the fifth transistor M5 is turned off.

A phase p2 (also referred to as a sensing output phase) includes a phase p21 and a phase p22.

It should be noted that a time interval exists between the phase p1 and the phase p2; and in order to ensure that the voltage at the sensing control node H remains stable within the time interval, the first capacitor C1 may be disposed at the sensing control node H.

In the phase p21, the sensing signal input terminal INPUT2 provides a low level signal, the random signal input terminal OE provides a low level signal, the clock control signal input terminal CLKA provides a high level signal, and the first driving clock signal input terminal CLKE provides a low level signal.

At this time, the first transistor is turned off, the sensing control node H is in a floating state to maintain a high level state, and the second transistor remains on state. At this time, the high level signal provided by the clock control signal input terminal CLKA is written to the first pull-up node PU1, the first pull-up node PU1 is in a high level state, the fifth transistor M5 is turned on, the low level signal provided by the first driving clock signal input terminal CLKE is written to the first driving signal output terminal OUT2 through the fifth transistor M5, and the first driving signal output terminal OUT2 outputs a low level signal.

In the phase p22, the sensing signal input terminal INPUT2 provides a low level signal, the random signal input terminal OE provides a low level signal, the clock control signal input terminal CLKA provides a high level signal, and the first driving clock signal input terminal CLKE first provides a high level signal and then provides a low level signal.

The high level signal provided by the clock control signal input terminal CLKA is continuously written to the first pull-up node PU1 through the second transistor, the first pull-up node PU1 is in the high level state, the fifth transistor M5 is turned on, the signal provided by the first driving clock signal input terminal CLKE is written to the first driving signal output terminal OUT2 through the fifth transistor M5, and the first driving signal output terminal OUT2 first outputs a high level signal and then outputs a low level signal.

In a phase p3, the sensing signal input terminal INPUT2 provides a low level signal, the random signal input terminal OE provides a low level signal, and the clock control signal input terminal CLKA provides a low level signal.

The low level signal provided by the clock control signal input terminal CLKA is written to the first pull-up node PU1 through the second transistor, the first pull-up node PU1 is in a low level state, the fifth transistor M5 is turned off, and the first driving signal output terminal OUT2 maintains the low level state as in the previous phase.

In a phase p4, the sensing signal input terminal INPUT2 provides a low level signal, the random signal input terminal OE provides a high level signal, and the clock control signal input terminal CLKA provides a low level signal.

At this time, the first transistor M1 is turned on, the low level signal provided by the sensing signal input terminal INPUT2 is written to the sensing control node H, and a voltage at the sensing control node H is in a low level state. Accordingly, the second transistor M2 is turned off; and accordingly, the first pull-up node PU1 is in a floating state to maintain the low level state as in the previous phase, the fifth transistor M5 is turned off, and the first driving signal output terminal OUT2 maintain the low level state as in the previous phase.

As can be seen from the above description, the first sensing input circuit 2 can not only write the active level signal (the high level signal provided by the clock control signal input terminal CLKA) to the first pull-up node PU1, but also write the inactive level signal (the low level signal provided by the clock control signal input terminal CLKA) to the first pull-up node PU1.

Figure 6:
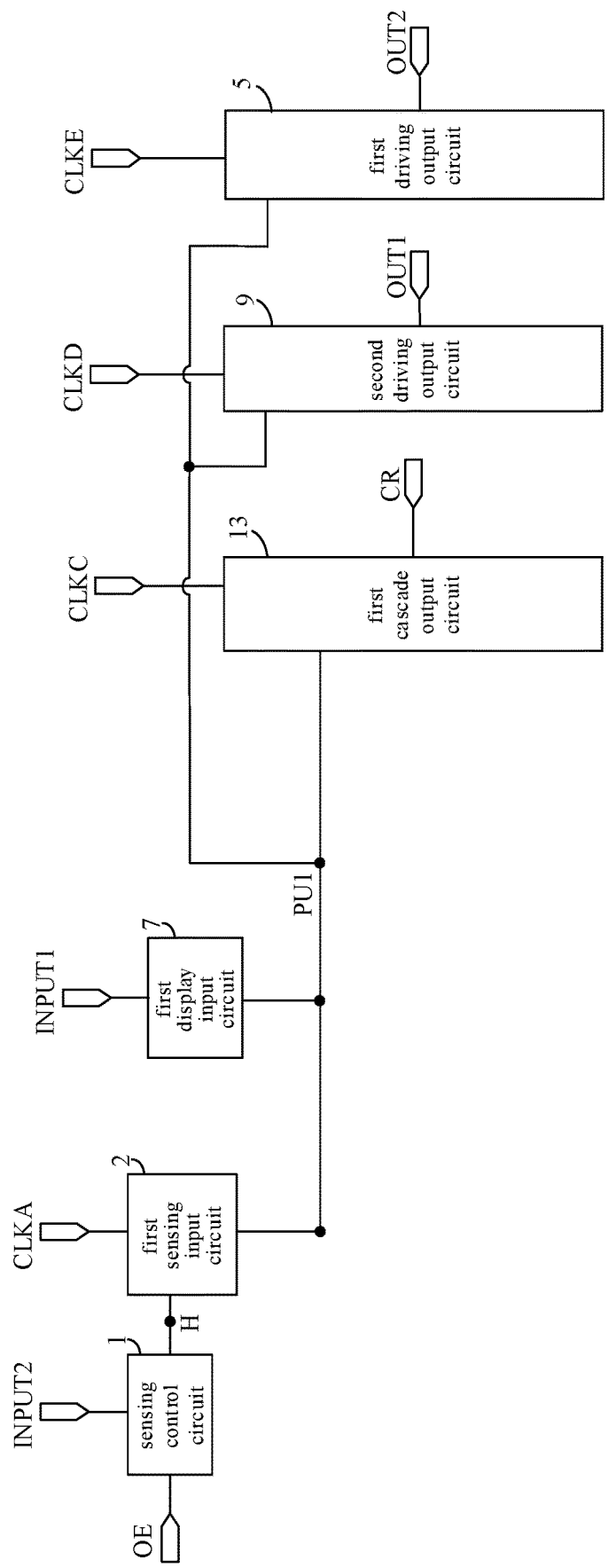
FIG. 6 is a schematic diagram showing still another circuit structure of the shift register unit according to the embodiments of the present disclosure.

FIG. 6 is a schematic diagram showing still another circuit structure of the shift register unit according to the embodiments of the present disclosure. As shown in FIG. 6, in some embodiments, the shift register unit further includes: a first display input circuit 7, a second driving output circuit 9, and a first cascade output circuit 13.

The first display input circuit 7 is connected to a display signal input terminal INPUT1, a third power supply terminal, and the first pull-up node PU1, and is configured to write an active level signal provided by the third power supply terminal to the first pull-up node PU1 in response to control of an active level signal provided by the display signal input terminal INPUT1.

The second driving output circuit 9 is connected to the first pull-up node PU1, a second driving clock signal input terminal CLKD, and a second driving signal output terminal OUT1, and is configured to write a signal provided by the second driving clock signal input terminal CLKD to the second driving signal output terminal OUT1 in response to control of an active level signal at the first pull-up node PU1.

The first cascade output circuit 13 is connected to the first pull-up node PU1, a first cascade clock signal input terminal CLKC, and a first cascade signal output terminal CR, and is configured to write a signal provided by the first cascade clock signal input terminal CLKC to the first cascade signal output terminal CR in response to control of an active level signal at the first pull-up node PU1.

The shift register unit shown in FIG. 6 not only has a sense driving function, i.e., provides a driving signal for the second gate line G2 shown in FIG. 1, but also has a display driving function, i.e., provides a driving signal for the first gate line G1 shown in FIG. 1. That is to say, the first gate line G1 and the second gate line G2 in the display panel may be driven by the same gate driving circuit, so that the number of gate driving circuits configured for the display panel can be effectively reduced, and a narrow frame design of a product can be facilitated.

Figure 7:
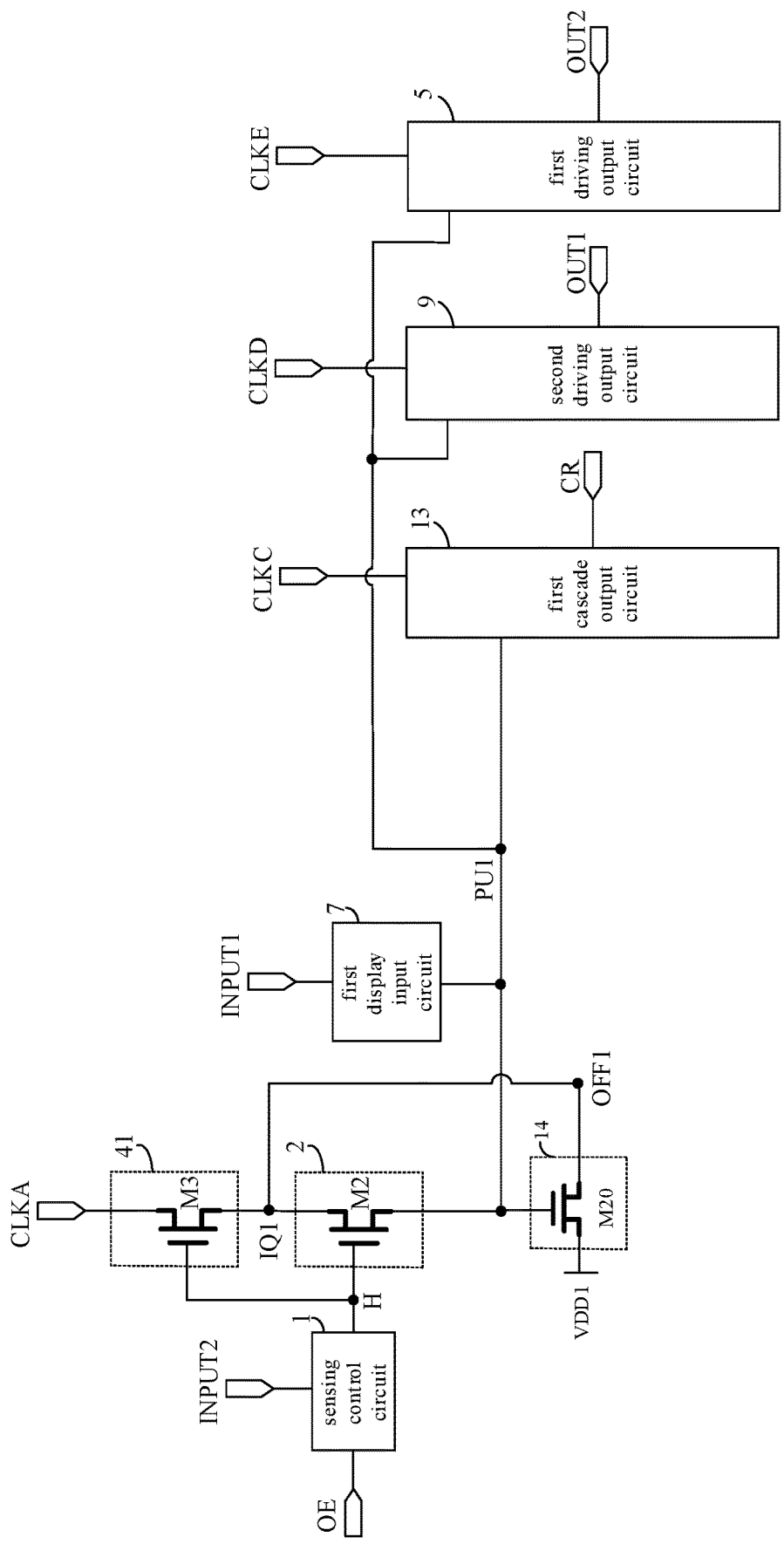
FIG. 7 is a schematic diagram showing yet another circuit structure of the shift register unit according to the embodiments of the present disclosure.

FIG. 7 is a schematic diagram showing yet another circuit structure of the shift register unit according to the embodiments of the present disclosure. As shown in FIG. 7, as an anti-leakage design for the first sensing input circuit 2, in some embodiments, the shift register unit further includes: a first voltage control circuit 14 and a first sensing input anti-leakage circuit 41.

The first voltage control circuit 14 is connected to the third power supply terminal, the first pull-up node PU1, and a first voltage control node OFF1, and is configured to write an active level signal provided by the third power supply terminal to the first voltage control node OFF1 in response to control of an active level signal at the first pull-up node PU1.

The first sensing input circuit 2 is connected to the clock control signal input terminal CLKA through the first sensing input anti-leakage circuit 41, and is connected to the first sensing input anti-leakage circuit 41 at a first sensing input anti-leakage node IQ1, and the first sensing input anti-leakage node IQ1 is connected to the first voltage control node OFF1.

The first sensing input anti-leakage circuit 41 is connected to the sensing control node H, and is configured to form a path between the first sensing input anti-leakage node IQ1 and the clock control signal input terminal CLKA in response to control of an active level signal at the sensing control node H, and cut off the path between the first sensing input anti-leakage node IQ1 and the clock control signal input terminal CLKA in response to control of an inactive level signal at the sensing control node H.

In some embodiments, the first voltage control circuit 14 includes: a twentieth transistor M20, a control electrode of the twentieth transistor M20 is connected to the first pull-up node PU1, a first electrode of the twentieth transistor M20 is connected to the third power supply terminal, and a second electrode of the twentieth transistor M20 is connected to the first voltage control node OFF1.

The first sensing input anti-leakage circuit 41 includes: a third transistor M3, a control electrode of the third transistor M3 is connected to the sensing control node H, a first electrode of the third transistor M3 is connected to the clock control signal input terminal, and a second electrode of the third transistor M3 is connected to the first sensing input anti-leakage node IQ1.

Figure 8:
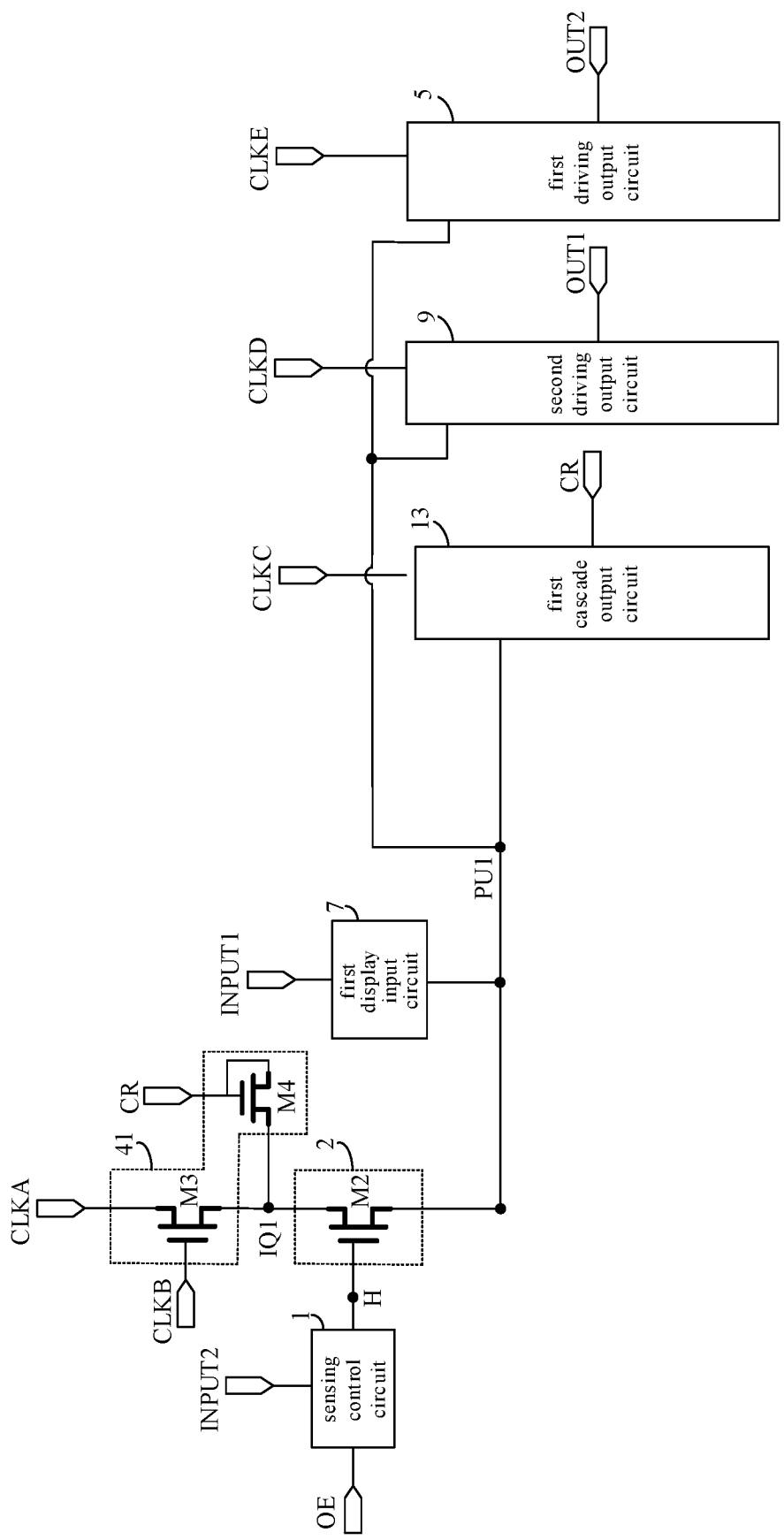
FIG. 8 is a schematic diagram showing yet another circuit structure of the shift register unit according to the embodiments of the present disclosure.

FIG. 8 is a schematic diagram showing yet another circuit structure of the shift register unit according to the embodiments of the present disclosure. As shown in FIG. 8, as another anti-leakage design for the first sensing input circuit 2, the shift register unit further includes: a first sensing input anti-leakage circuit 41. The first sensing input circuit 2 is connected to the clock control signal input terminal CLKA through the first sensing input anti-leakage circuit 41, and is connected to the first sensing input anti-leakage circuit 41 at a first sensing input anti-leakage node IQ1.

The first sensing input anti-leakage circuit 41 is connected to a preset input control signal input terminal CLKB and the first cascade signal output terminal CR, and is configured to form a path between the first sensing input anti-leakage node IQ1 and the clock control signal input terminal CLKA in response to control of an active level signal provided by the preset input control signal input terminal CLKB, cut off the path between the first sensing input anti-leakage node IQ1 and the clock control signal input terminal CLKA in response to control of an inactive level signal provided by the preset input control signal input terminal CLKB, and write an active level signal to the first sensing input anti-leakage node IQ1 in response to control of an active level signal provided by the first cascade signal output terminal CR when the path between the first sensing input anti-leakage node IQ1 and the clock control signal input terminal CLKA is cut off.

In some embodiments, the first sensing input anti-leakage circuit 41 includes: a third transistor M3 and a fourth transistor M4. A control electrode of the third transistor M3 is connected to the preset input control signal input terminal CLKB, a first electrode of the third transistor M3 is connected to the clock control signal input terminal CLKA, and a second electrode of the third transistor M3 is connected to the first sensing input anti-leakage node IQ1. A control electrode and a first electrode of the fourth transistor M4 are both connected to the first cascade signal output terminal CR, and a second electrode of the fourth transistor M4 is connected to the first sensing input anti-leakage node IQ1.

The preset input control signal input terminal CLKB provides an inactive level signal in a display output phase of the shift register unit, so as to cut off the path between the first sensing input anti-leakage node IQ1 and the clock control signal input terminal CLKA. After the display output phase (i.e., from the phase p1 to the end of one frame shown in FIG. 5) of the shift register unit, the preset input control signal input terminal CLKB provides an active level signal to form the path between the first sensing input anti-leakage node IQ1 and the clock control signal input terminal CLKA.

Figure 9:
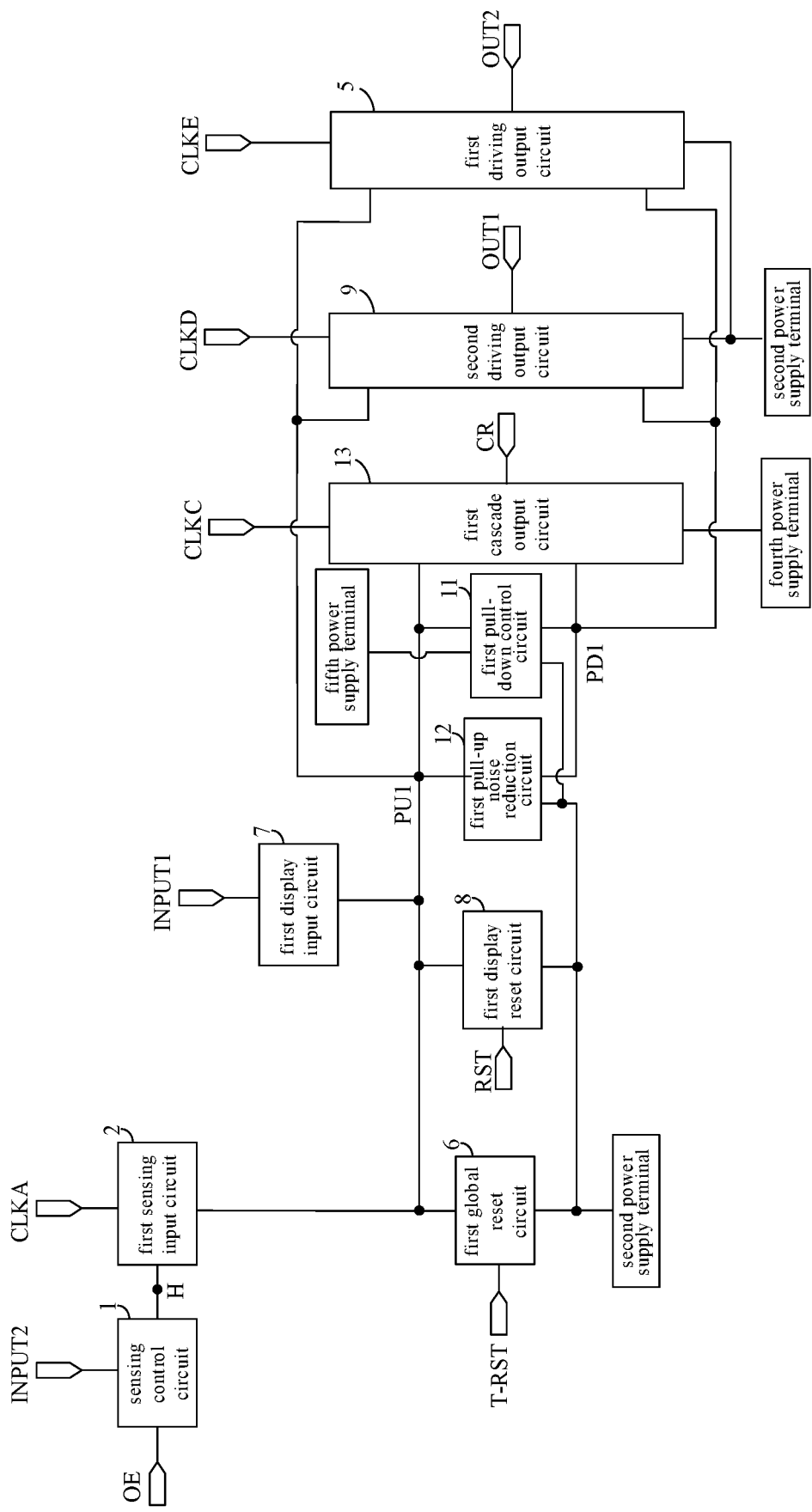
FIG. 9 is a schematic diagram showing yet another circuit structure of the shift register unit according to the embodiments of the present disclosure.

FIG. 9 is a schematic diagram showing yet another circuit structure of the shift register unit according to the embodiments of the present disclosure. As shown in FIG. 9, in some embodiments, in addition to the first display input circuit 7, the second driving output circuit 9, and the first cascade output circuit 13 in the above embodiments, the shift register unit further includes a first global reset circuit 6, a first display reset circuit 8, a first pull-down control circuit 11, and a first pull-up noise reduction circuit 12.

The first global reset circuit 6 is connected to a global reset signal input terminal T-RST, a second power supply terminal, and the first pull-up node PU1, and is configured to write an inactive level signal provided by the second power supply terminal to the first pull-up node in response to control of an active level signal provided by the global reset signal input terminal T-RST.

The first display reset circuit 8 is connected to a display reset signal input terminal RST, the second power supply terminal, and the first pull-up node PU1, and is configured to write an inactive level signal provided by the second power supply terminal to the first pull-up node PU1 in response to control of an active level signal provided by the display reset signal input terminal RST.

The first pull-down control circuit 11 is connected to the second power supply terminal, a fifth power supply terminal, the first pull-up node PU1, and the first pull-down node PD1, and is configured to write a voltage having a phase opposite to that of a voltage at the first pull-up node PU1 to the first pull-down node PD1.

The first pull-up noise reduction circuit 12 is connected to the second power supply terminal, the first pull-up node PU1, and the first pull-down node PD1, and is configured to write an inactive level signal provided by the second power supply terminal to the first pull-up node PU1 in response to control of an active level signal at the first pull-down node PD1.

In this case, the first cascade output circuit 13 is further connected to the first pull-down node PD1 and the second power supply terminal, and is further configured to write an inactive level signal provided by the second power supply terminal to the first cascade signal output terminal CR in response to control of an active level signal at the first pull-down node PD1.

The first driving output circuit 5 is further connected to the first pull-down node PD1 and a fourth power supply terminal, and is further configured to write an inactive level signal provided by the fourth power supply terminal to the first driving signal output terminal OUT2 in response to control of an active level signal at the first pull-down node PD1.

The second driving output circuit 9 is further connected to the first pull-down node PD1 and the fourth power supply terminal, and is further configured to write an inactive level signal provided by the fourth power supply terminal to the second driving signal output terminal OUT1 in response to control of an active level signal at the first pull-down node PD1.

Figure 10:
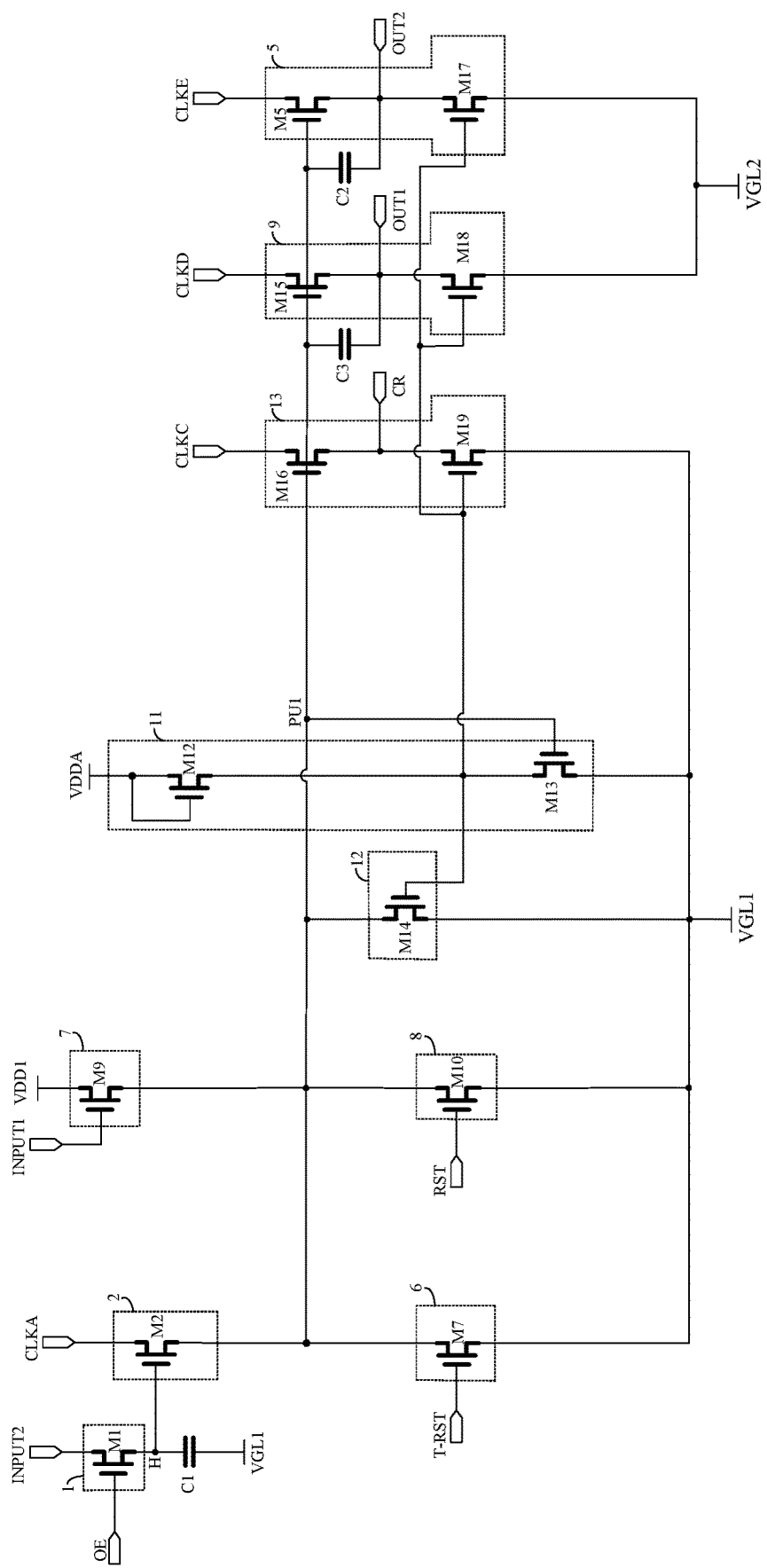
FIG. 10 is a schematic diagram showing yet another circuit structure of the shift register unit according to the embodiments of the present disclosure.

FIG. 10 is a schematic diagram showing yet another circuit structure of the shift register unit according to the embodiments of the present disclosure. As shown in FIG. 10, the shift register unit shown in FIG. 10 is a specific implementation of the shift register unit shown in FIG. 9, and both the sensing control circuit 1 and the first sensing input circuit 2 in the shift register unit shown in FIG. 10 may adopt the structures shown in FIG. 4.

In some embodiments, the first global reset circuit 6 includes a seventh transistor M7, the first display input circuit 7 includes a ninth transistor M9, the first display reset circuit 8 includes a tenth transistor M10, the first pull-down control circuit 11 includes a twelfth transistor M12 and a thirteenth transistor M13, the first pull-up noise reduction circuit 12 includes a fourteenth transistor M14, the first driving output circuit 5 includes a fifth transistor M5 and a seventeenth transistor M17, the second driving output circuit 9 includes a fifteenth transistor M15 and an eighteenth transistor M18, and the first cascade output circuit 13 includes a sixteenth transistor M16 and a nineteenth transistor M19.

A control electrode of the seventh transistor M7 is connected to the global reset signal input terminal T-RST, a first electrode of the seventh transistor M7 is connected to the first pull-up node PU1, and a second electrode of the seventh transistor M7 is connected to the second power supply terminal.

A control electrode of the ninth transistor M9 is connected to the display signal input terminal INPUT1, a first electrode of the ninth transistor M9 is connected to the third power supply terminal, and a second electrode of the ninth transistor M9 is connected to the first pull-up node PU1.

A control electrode of the tenth transistor M10 is connected to the display reset signal input terminal RST, a first electrode of the tenth transistor M10 is connected to the first pull-up node PU1, and a second electrode of the tenth transistor M10 is connected to the second power supply terminal.

A control electrode of the twelfth transistor M12 is connected to the fifth power supply terminal, a first electrode of the twelfth transistor M12 is connected to the fifth power supply terminal, and a second electrode of the twelfth transistor M12 is connected to the first pull-down node PD1.

A control electrode of the thirteenth transistor M13 is connected to the first pull-up node PU1, a first electrode of the thirteenth transistor M13 is connected to the first pull-down node PD1, and a second electrode of the thirteenth transistor M13 is connected to the second power supply terminal.

A control electrode of the fourteenth transistor M14 is connected to the first pull-down node PD1, a first electrode of the fourteenth transistor M14 is connected to the first pull-up node PU1, and a second electrode of the fourteenth transistor M14 is connected to the second power supply terminal.

A control electrode of the fifth transistor M5 is connected to the first pull-up node PU1, a first electrode of the fifth transistor M5 is connected to the first driving clock signal input terminal CLKE, and a second electrode of the fifth transistor M5 is connected to the first driving signal output terminal OUT2.

A control electrode of the seventeenth transistor M17 is connected to the first pull-down node PD1, a first electrode of the seventeenth transistor M17 is connected to the first driving signal output terminal OUT2, and a second electrode of the seventeenth transistor M17 is connected to the fourth power supply terminal.

A control electrode of the fifteenth transistor M15 is connected to the first pull-up node PU1, a first electrode of the fifteenth transistor M15 is connected to the second driving clock signal input terminal CLKD, and a second electrode of the fifteenth transistor M15 is connected to the second driving signal output terminal OUT1.

A control electrode of the eighteenth transistor M18 is connected to the first pull-down node PD1, a first electrode of the eighteenth transistor M18 is connected to the second driving signal output terminal OUT1, and a second electrode of the eighteenth transistor M18 is connected to the fourth power supply terminal.

A control electrode of the sixteenth transistor M16 is connected to the first pull-up node PU1, a first electrode of the sixteenth transistor M16 is connected to the cascade clock signal input terminal CLKC, and a second electrode of the sixteenth transistor M16 is connected to the first cascade signal output terminal CR.

A control electrode of the nineteenth transistor M19 is connected to the first pull-down node PD1, a first electrode of the nineteenth transistor M19 is connected to the first cascade signal output terminal CR, and a second electrode of the nineteenth transistor M19 is connected to the fourth power supply terminal.

In some embodiments, a second capacitor C2 and a third capacitor C3 are disposed at the first driving signal output terminal OUT2 and the second driving signal output terminal OUT1, respectively.

Figure 11:
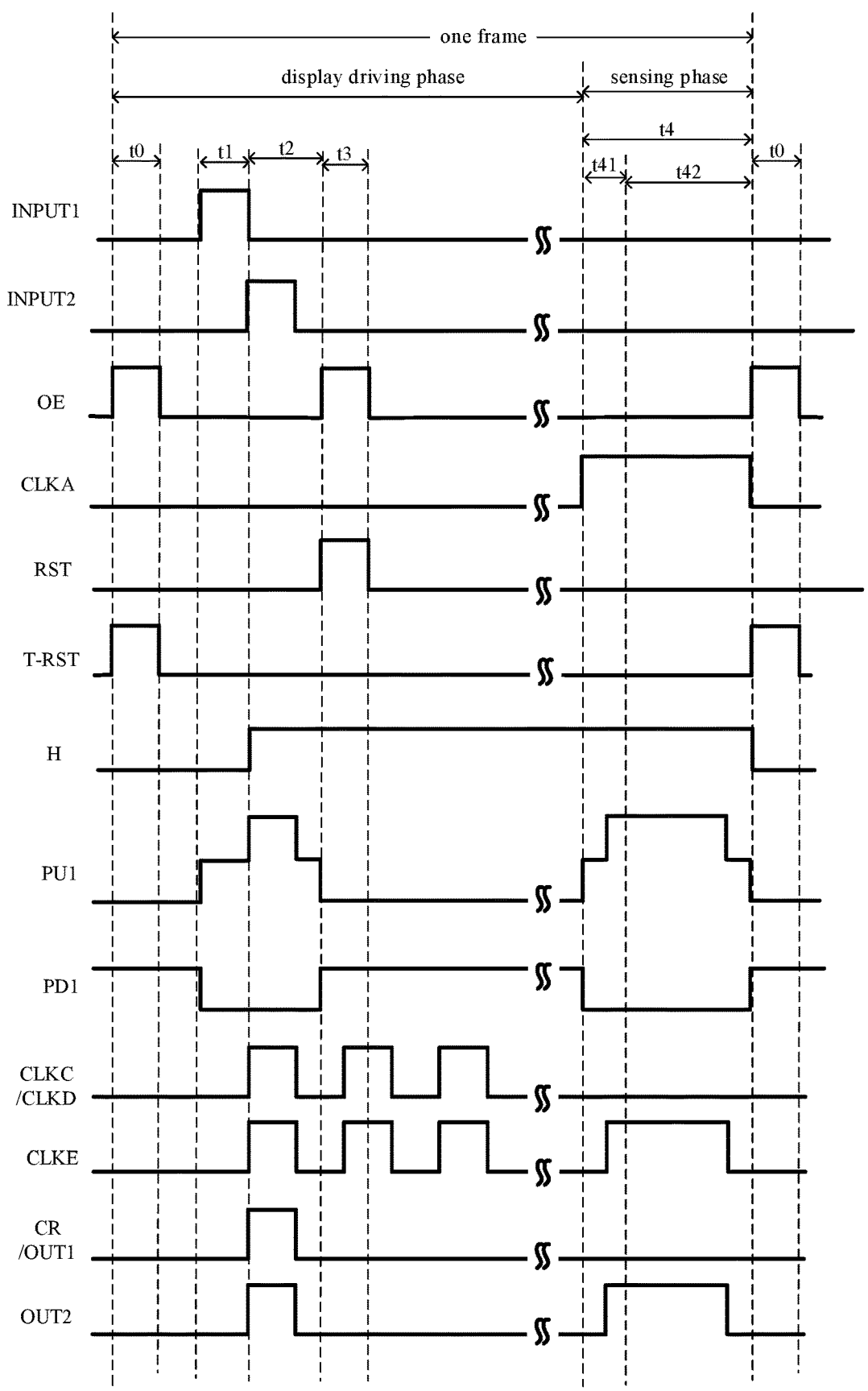
FIG. 11 is a timing diagram of the shift register unit shown in FIG. 10.

FIG. 11 is a timing diagram of the shift register unit shown in FIG. 10. As shown in FIG. 11, the second power supply terminal provides a low level voltage VGL1, the third power supply terminal provides a high level voltage VDD1, the fourth power supply terminal provides a low level voltage VGL2, and the fifth power supply terminal provides a high level voltage VDDA; and an operating process of the shift register unit includes the following phases.

In a global reset phase t0, the display signal input terminal INPUT1 provides a low level signal, the sensing signal input terminal INPUT2 provides a low level signal, the random signal input terminal OE provides a high level signal, the clock control signal input terminal CLKA provides a low level signal, the display reset signal input terminal RST provides a low level signal, and the global reset signal input terminal T-RST provides a high level signal.

The first transistor M1 is turned on due to the high level signal provided by the random signal input terminal OE, and the low level signal provided by the sensing signal input terminal INPUT2 is written to the sensing control node H to globally reset the sensing control node H; and the seventh transistor M7 is turned on due to the high level signal provided by the global reset signal input terminal T-RST, and the low level voltage VGL1 provided by the second power supply terminal is written to the first pull-up node PU1 through the seventh transistor M7 to globally reset the first pull-up node PU1.

In a display input phase t1, the display signal input terminal INPUT1 provides a high level signal, the sensing signal input terminal INPUT2 provides a low level signal, the random signal input terminal OE provides a low level signal, the clock control signal input terminal CLKA provides a low level signal, the display reset signal input terminal RST provides a low level signal, and the global reset signal input terminal T-RST provides a low level signal.

The ninth transistor M9 is turned on due to the high level signal provided by the display signal input terminal INPUT1, the high level voltage VDD1 provided by the third power supply terminal is written to the first pull-up node PU1 through the ninth transistor M9, and a voltage at the first pull-up node PU1 is in a high level state. At this time, the thirteenth transistor M13, the fifth transistor M5, the fifteenth transistor M15, and the sixteenth transistor M16 are all turned on, the low level signal provided by the second power supply terminal is written to the first pull-down node PD1 through the thirteenth transistor M13, the low level signal provided by the first driving clock signal input terminal CLKE is written to the first driving signal output terminal OUT2 through the fifth transistor M5, a low level signal provided by the second driving clock signal input terminal CLKD is written to the second driving signal output terminal OUT1 through the fifteenth transistor M15, and a low level signal provided by the first cascade clock signal input terminal CLKC is written to the first cascade signal output terminal CR through the sixteenth transistor M16, that is, the first driving signal output terminal OUT2, the second driving signal output terminal OUT1, and the first cascade signal output terminal CR all output low level signals.

It should be noted that, due to the low level signal provided by the random signal input terminal OE, the first transistor is in an off state, and the sensing control node His in a floating state, that is, maintains the low level state as in the previous phase, at this time, the second transistor maintains an off state.

In a display output phase t2, the display signal input terminal INPUT1 provides a low level signal, the sensing signal input terminal INPUT2 provides a low level signal, the random signal input terminal OE provides a low level signal, the clock control signal input terminal CLKA provides a low level signal, the display reset signal input terminal RST provides a low level signal, and the sensing reset signal input terminal T-RST provides a low level signal.

Since both the display signal input terminal INPUT1 and the sensing signal input terminal INPUT2 provide the low level signals, both the ninth transistor M9 and the first transistor M1 are turned off, at this time, the sensing control node H is also in a low level state, and the second transistor is in the off state, so that the first pull-up node is in a floating state, that is, maintains the high level state as in the previous phase.

Since the first pull-up node PU1 is in the high level state, the thirteenth transistor M13, the fifth transistor M5, the fifteenth transistor M15, and the sixteenth transistor M16 all maintain on state, the first driving clock signal input terminal CLKE continuously writes signals to the first driving signal output terminal OUT2, the second driving clock signal input terminal CLKD continuously writes signals to the second driving signal output terminal OUT1, and the first cascade clock signal input terminal CLKC continuously writes signals to the first cascade signal output terminal CR.

In this process, each of the first driving clock signal input terminal CLKE, the second driving clock signal input terminal CLKD, and the first cascade signal input terminal CLKC first inputs a high level signal, and then inputs a low level signal, so the first driving signal output terminal OUT2, the second driving signal output terminal OUT1, and the first cascade signal output terminal CR to first output high level signals, and then output low level signals. It should be noted that a voltage at the first pull-up node PU1 is pulled up to a higher level under the bootstrap action of the second capacitor C2 and the third capacitor C3 in switching processes of the first driving signal output terminal OUT2 and the second driving signal output terminal OUT1 from outputting the low level signals to outputting the high level signals; and the voltage at the first pull-up node PU1 is pulled down to the initial high level state under the bootstrap action of the second capacitor C2 and the third capacitor C3 in switching processes of the first driving signal output terminal OUT2 and the second driving signal output terminal OUT1 from outputting the high level signals to outputting the low level signals.

In a display reset phase t3 (corresponding to the phase p1 in FIG. 5), the display signal input terminal INPUT1 provides a low level signal, the sensing signal input terminal INPUT2 provides a high level signal, the random signal input terminal OE provides a high level signal, the clock control signal input terminal CLKA provides a low level signal, the display reset signal input terminal RST provides a high level signal, and the global reset signal input terminal T-RST provides a low level signal.

The tenth transistor M10 is turned on due to the high level signal provided by the display reset signal input terminal RST, at this time, a low level signal provided by the second power supply terminal is written to the first pull-up node PU1 through the tenth transistor M10. Meanwhile, the first transistor M1 is turned on due to the high level signal provided by the random signal input terminal OE, the high level signal provided by the sensing signal input terminal INPUT2 is written to the sensing control node H through the first transistor, the sensing control node is in a high level state, the second transistor is turned on, and the low level signal provided by the clock control signal input terminal CLKA is written to the first pull-up node PU1 through the second transistor M2. Since the tenth transistor M10 and the second transistor M2 write the low level signals to the first pull-up node PU1 at the same time, the voltage at the first pull-up node PU1 can quickly drop to a low level state.

At this time, the thirteenth transistor M13 is turned off, a high level signal provided by the fifth power supply terminal is written to the first pull-down node PD1 through the twelfth transistor M12, the first pull-down node PD1 is in a high level state, and the fourteenth transistor M14, the seventeenth transistor M17, the eighteenth transistor M18, and the nineteenth transistor M19 are all turned on.

When the fourteenth transistor M14 is turned on, a low level signal provided by the second power supply terminal is written to the first pull-up node PU1 through the fourteenth transistor M14 to perform noise reduction on the first pull-up node PU1. When the seventeenth transistor M17, the eighteenth transistor M18, and the nineteenth transistor M19 are all turned on, a low level signal provided by the second power supply terminal is written to the first driving signal output terminal OUT2 and the second driving signal output terminal OUT1 through the seventeenth transistor M17 and the eighteenth transistor M18, respectively, and a low level signal provided by the fourth power supply terminal is written to the first cascade signal output terminal CR through the nineteenth transistor M19, that is, the first driving signal output terminal OUT2, the second driving signal output terminal OUT1, and the first cascade signal output terminal CR all output low level signals.

In a sensing output phase t4, the display signal input terminal INPUT1 provides a low level signal, the sensing signal input terminal INPUT2 provides a low level signal, the random signal input terminal OE provides a low level signal, the clock control signal input terminal CLKA provides a high level signal, the display reset signal input terminal RST provides a low level signal, and the global reset signal input terminal T-RST provides a low level signal.

Since the voltage at the sensing control node H maintains the high level state as in the previous phase, the second transistor M2 remains on state, and the high level signal provided by the clock control signal input terminal CLKA is written to the first pull-up node PU1 through the second transistor M2. Since the first pull-up node PU1 is in the high level state, the thirteenth transistor M13, the fifth transistor M5, the fifteenth transistor M15, and the sixteenth transistor M16 are all turned on, and a low level signal provided by the second power supply terminal is written to the first pull-down node PD1 through the thirteenth transistor M13.

The sensing output phase t4 may be divided into a phase t41 (corresponding to the phase p21 in FIG. 5) and a phase t42 (corresponding to the phase p22 in FIG. 5).

In the phase t41, the first driving clock signal input terminal CLKE, the second driving clock signal input terminal CLKD, and the first cascade clock signal input terminal CLKC all provide low level signals. At this time, the low level signal provided by the first driving clock signal input terminal CLKE is written to the first driving signal output terminal OUT2 through the fifth transistor M5, the low level signal provided by the second driving clock signal input terminal CLKD is written to the second driving signal output terminal OUT1 through the fifteenth transistor M15, and the low level signal provided by the first cascade clock signal input terminal CLKC is written to the first cascade signal output terminal CR through the sixteenth transistor M16, that is, the first driving signal output terminal OUT2, the second driving signal output terminal OUT1, and the first cascade signal output terminal CR all output low level signals.

In the phase t42, the first driving clock input terminal CLKE first provides a high level signal and then provides a low level signal, and both the second driving clock input terminal CLKD and the first cascade clock input terminal CLKC provide low level signals.

At this time, the second driving signal output terminal OUT1 and the first cascade signal output terminal CR continue outputting low level signals, and the first driving signal output terminal OUT2 first outputs a high level signal and then outputs a low level signal. A voltage at the first pull-up node PU1 is first pulled up and then pulled down under the bootstrap action of the second capacitor C2.

Then, a global reset phase t0 of a next frame begins, and voltages at the sensing control node H and the first pull-up node are both reset to low level states in the global reset phase t0 (corresponding to the phase p4 in FIG. 5) of the next frame.

The thirteenth transistor M13 is turned off, a high level signal provided by the fifth power supply terminal is written to the first pull-down node PD1 through the twelfth transistor M12, the first pull-down node PD1 is in a high level state, and the fourteenth transistor M14, the seventeenth transistor M17, the eighteenth transistor M18, and the nineteenth transistor M19 are all turned on.

When the fourteenth transistor M14 is turned on, a low level signal provided by the second power supply terminal is written to the first pull-up node PU1 through the fourteenth transistor M14 to perform noise reduction on the first pull-up node PU1. When the seventeenth transistor M17, the eighteenth transistor M18, and the nineteenth transistor M19 are all turned on, a low level signal provided by the second power supply terminal is written to the first driving signal output terminal OUT2 and the second driving signal output terminal OUT1 through the seventeenth transistor M17 and the eighteenth transistor M18, respectively, and a low level signal provided by the fourth power supply terminal is written to the first cascade signal output terminal CR through the nineteenth transistor M19, that is, the first driving signal output terminal OUT2, the second driving signal output terminal OUT1, and the first cascade signal output terminal CR all output low level signals.

In the embodiments of the present disclosure, a same clock signal may be input into the first cascade clock signal input terminal CLKC and the second driving clock signal input terminal CLKD, so that the first cascade clock signal input terminal CLKC and the second driving clock signal input terminal CLKD may be a same clock signal input terminal.

In the related art, the global reset signal input terminal T-RST is generally connected to a frame start signal input terminal (also referred to as an STV terminal for providing a frame start signal to indicate beginning of one frame) in the display panel, that is, the frame start signal is used as the global reset signal. In a shutdown scenario, after the sensing output phase t4 of the last frame is completed, if an active level signal provided by the global reset signal input terminal T-RST is directly used to control the first global reset circuit to perform sensing reset on the first pull-up node PU1, the first display input circuit 7 may pre-charge the corresponding first pull-up node in the shift register unit in one previous stage or each of the shift register units in several previous stages (the specific number of the shift register units needs to be preset according to actual needs, and the shift register unit in the one previous stage or the shift register units in the several previous stages are generally used as a dummy Gate On Array (GOA)) in each of which the display signal input terminal INPUT1 is connected to the frame start signal input terminal in the gate driving circuit. That is, after being powered off, the first pull-up node in the shift register unit in the one previous stage or the first pull-up nodes in the shift register units in the several previous stages are in active level states, and the transistors (e.g., the fifth transistor M5, the fifteenth transistor M15, and the sixteenth transistor M16) having the gate electrodes thereof connected to the first pull-up node(s) are in a stress state for a long time and are therefore subjected to a shift in electrical characteristics (e.g., a threshold voltage) of the transistors, resulting in poor reliability of the shift register units.

In view of the above problem, a technical solution of the present disclosure provides new timing of the shift register unit.

Figure 12:
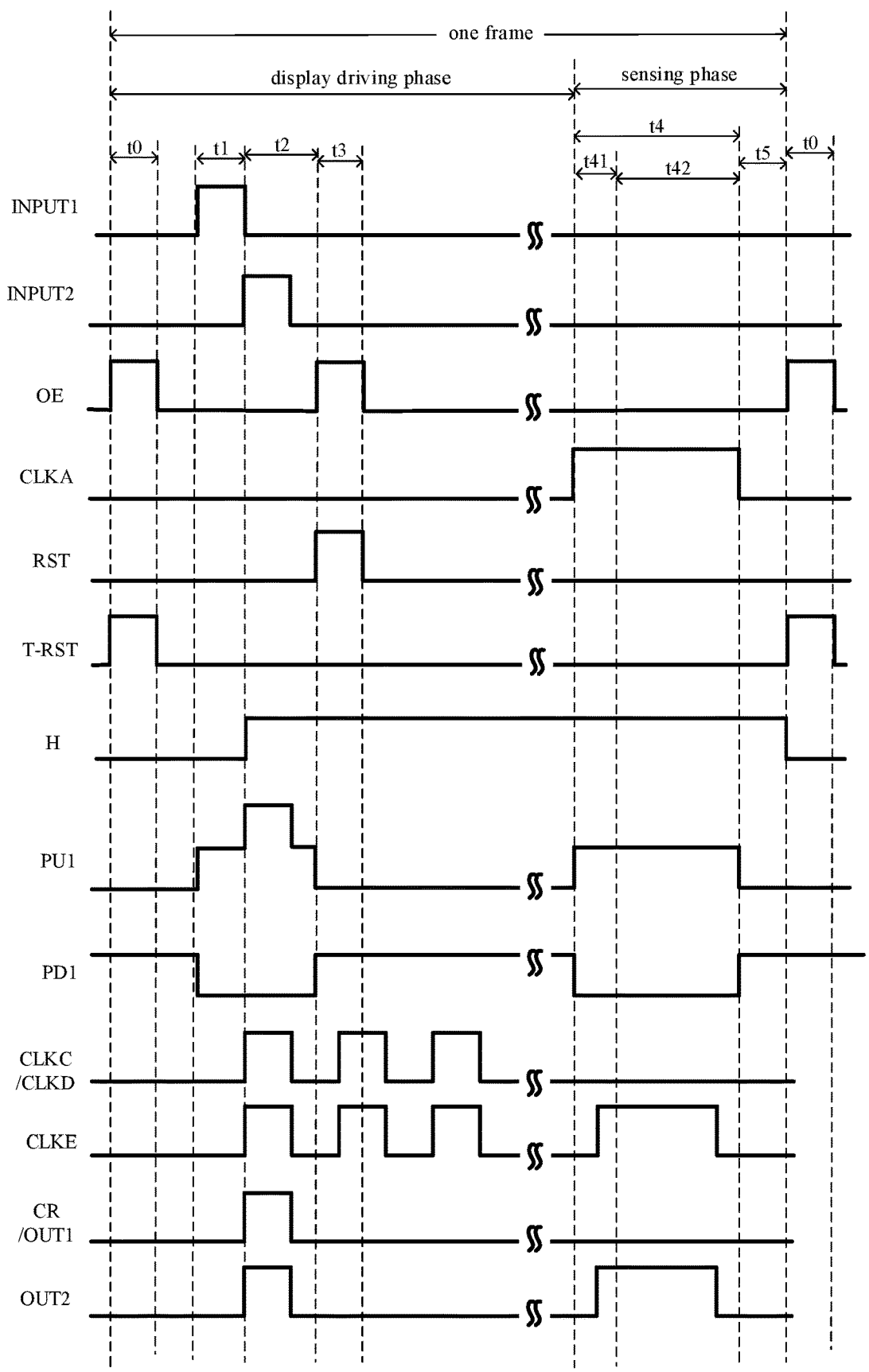
FIG. 12 is another timing diagram of the shift register unit shown in FIG. 10.

FIG. 12 is another timing diagram of the shift register unit shown in FIG. 10. As shown in FIG. 12, in addition to the global reset phase t0, the display input phase t1, the display output phase t2, the display reset phase t3, and the sensing output phase t4 shown in FIG. 11, an operating process shown in FIG. 12 further includes a sensing reset phase t5 (corresponding to the phase p3 in FIG. 5) after the sensing output phase t4 and before the global reset phase t0 of the next frame. Only the sensing reset phase t5 is described in detail below.

In the sensing reset phase t5 (corresponding to the phase p3 in FIG. 5), the display signal input terminal INPUT1 provides a low level signal, the sensing signal input terminal INPUT2 provides a low level signal, the random signal input terminal OE provides a low level signal, the clock control signal input terminal CLKA provides a low level signal, the display reset signal input terminal RST provides a low level signal, and the global reset signal input terminal T-RST provides a low level signal.

Since the second transistor M2 remains on state, the low level signal provided by the clock control signal input terminal CLKA may be written to the first pull-up node PU1 through the second transistor M2.

Unlike the operating process shown in FIG. 8, in the operating process shown in FIG. 12, the voltage at the first pull-up node PU1 can be reset in the current frame due to the sensing the reset phase t5.

In the shutdown scenario, after the sensing output phase t4 of the last frame is completed, the sensing reset phase t5 starts first to reset the voltage at the first pull-up node PU1 (that is, performing sensing reset on the first pull-up node). Then, an active level signal provided by the random signal input terminal OE is used to control the sensing control circuit 1 to write an inactive level signal to the sensing control node H to reset the sensing control node H.

It should be noted that, although the technical solution of the present disclosure can achieve reset the first pull-up node PU1 after the sensing output phase by providing the "sensing reset phase t5" and using the inactive level signal provided by the clock control signal input terminal CLKA, such technical solution has relatively high requirements on a circuit structure of the first sensing input circuit 2 (for example, the inactive level signal provided by the clock control signal input terminal CLKA cannot be output to the first pull-up node PU1 in some circuit structures) and precise control of the signal provided by the clock control signal input terminal CLKA, resulting in poor product reliability.

In view of the above, the present disclosure provides a new shift register unit, by additionally providing a first sensing reset circuit 3 in the shift register unit, the reliability of the shift register unit in resetting the first pull-up node PU1 in the sensing reset phase t5 can be effectively improved.

Figure 13:
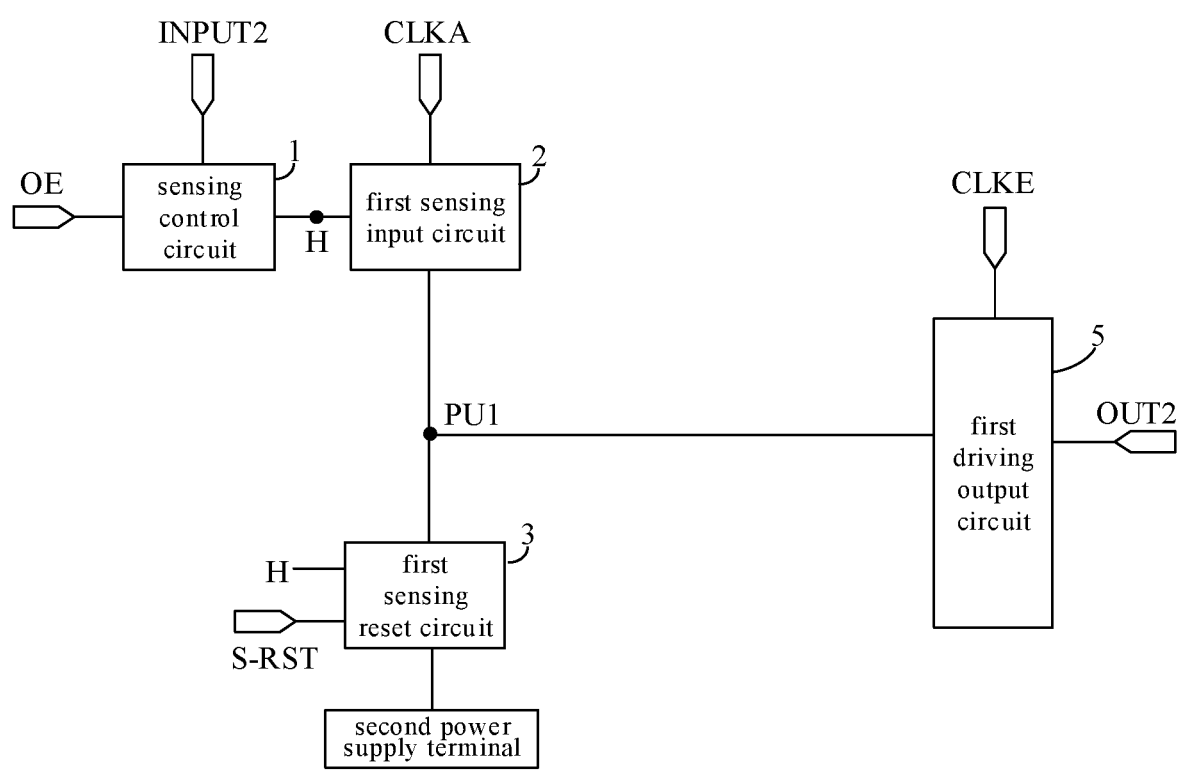
FIG. 13 is a schematic diagram of yet another circuit structure of the shift register unit according to the embodiments of the present disclosure.

FIG. 13 is a schematic diagram of yet another circuit structure of the shift register unit according to the embodiments of the present disclosure. As shown in FIG. 13, in addition to the sensing control circuit 1, the first sensing input circuit 2, and the first driving output circuit 5 in the above embodiments, the shift register unit shown in FIG. 13 further includes the first sensing reset circuit 3, and only the first sensing reset circuit 3 is described in detail below.

The first sensing reset circuit 3 is connected to a sensing reset signal input terminal S-RST, the sensing control node H, the first pull-up node PU1, and the second power supply terminal, and is configured to write an inactive level signal provided by the second power supply terminal to the first pull-up node in response to control of a signal provided by the sensing reset signal input terminal S-RST and an active level signal at the sensing control node H.

It should be noted that the first sensing reset circuit 3 according to the embodiments of the present disclosure operates in the phase p3 shown in FIG. 5 and the sensing reset phase t5 shown in FIG. 9.

Figure 14:
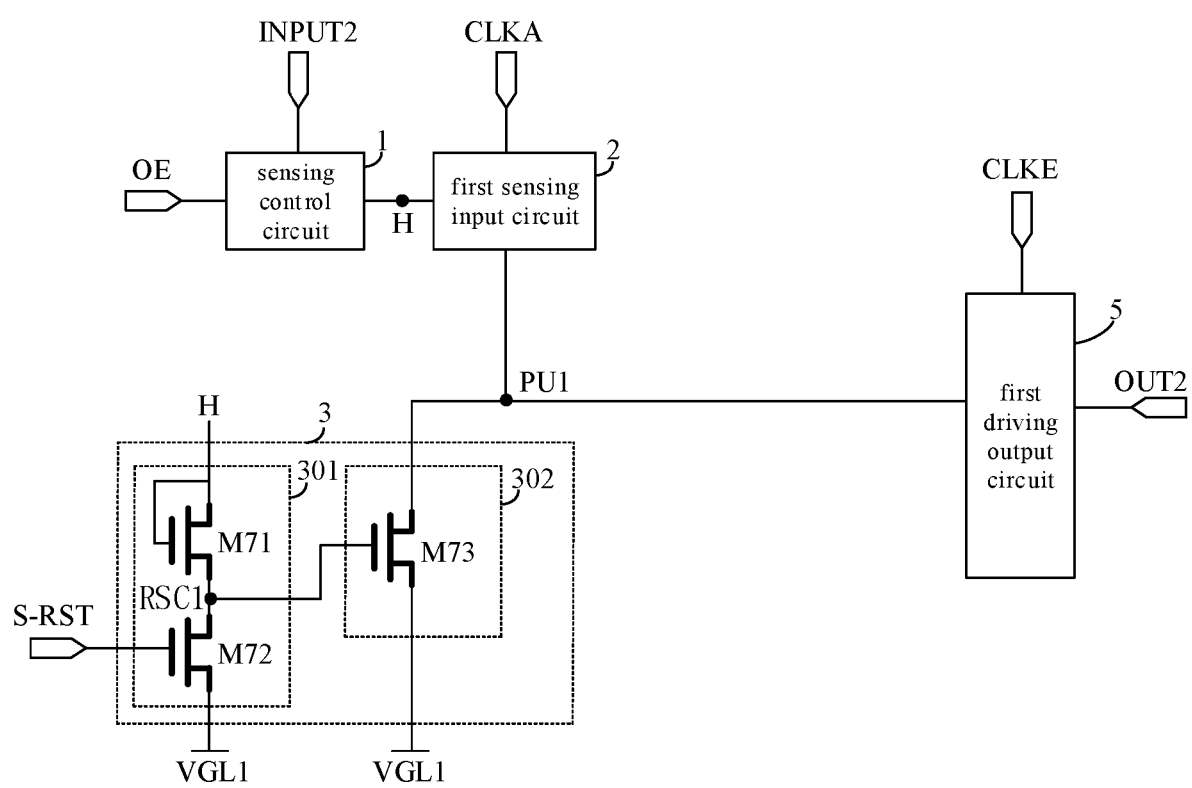
FIG. 14 is a schematic diagram of yet another circuit structure of the shift register unit according to the embodiments of the present disclosure.

FIG. 14 is a schematic diagram showing yet another circuit structure of the shift register unit according to the embodiments of the present disclosure. As shown in FIG. 14, as a sensing reset solution, the first sensing reset circuit 3 includes: a first sensing reset control circuit 301 and a first switch circuit 302.

The first sensing reset control circuit 301 is connected to the sensing reset signal input terminal S-RST, the sensing control node H, a first sensing reset control node RSC1, and the second power supply terminal, and is configured to write an active level signal at the sensing control node H to the first sensing reset control node RSC1 in response to control of an inactive level signal provided by the sensing reset signal input terminal S-RST and the active level signal at the sensing control node H.

The first switch circuit 302 is connected to the first sensing reset control node RSC1, the first pull-up node PU1, and the second power supply terminal, and is configured to form a path between the second power supply terminal and the first pull-up node PU1 in response to control of an active level signal at the first sensing reset control node RSC1, and cut off the path between the second power supply terminal and the first pull-up node PU1 in response to control of an inactive level signal at the first sensing reset control node RSC1.

That is, in the solution illustrated by FIG. 14, when the sensing reset signal input terminal S-RST provides the inactive level signal and the sensing control node H provides the active level signal, the first sensing reset control node RSC1 can provide the active level signal, the first switch circuit 302 is turned on, and the inactive level signal provided by the second power supply terminal can be written to the first pull-up node PU1 through the first switch circuit 302 to reset the first pull-up node.

In some embodiments, the first sensing reset control circuit 301 includes: a seventy-first transistor M71 and a seventy-second transistor M72, and the first switch circuit 302 includes: a seventy-third transistor M73.

A control electrode and a first electrode of the seventy-first transistor M71 are both connected to the sensing control node H, and a second electrode of the seventy-first transistor M71 is connected to the first sensing reset control node RSC1.

A control electrode of the seventy-second transistor M72 is connected to the sensing reset signal input terminal S-RST, a first electrode of the seventy-second transistor M72 is connected to the first sensing reset control node RSC1, and a second electrode of the seventy-second transistor M72 is connected to the second power supply terminal.

A control electrode of the seventy-third transistor M73 is connected to the first sensing reset control node RSC1, a first electrode of the seventy-third transistor M73 is connected to the first pull-up node PU1, and a second electrode of the seventy-third transistor M73 is connected to the second power supply terminal.

Figure 15:
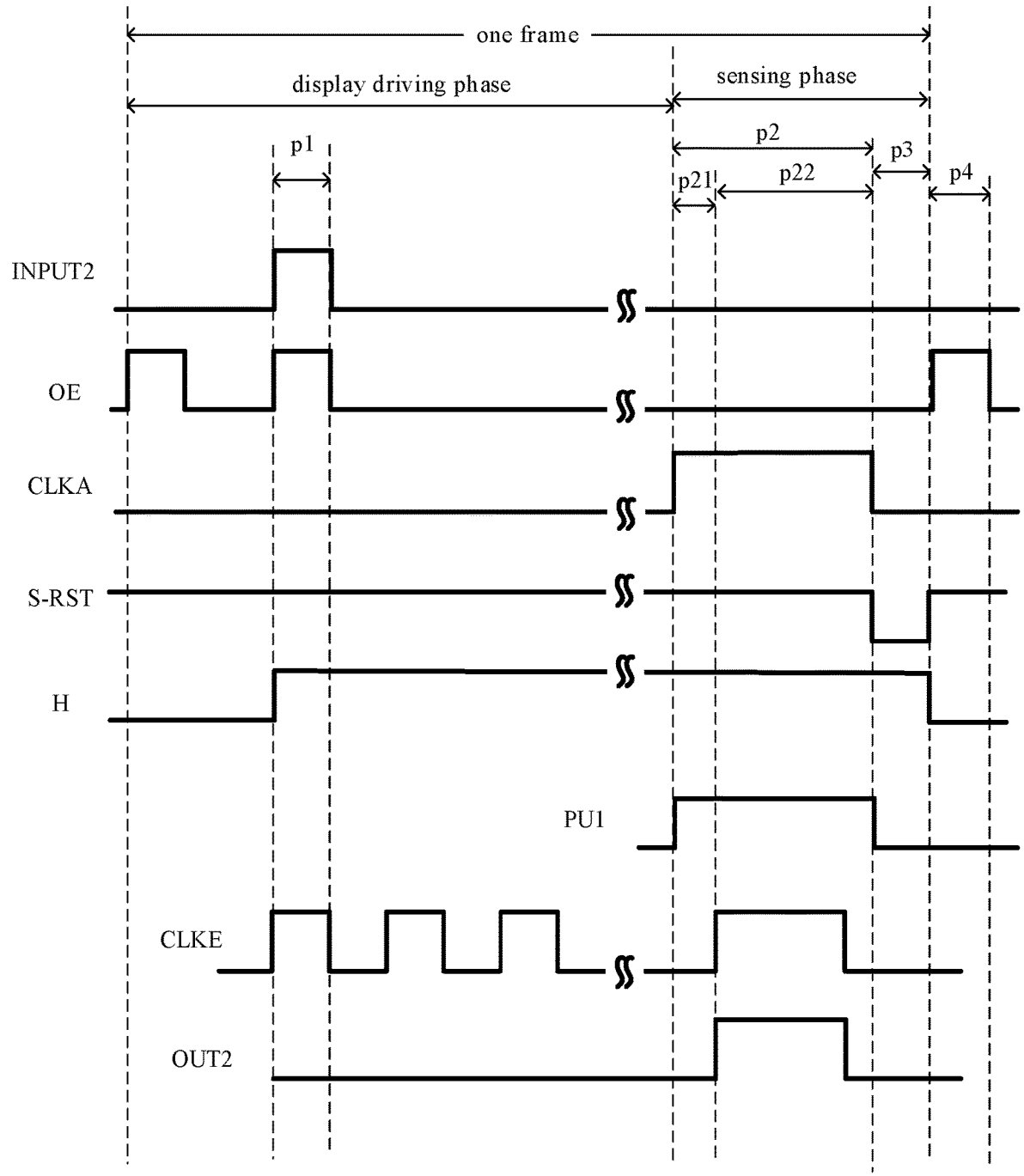
FIG. 15 is a timing diagram of the shift register unit shown in FIG. 14.

FIG. 15 is a timing diagram of the shift register unit shown in FIG. 14. As shown in FIG. 15, reference may be made to the description about FIG. 5 for a detailed description of the sensing control circuit 1, the first sensing input circuit 2, and the first driving output circuit 5 in the phases p1 to p4. Only the operation of the first sensing reset circuit 3 and the sensing reset signal input terminal S-RST in each phase are described in detail below.

The sensing reset signal input terminal S-RST provides an inactive level signal (e.g., a low level signal) in the phase p3, and provides an active level signal (e.g., a high level signal) in the other phases.

In the phase p3, the seventy-second transistor M72 is in an off state due to the inactive level signal provided by the sensing reset signal input terminal S-RST, at this time, an active level signal at the sensing control node can be provided to the seventy-first transistor M71 to be written to the first sensing reset control node RSC1, the seventy-third transistor M73 is turned on accordingly, and an inactive level signal provided by the second power supply terminal is written to the first pull-up node through the seventy-third transistor M73 to reset the first pull-up node.

It should be noted that, when the shift register unit in FIG. 14 adopts the operating timing shown in FIG. 12, the sensing reset signal input terminal S-RST provides an inactive level signal only in the sensing reset phase t5 (corresponding to the phase p3 in FIG. 15), and provides an active level signal in the other phases.

Figure 16:
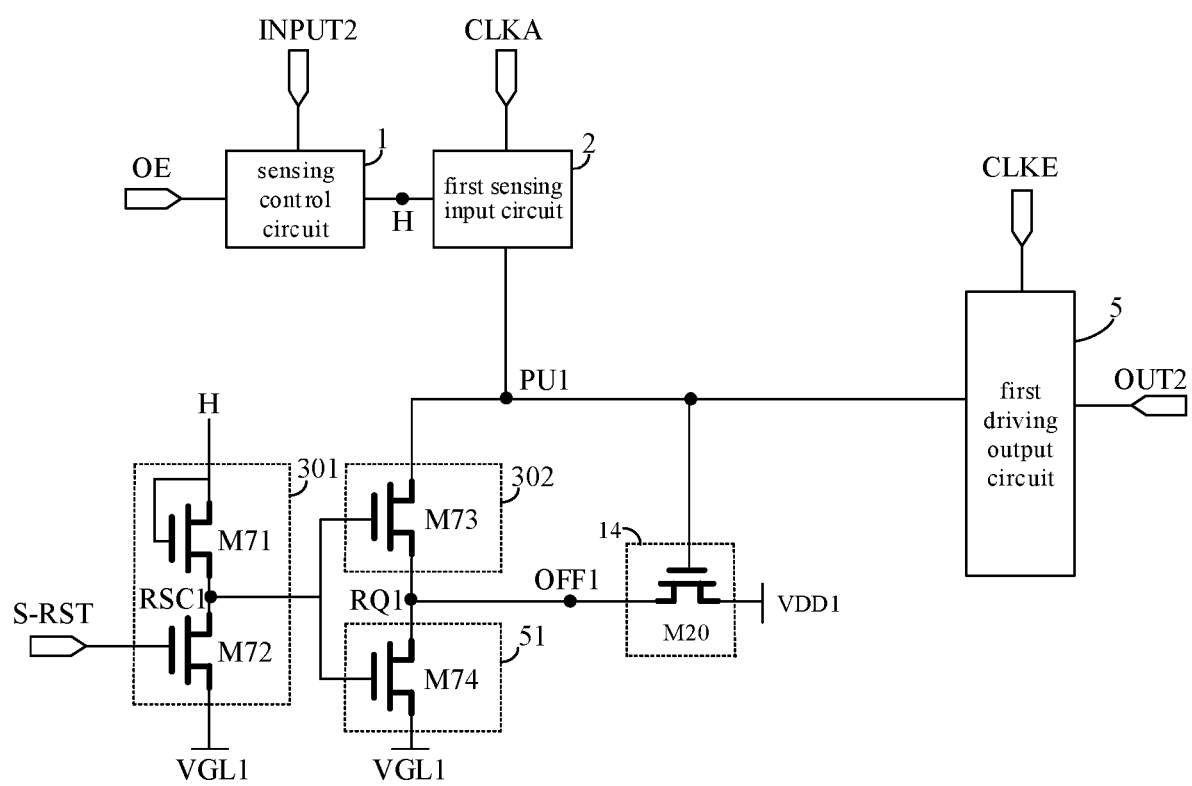
FIG. 16 is a schematic diagram of yet another circuit structure of the shift register unit according to the embodiments of the present disclosure.

FIG. 16 is a schematic diagram showing yet another circuit structure of the shift register unit according to the embodiments of the present disclosure. As shown in FIG. 16, as an anti-leakage design for the first sensing reset circuit 3 shown in FIG. 14, in some embodiments, the shift register unit further includes: a first voltage control circuit 14 and a first sensing reset anti-leakage circuit 51.

The first voltage control circuit 14 is connected to the third power supply terminal, the first pull-up node PU1, and a first voltage control node OFF1, and is configured to write an active level signal provided by the third power supply terminal to the first voltage control node OFF1 in response to control of an active level signal at the first pull-up node PU1.

The first switch circuit 302 is connected to the second power supply terminal through the first sensing reset anti-leakage circuit 51, and is connected to the first sensing reset anti-leakage circuit 51 at a first sensing reset anti-leakage node RQ1, and the first sensing reset anti-leakage node RQ1 is connected to the first voltage control node OFF1.

The first sensing reset anti-leakage circuit 51 is connected to the first sensing reset control node RSC1, and is configured to form a path between the first sensing reset anti-leakage node RQ1 and the second power supply terminal in response to control of an active level signal at the first sensing reset control node RSC1, and cut off the path between the first sensing reset anti-leakage node RQ1 and the second power supply terminal in response to control of an inactive level signal at the first sensing reset control node RSC1.

In some embodiments, the first voltage control circuit 14 includes: a twentieth transistor M20. A control electrode of the twentieth transistor M20 is connected to the first pull-up node PU1, a first electrode of the twentieth transistor M20 is connected to the third power supply terminal, and a second electrode of the twentieth transistor M20 is connected to the first voltage control node OFF1.

The first sensing reset anti-leakage circuit 51 includes: a seventy-fourth transistor M74. A control electrode of the seventy-fourth transistor M74 is connected to the first sensing reset control node RSC1, a first electrode of the seventy-fourth transistor M74 is connected to the first sensing reset anti-leakage node RQ1, and a second electrode of the seventy-fourth transistor M74 is connected to the second power supply terminal.

Figure 17A:
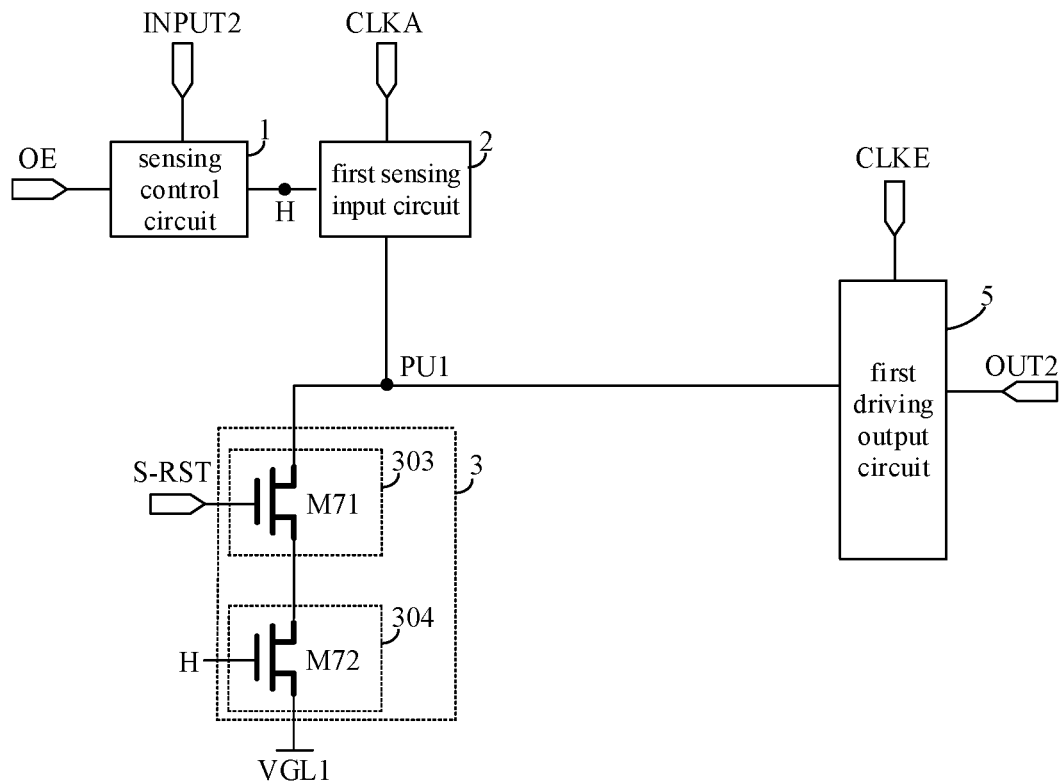
FIG. 17A is a schematic diagram of yet another circuit structure of the shift register unit according to the embodiments of the present disclosure.
Figure 17B:
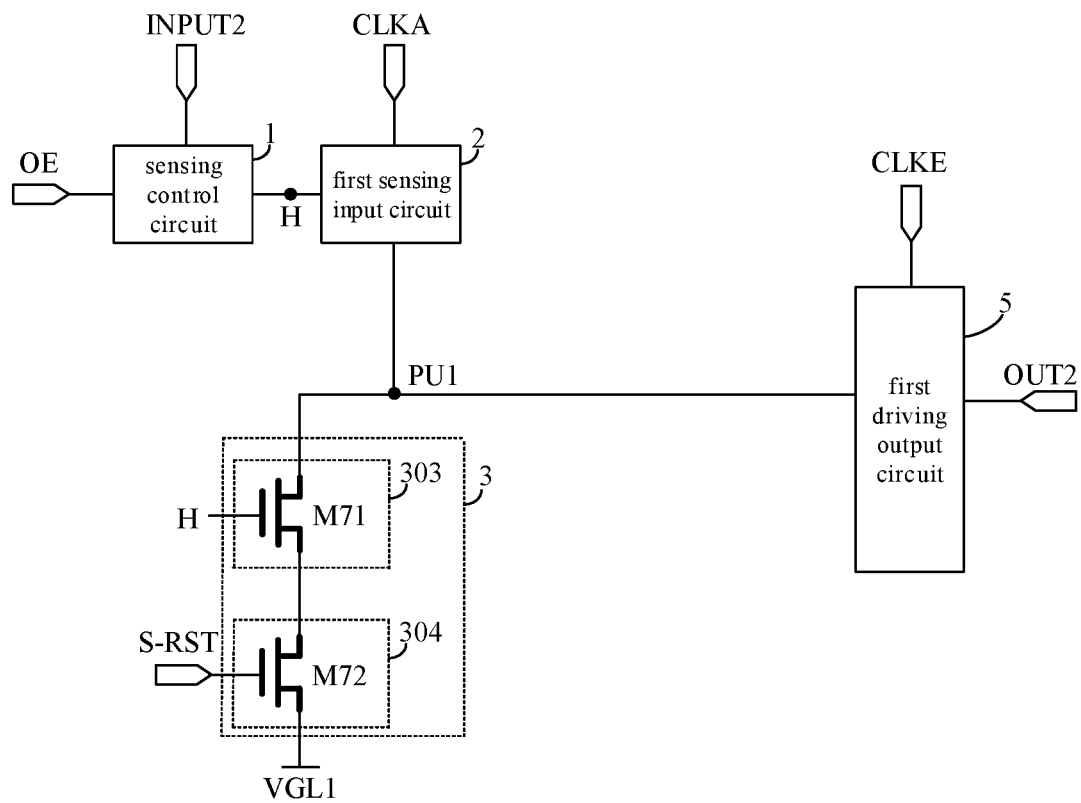
FIG. 17B is a schematic diagram of yet another circuit structure of the shift register unit according to the embodiments of the present disclosure.

FIG. 17A is a schematic diagram showing yet another circuit structure of the shift register unit according to the embodiments of the present disclosure, and FIG. 17B is a schematic diagram showing yet another circuit structure of the shift register unit according to the embodiments of the present disclosure. As shown in FIG. 17A and FIG. 17B, as another sensing reset solution, in some embodiments, the first sensing reset circuit 3 includes: a second switch circuit 303 and a third switch circuit 304 connected in series between the first pull-up node PU1 and the second power supply terminal, and the second switch circuit 303 is located between the third switch circuit 304 and the first pull-up node PU1.

One of the second switch circuit 303 and the third switch circuit 304 is connected to the sensing reset signal input terminal S-RST, and the other is connected to the sensing control node H.

The second switch circuit 303 and the third switch circuit 304 are configured to form a path between the second power supply terminal and the first pull-up node PU1 in response to control of an active level signal provided by the sensing reset signal input terminal S-RST and an active level signal at the sensing control node, and cut off the path between the second power supply terminal and the first pull-up node PU1 in response to control of a low level signal provided by at least one of the sensing reset signal input terminal S-RST and the sensing control node H.

FIG. 17A illustrates a case where the second switch circuit 303 is connected to the sensing reset signal input terminal S-RST, and the third switch circuit 304 is connected to the sensing control node H; and FIG. 17B illustrates a case where the second switch circuit 303 is connected to the sensing control node H, and the third switch circuit 304 is connected to the sensing reset signal input terminal S-RST.

That is, in the solutions illustrated by FIG. 17A and FIG. 17B, when the sensing reset signal input terminal S-RST provides the active level signal and the sensing control node H provides the active level signal, the second switch circuit 303 and the third switch circuit 304 are both turned on, and an inactive level signal provided by the second power supply terminal can be written to the first pull-up node PU1 through the second switch circuit 303 and the third switch circuit 304 to reset the first pull-up node.

In some embodiments, the second switch circuit 303 includes: a seventy-first transistor M71, and the third switch circuit 304 includes: a seventy-second transistor M72. A control electrode of one of the seventy-first transistor M71 and the seventy-second transistor M72 is connected to the sensing reset signal input terminal S-RST, and a control electrode of the other is connected to the sensing control node H; a first electrode of the seventy-first transistor M71 is connected to the first pull-up node, a second electrode of the seventy-first transistor M71 is connected to a first electrode of the seventy-second transistor M72, and a second electrode of the seventy-second transistor M72 is connected to the second power supply terminal.

Figure 18A:
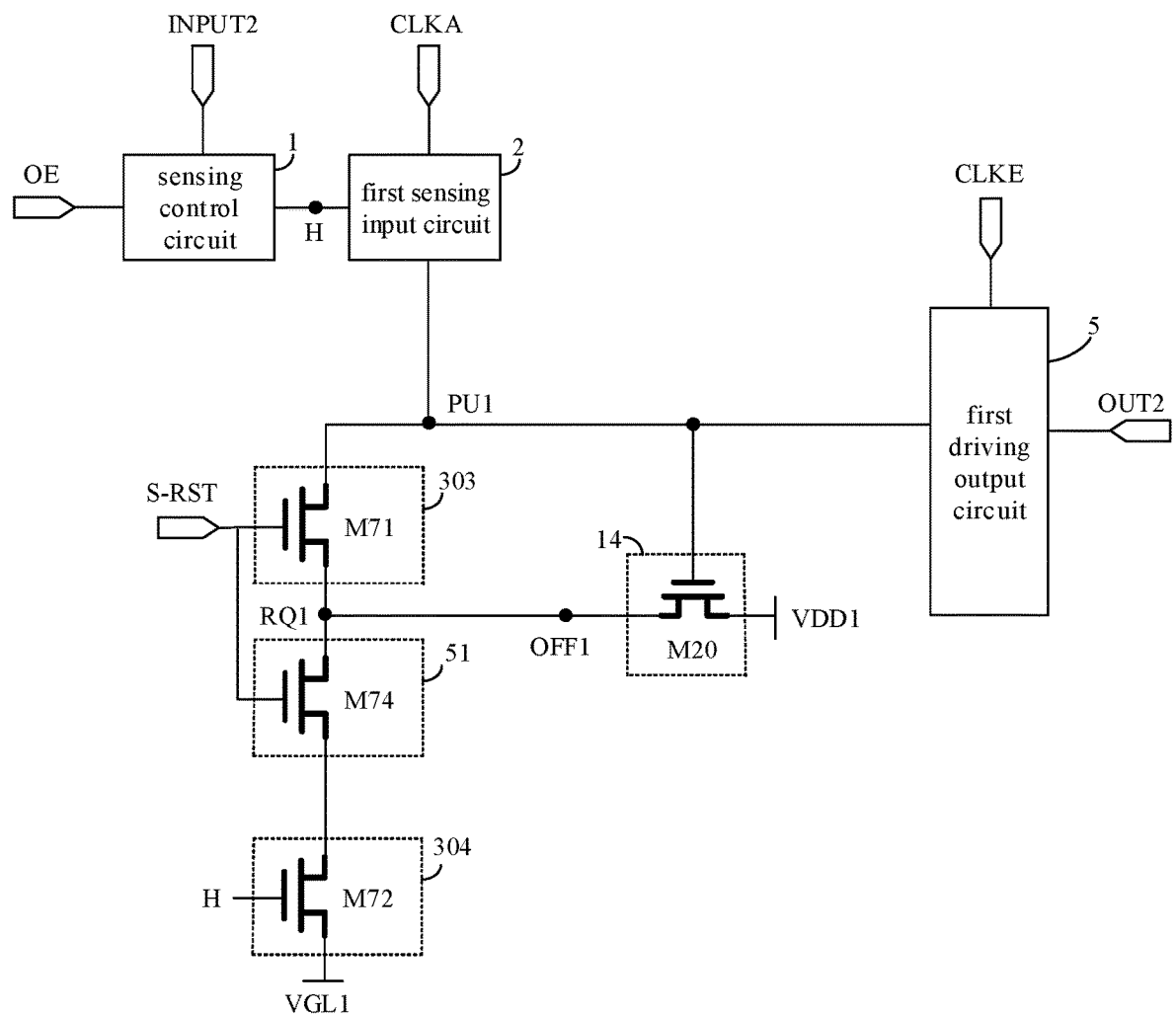
FIG. 18A is a schematic diagram of yet another circuit structure of the shift register unit according to the embodiments of the present disclosure.
Figure 18B:
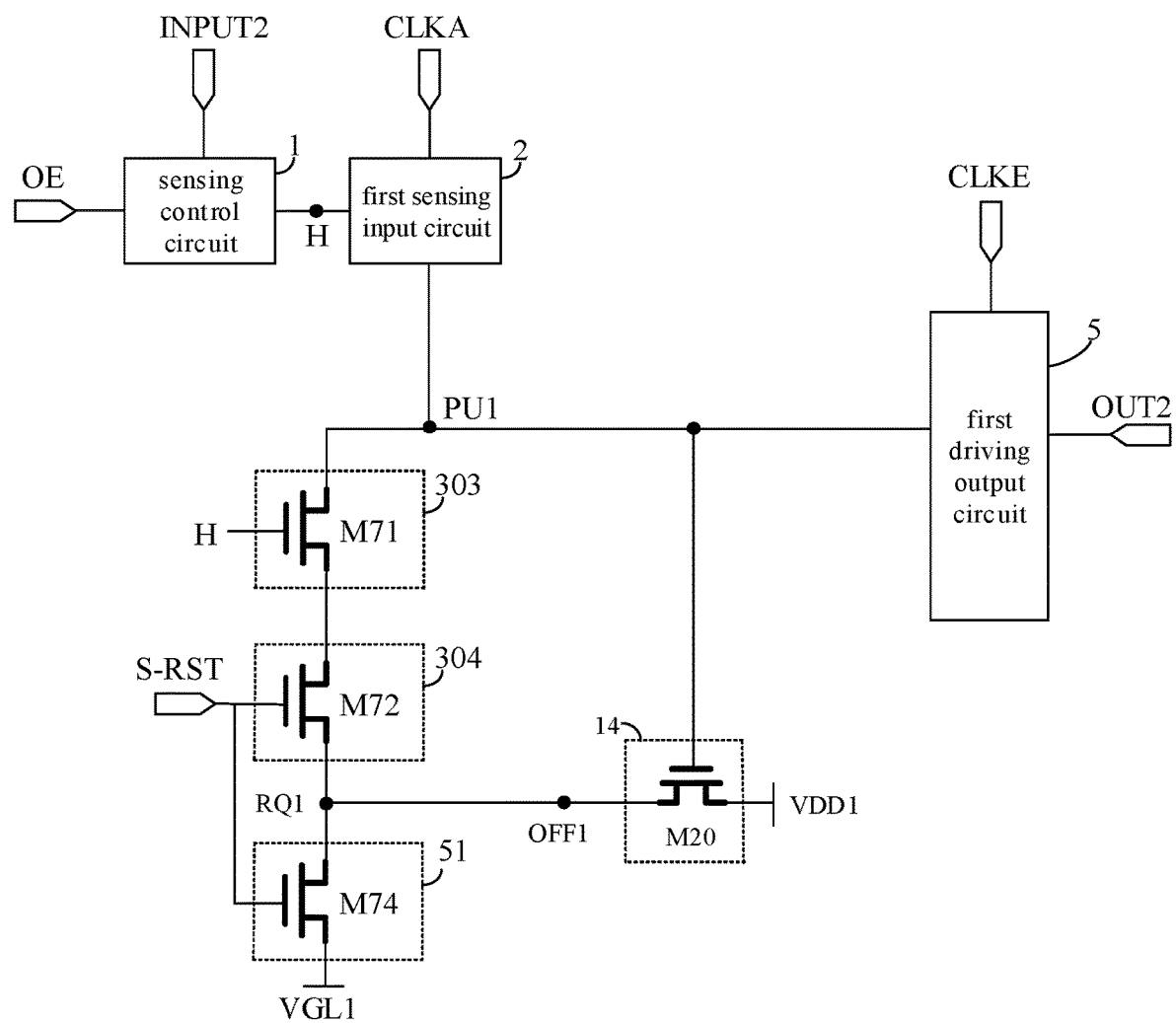
FIG. 18B is a schematic diagram of yet another circuit structure of the shift register unit according to the embodiments of the present disclosure.

FIG. 18A is a schematic diagram showing yet another circuit structure of the shift register unit according to the embodiments of the present disclosure, and FIG. 18B is a schematic diagram showing yet another circuit structure of the shift register unit according to the embodiments of the present disclosure. As shown in FIG. 18A and FIG. 18B, as an anti-leakage design for the first sensing reset circuit 3 shown in FIG. 17A and FIG. 17B, in some embodiments, the shift register unit further includes: a first voltage control circuit 14 and a first sensing reset anti-leakage circuit 51.

The first voltage control circuit 14 is connected to the third power supply terminal, the first pull-up node PU1, and a first voltage control node OFF1, and is configured to write an active level signal provided by the third power supply terminal to the first voltage control node OFF1 in response to control of an active level signal at the first pull-up node PU1.

With reference to FIG. 18A, the second switch circuit 303 is connected to the sensing reset signal input terminal S-RST, is connected to the third switch circuit 304 through the first sensing reset anti-leakage circuit 51, and is connected to the first sensing reset anti-leakage circuit 51 at a first sensing reset anti-leakage node RQ1, and the first sensing reset anti-leakage node RQ1 is connected to the first voltage control node OFF1.

The first sensing reset anti-leakage circuit 51 is connected to the sensing reset signal input terminal S-RST, and is configured to form a path between the first sensing reset anti-leakage node RQ1 and the third switch circuit 304 in response to control of an active level signal at the sensing reset signal input terminal S-RST, and cut off the path between the first sensing reset anti-leakage node RQ1 and the third switch circuit 304 in response to control of an inactive level signal at the sensing reset signal input terminal S-RST.

With reference to FIG. 18B, the third switch circuit 304 is connected to the sensing reset signal input terminal S-RST, is connected to the second power supply terminal through the first sensing reset anti-leakage circuit 51, and is connected to the first sensing reset anti-leakage circuit 51 at the first sensing reset anti-leakage node RQ1, and the first sensing reset anti-leakage node RQ1 is connected to the first voltage control node OFF1.

The first sensing reset anti-leakage circuit 51 is connected to the sensing reset signal input terminal S-RST, and is configured to form a path between the first sensing reset anti-leakage node RQ1 and the second power supply terminal in response to control of an active level signal at the sensing reset signal input terminal S-RST, and cut off the path between the first sensing reset anti-leakage node RQ1 and the second power supply terminal in response to control of an inactive level signal at the sensing reset signal input terminal S-RST.

In some embodiments, the first voltage control circuit 14 includes: a twentieth transistor M20, a control electrode of the twentieth transistor M20 is connected to the first pull-up node PU1, a first electrode of the twentieth transistor M20 is connected to the third power supply terminal, and a second electrode of the twentieth transistor M20 is connected to the first voltage control node OFF1.

The first sensing reset anti-leakage circuit 51 includes: a seventy-fourth transistor M74, a control electrode of the seventy-fourth transistor M74 is connected to the sensing reset signal input terminal S-RST, and a first electrode of the seventy-fourth transistor M74 is connected to the first sensing reset anti-leakage node RQ1.

With reference to FIG. 18A, in the case where the second switch circuit 303 is connected to the sensing reset signal input terminal S-RST, a second electrode of the seventy-fourth transistor M74 is connected to the third switch circuit 304.

With reference to FIG. 18B, in the case where the third switch circuit 304 is connected to the sensing reset signal input terminal S-RST, the second electrode of the seventy-fourth transistor M74 is connected to the second power supply terminal.

Figure 19:
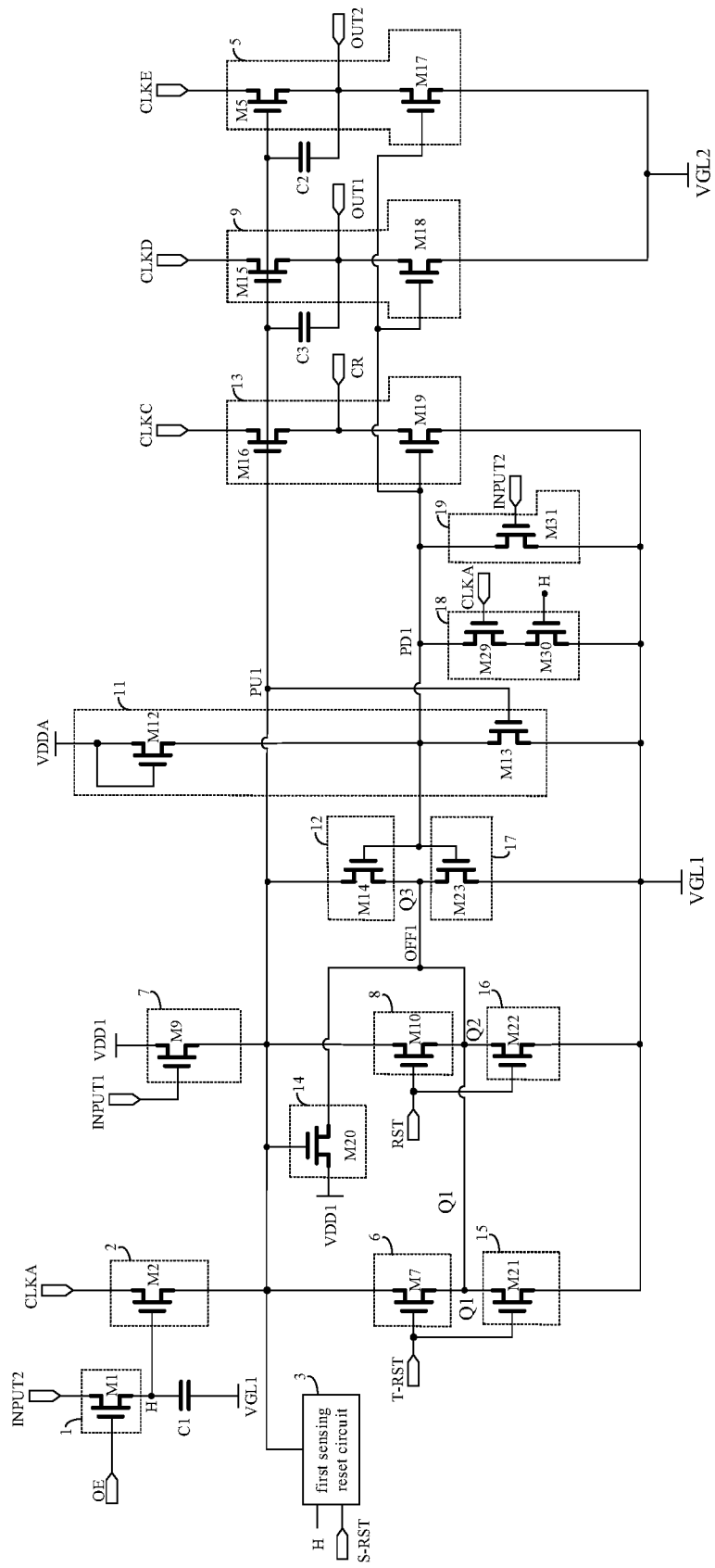
FIG. 19 is a schematic diagram of yet another circuit structure of the shift register unit according to the embodiments of the present disclosure.

FIG. 19 is a schematic diagram showing yet another circuit structure of the shift register unit according to the embodiments of the present disclosure. As shown in FIG. 19, in some embodiments, in the case where the shift register unit includes the first global reset circuit 6, the first display reset circuit 8, and the first pull-up noise reduction circuit 12, an anti-leakage design may be made for at least one of the first global reset circuit 6, the first display reset circuit 8, and the first pull-up noise reduction circuit 12.

In some embodiments, the shift register unit includes a first voltage control circuit 14. The first voltage control circuit 14 is connected to the third power supply terminal, the first pull-up node PU1, and a first voltage control node OFF1, and is configured to write an active level signal provided by the third power supply terminal to the first voltage control node OFF1 in response to control of an active level signal at the first pull-up node PU1.

The shift register unit further includes at least one of a first anti-leakage circuit 15, a second anti-leakage circuit 16, and a third anti-leakage circuit 17.

The first global reset circuit 6 is connected to the second power supply terminal through the first anti-leakage circuit 15, and is connected to the first anti-leakage circuit 15 at a first anti-leakage node Q1, and the first anti-leakage node Q1 is connected to the first voltage control node OFF1. The first anti-leakage circuit 15 is connected to the global reset signal input terminal T-RST, and is configured to form a path between the first anti-leakage node Q1 and the second power supply terminal in response to control of an active level signal provided by the global reset signal input terminal T-RST, and cut off the path between the first anti-leakage node Q1 and the second power supply terminal in response to control of an inactive level signal provided by the global reset signal input terminal T-RST.

The first display reset circuit 8 is connected to the second power supply terminal through the second anti-leakage circuit 16, and is connected to the second anti-leakage circuit 16 at a second anti-leakage node Q2, and the second anti-leakage node Q2 is connected to the first voltage control node OFF1. The second anti-leakage circuit 16 is connected to the display reset signal input terminal RST, and is configured to form a path between the second anti-leakage node Q2 and the second power supply terminal in response to control of an active level signal provided by the display reset signal input terminal RST, and cut off the path between the second anti-leakage node Q2 and the second power supply terminal in response to control of an inactive level signal provided by the display reset signal input terminal RST.

The first pull-up noise reduction circuit 12 is connected to the second power supply terminal through the third anti-leakage circuit 17, and is connected to the third anti-leakage circuit 17 at a third anti-leakage node Q3, and the third anti-leakage node Q3 is connected to the first voltage control node OFF1. The third anti-leakage circuit 17 is connected to the first pull-down node PD1, and is configured to form a path between the third anti-leakage node Q3 and the second power supply terminal in response to control of an active level signal at the first pull-down node PD1, and cut off the path between the third anti-leakage node Q3 and the second power supply terminal in response to control of an inactive level signal at the first pull-down node PD1.

The third power supply terminal provides an active level signal; and as an example, the third power supply terminal provides a high level voltage VDD1.

In some embodiments, the first voltage control circuit 14 includes a twentieth transistor M20, a control electrode of the twentieth transistor M20 is connected to the first pull-up node PU1, a first electrode of the twentieth transistor M20 is connected to an active level supply terminal, and a second electrode of the twentieth transistor M20 is connected to the first voltage control node OFF1.

In some embodiments, the first anti-leakage circuit 15 includes a twenty-first transistor M21, a control electrode of the twenty-first transistor M21 is connected to the global reset signal input terminal T-RST, a first electrode of the twenty-first transistor M21 is connected to the first anti-leakage node Q1, and a second electrode of the twenty-first transistor M21 is connected to the second power supply terminal.

In some embodiments, the second anti-leakage circuit 16 includes a twenty-second transistor M22, a control electrode of the twenty-second transistor M22 is connected to the display reset signal input terminal RST, a first electrode of the twenty-second transistor M22 is connected to the second anti-leakage node Q2, and a second electrode of the twenty-second transistor M22 is connected to the second power supply terminal.

In some embodiments, the third anti-leakage circuit 17 includes: a twenty-third transistor M23, a control electrode of the twenty-third transistor M23 is connected to the first pull-down node PD1, a first electrode of the twenty-third transistor M23 is connected to the third anti-leakage node Q3, and a second electrode of the twenty-third transistor M23 is connected to the second power supply terminal.

It should be noted that FIG. 19 illustrates an exemplary case where the shift register unit includes all of the first anti-leakage circuit 15, the second anti-leakage circuit 16, and the third anti-leakage circuit 17. In practical applications, at least one of the first anti-leakage circuit 15, the second anti-leakage circuit 16, and the third anti-leakage circuit 17 may be configured according to actual needs.

Still with reference to FIG. 19, in some embodiments, the shift register unit further includes a first pull-down noise reduction circuit 18 and/or a second pull-down noise reduction circuit 19.

The first pull-down noise reduction circuit 18 is connected to the first pull-down node PD1, the second power supply terminal, the sensing control node H, and the clock control signal input terminal CLKA, and is configured to write an inactive level signal provided by the second power supply terminal to the first pull-down node PD1 in response to control of an active level signal at the sensing control node H and an active level signal provided by the clock control signal input terminal CLKA to perform noise reduction on the voltage at the first pull-down node PD1.

The second pull-down noise reduction circuit 19 is connected to the first pull-down node PD1, the second power supply terminal, and the sensing signal input terminal INPUT2, and is configured to write an inactive level signal provided by the second power supply terminal to the first pull-down node PD1 in response to control of an active level signal provided by the sensing signal input terminal INPUT2 to perform noise reduction on the voltage at the first pull-down node PD1.

In some embodiments, the first pull-down noise reduction circuit 18 includes a twenty-ninth transistor M29 and a thirtieth transistor M30, and the second pull-down noise reduction circuit 19 includes a thirty-first transistor M31.

A control electrode of the twenty-ninth transistor M29 is connected to the clock control signal input terminal CLKA, a first electrode of the twenty-ninth transistor M29 is connected to the first pull-down node PD1, and a second electrode of the twenty-ninth transistor M29 is connected to a first electrode of the thirtieth transistor M30.

A control electrode of the thirtieth transistor M30 is connected to the sensing control node H, and a second electrode of the thirtieth transistor M30 is connected to the second power supply terminal.

A control electrode of the thirty-first transistor M31 is connected to the sensing signal input terminal INPUT2, a first electrode of the thirty-first transistor M31 is connected to the first pull-down node PD1, and a second electrode of the thirty-first transistor M31 is connected to the second power supply terminal.

Figure 20:
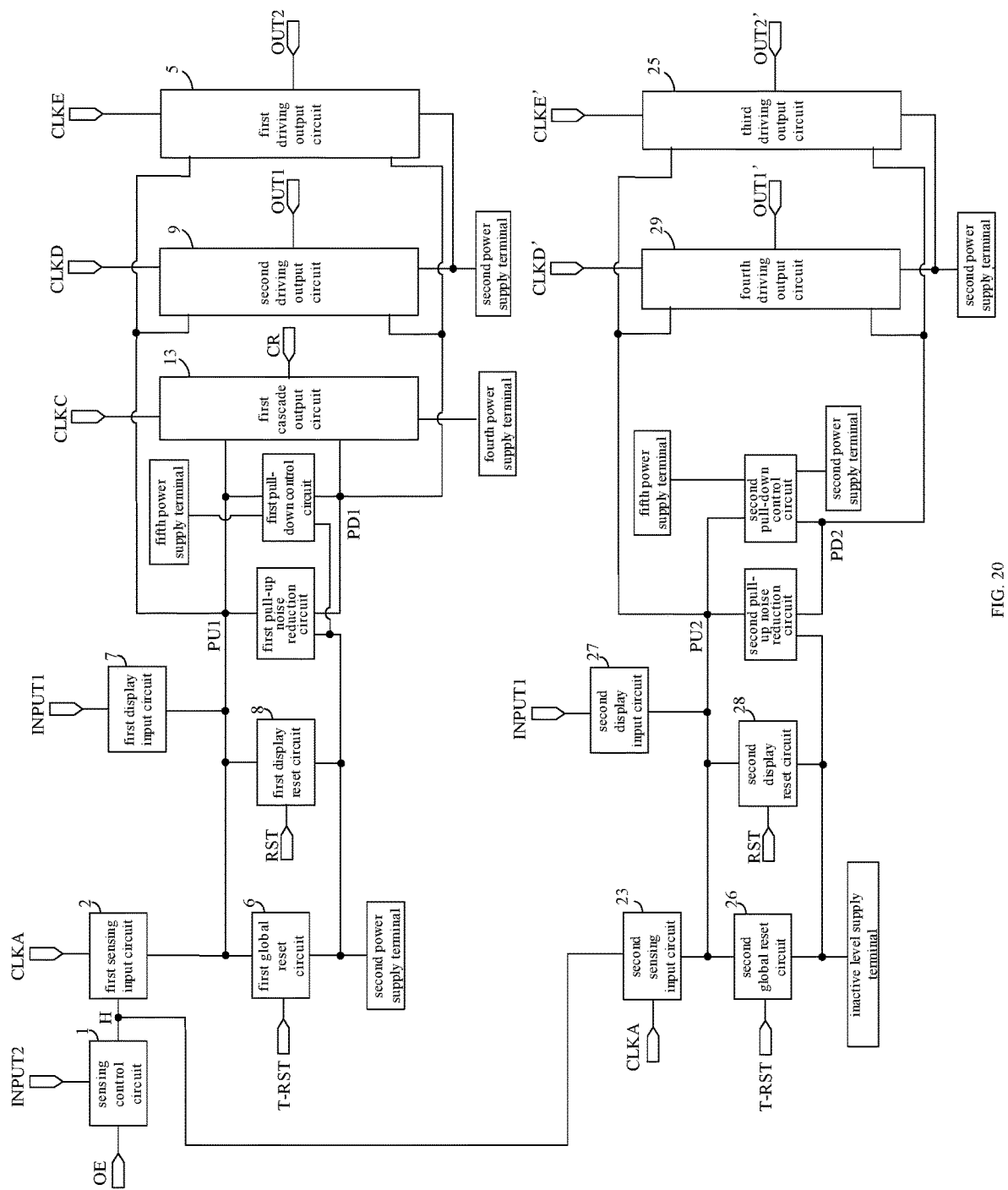
FIG. 20 is a schematic diagram of yet another circuit structure of the shift register unit according to the embodiments of the present disclosure.

FIG. 20 is a schematic diagram showing yet another circuit structure of the shift register unit according to the embodiments of the present disclosure. As shown in FIG. 20, in addition to the first display input circuit 7, the second driving output circuit 9, and the first cascade output circuit 13 in the above embodiments, the shift register unit shown in FIG. 20 further includes: a second sensing input circuit 23, a second display input circuit 27, a third driving output circuit 25, and a fourth driving output circuit 29.

The second sensing input circuit 23 is connected to the sensing control node H, the clock control signal input terminal CLKA, and a second pull-up node PU2, and is configured to write a signal provided by the clock control signal input terminal CLKA to the second pull-up node PU2 in response to control of an active level signal at the sensing control node H.

The second display input circuit 27 is connected to the display signal input terminal INPUT1 and the second pull-up node PU2, and is configured to write an active level signal to the second pull-up node PU2 in response to control of an active level signal provided by the display signal input terminal INPUT1.

The third driving output circuit 25 is connected to the second pull-up node PU2, a third driving clock signal input terminal CLKE', and a third driving signal output terminal, and is configured to write a signal provided by the third driving clock signal input terminal CLKE' to the third driving signal output terminal in response to control of an active level signal at the second pull-up node PU2.

The fourth driving output circuit 29 is connected to the second pull-up node PU2, a fourth driving clock signal input terminal CLKD', and a fourth driving signal output terminal, and is configured to write a signal provided by the fourth driving clock signal input terminal CLKD' to the fourth driving signal output terminal in response to control of an active level signal at the second pull-up node PU2.

In the embodiments of the present disclosure, the first driving output circuit 5 and the second driving output circuit 9 may be used to provide corresponding driving signals for two gate lines G2 and G1 configured for one row of pixel units in the display panel, respectively. Meanwhile, the third driving output circuit 25 and the fourth driving output circuit 29 may be used to provide corresponding driving signals for two gate lines G2 and G1 configured for another row of pixel units in the display panel, respectively. That is, the shift register unit provided by the embodiments may be used to drive four gate lines configured for two rows of pixel units (for example, two adjacent rows of pixel units). With such design, the number of stages of shift register units in a gate driving circuit can be effectively reduced, a region occupied by the gate driving circuit can be reduced, and the narrow frame design of the product can be facilitated.

Figure 21:
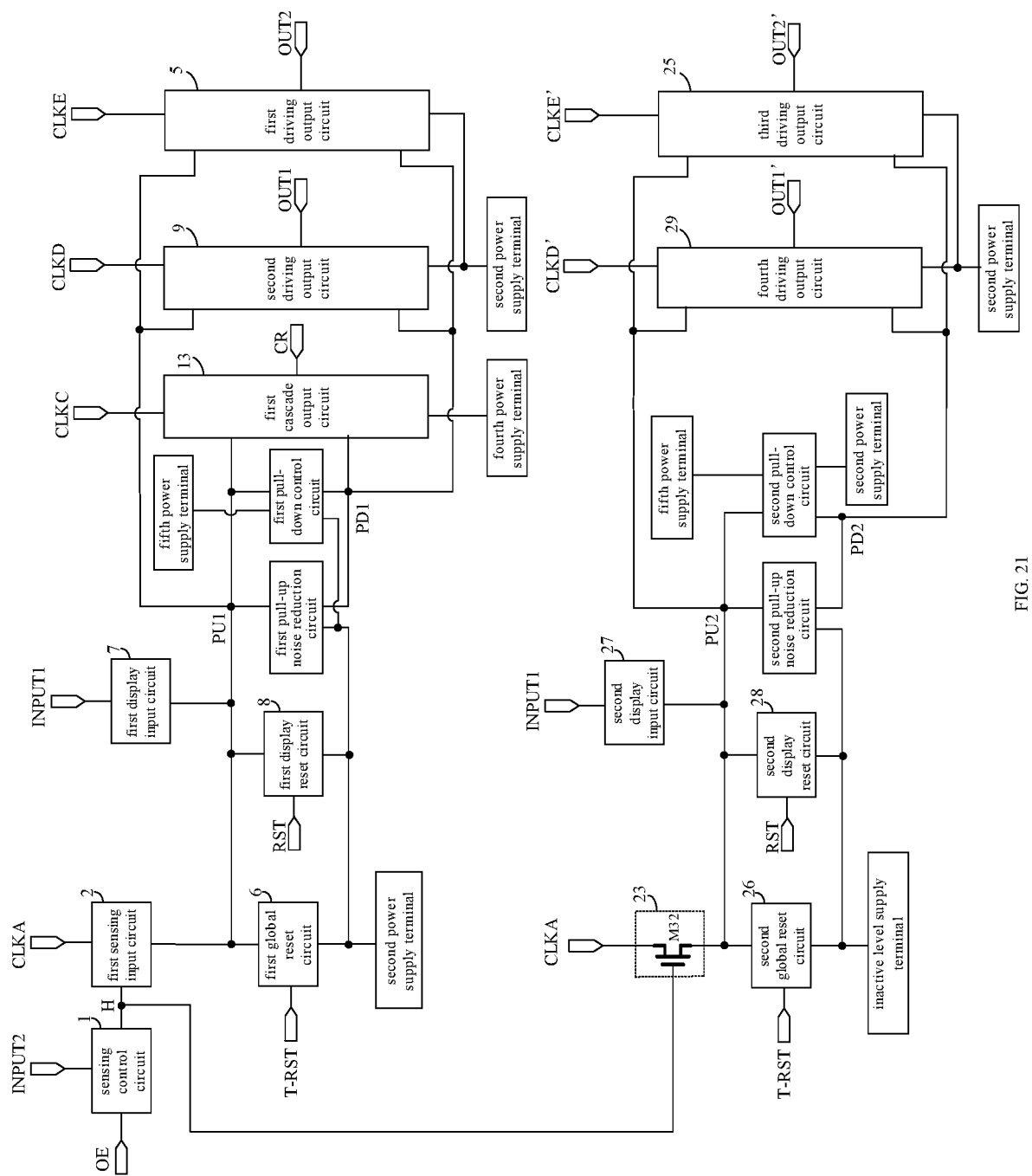
FIG. 21 is a schematic diagram of yet another circuit structure of the shift register unit according to the embodiments of the present disclosure.

FIG. 21 is a schematic diagram showing yet another circuit structure of the shift register unit according to the embodiments of the present disclosure. As shown in FIG. 21, in some embodiments, the second sensing input circuit 23 includes: a thirty-second transistor M32. A control electrode of the thirty-second transistor M32 is connected to the sensing control node H, a first electrode of the thirty-second transistor M32 is connected to the clock control signal input terminal CLKA, and a second electrode of the thirty-second transistor M32 is connected to the second pull-up node PU2.

Figure 22:
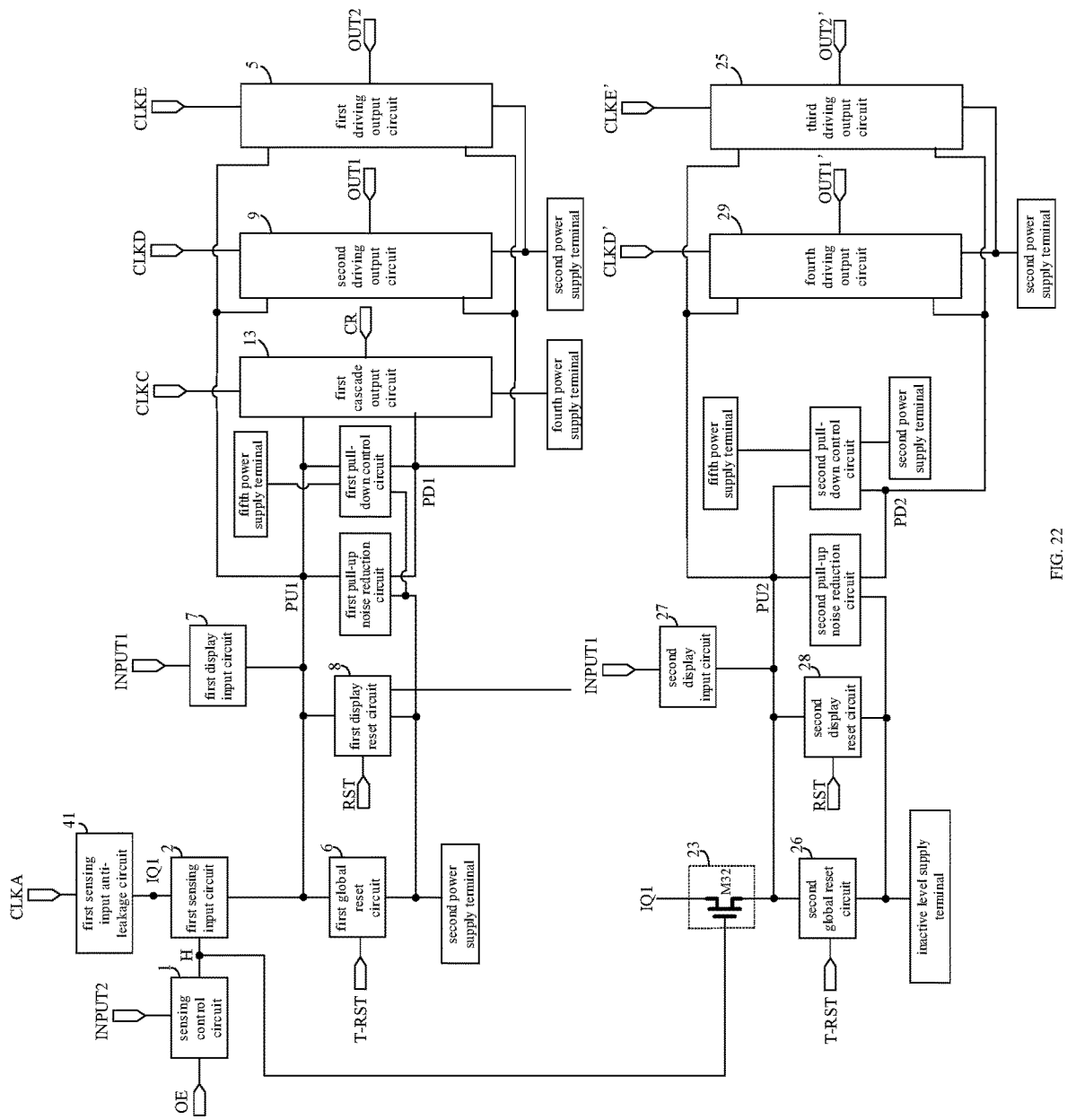
FIG. 22 is a schematic diagram of yet another circuit structure of the shift register unit according to the embodiments of the present disclosure

FIG. 22 is a schematic diagram showing yet another circuit structure of the shift register unit according to the embodiments of the present disclosure. As shown in FIG. 22, as an anti-leakage design for the second sensing input circuit 23, in some embodiments, in a case where a first sensing input anti-leakage circuit 41 (adopting the circuit structure shown in FIG. 7, for example) is configured for the first sensing input circuit 2, the second sensing input circuit 23 is connected to the first sensing input anti-leakage node IQ1, so to be connected to the clock control signal input terminal CLKA through the first sensing input anti-leakage node IQ1 and the first sensing input anti-leakage circuit 41.

That is, the first sensing input circuit 2 and the second sensing input circuit 23 share the same anti-leakage structure, which facilitates simplifying the circuit structure of the shift register unit.

Figure 23:
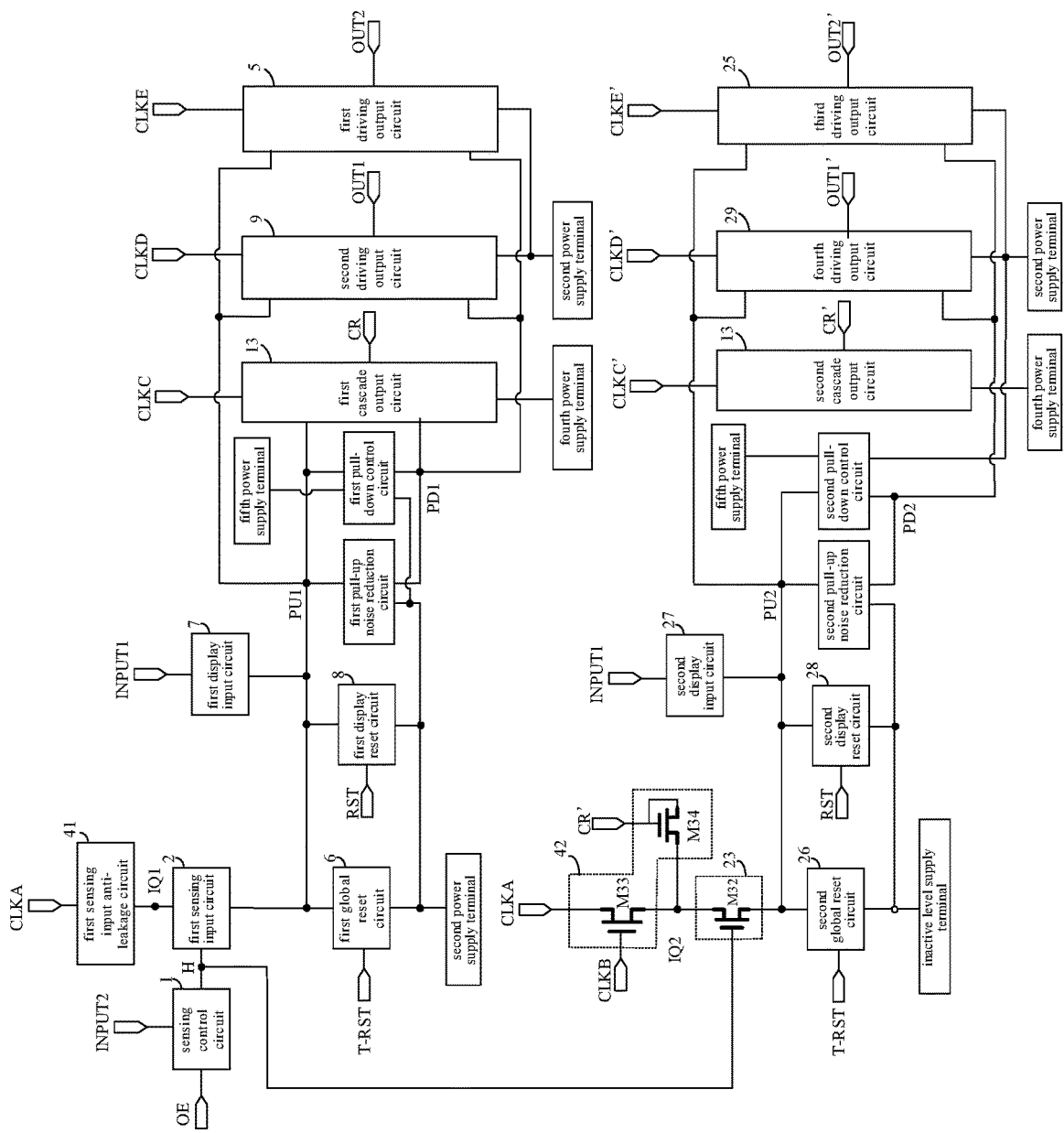
FIG. 23 is a schematic diagram of yet another circuit structure of the shift register unit according to the embodiments of the present disclosure.

FIG. 23 is a schematic diagram showing yet another circuit structure of the shift register unit according to the embodiments of the present disclosure. As shown in FIG. 23, as another anti-leakage design for the second sensing input circuit 23, in some embodiments, the shift register unit includes a second cascade output circuit 22. The second cascade output circuit 22 is connected to the second pull-up node PU2, a second cascade clock signal input terminal CLKC', and a second cascade signal output terminal CR', and is configured to write a signal provided by the second cascade clock signal input terminal CLKC' to the second cascade signal output terminal CR' in response to control of an active level signal at the second pull-up node PU2.

The shift register unit further includes: a second sensing input anti-leakage circuit 42, and the second sensing input circuit 23 is connected to the clock control signal input terminal CLKA through the second sensing input anti-leakage circuit 42, and is connected to the second sensing input anti-leakage circuit 42 at a second sensing input anti-leakage node IQ2.

The second sensing input anti-leakage circuit 42 is connected to the preset input control signal input terminal CLKB and the second cascade signal output terminal CR', and is configured to form a path between the second sensing input anti-leakage node IQ2 and the clock control signal input terminal CLKA in response to control of an active level signal provided by the preset input control signal input terminal CLKB, cut off the path between the second sensing input anti-leakage node IQ2 and the clock control signal input terminal CLKA in response to control of an inactive level signal provided by the preset input control signal input terminal CLKB, and write an active level signal to the second sensing input anti-leakage node IQ2 in response to control of an active level signal provided by the second cascade signal output terminal CR' when the path between the second sensing input anti-leakage node IQ2 and the clock control signal input terminal CLKA is cut off.

In some embodiments, the second sensing input anti-leakage circuit 42 includes: a thirty-third transistor M33 and a thirty-fourth transistor M34.

A control electrode of the thirty-third transistor M33 is connected to the preset input control signal input terminal CLKB, a first electrode of the thirty-third transistor M33 is connected to the clock control signal input terminal CLKA, and a second electrode of the thirty-third transistor M33 is connected to the second sensing input anti-leakage node IQ2.

A control electrode and a first electrode of the thirty-fourth transistor M34 are both connected to the second cascade signal output terminal CR', and a second electrode of the thirty-fourth transistor M34 is connected to the second sensing input anti-leakage node IQ2.

Similarly, in order to improve reliability of the shift register unit in resetting the second pull-up node PU2 in the sensing reset phase t5, in a technical solution of the present disclosure, a second sensing reset circuit 4 is disposed in the shift register unit.

Figure 24:
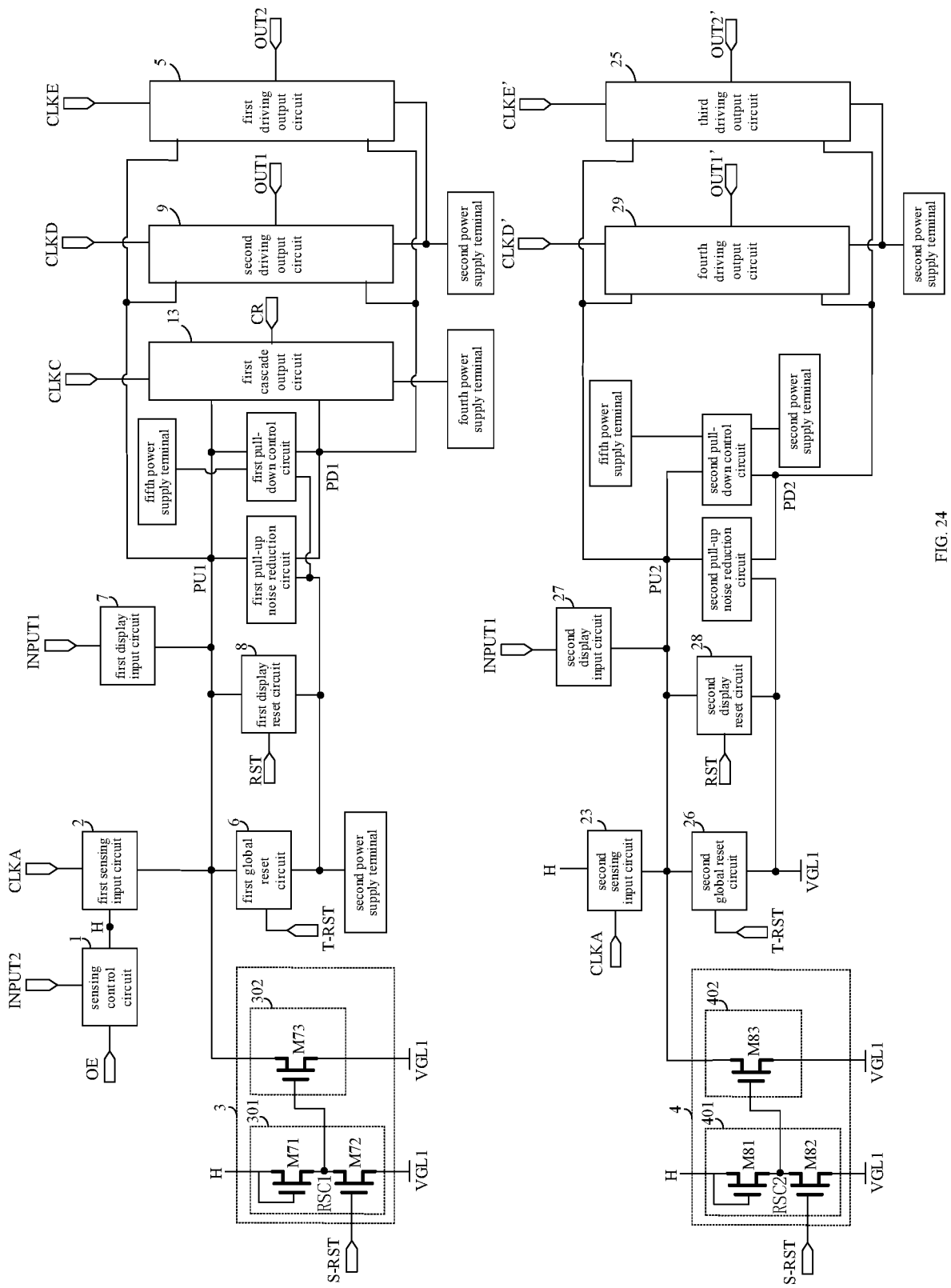
FIG. 24 is a schematic diagram of yet another circuit structure of the shift register unit according to the embodiments of the present disclosure.

FIG. 24 is a schematic diagram showing yet another circuit structure of the shift register unit according to the embodiments of the present disclosure. As shown in FIG. 24, in some embodiments, the shift register unit further includes the second sensing reset circuit 4, and a circuit structure of the second sensing reset circuit needs to correspond to that of the first sensing reset circuit.

With reference to FIG. 24, the first sensing reset circuit 3 includes the first sensing reset control circuit 301 and the first switch circuit 302 (that is, the first sensing reset circuit 3 adopts the circuit structure shown in FIG. 14), and in such case, the second sensing reset circuit 4 includes: a second sensing reset control circuit 401 and a fourth switch circuit 402.

The second sensing reset control circuit 401 is connected to the sensing reset signal input terminal S-RST, the sensing control node H, a second sensing reset control node RSC2, and the second power supply terminal, and is configured to write an active level signal at the sensing control node H to the second sensing reset control node RSC2 in response to control of an inactive level signal provided by the sensing reset signal input terminal S-RST and the active level signal at the sensing control node H.

The fourth switch circuit 402 is connected to the second sensing reset control node RSC2, the second pull-up node PU2, and a second inactive level supply terminal, and is configured to form a path between the second inactive level supply terminal and the second pull-up node PU2 in response to control of an active level signal at the second sensing reset control node RSC2, and cut off the path between the second inactive level supply terminal and the second pull-up node PU2 in response to control of an inactive level signal at the second sensing reset control node RSC2.

That is, in the solution illustrated by FIG. 24, when the sensing reset signal input terminal S-RST provides the inactive level signal and the sensing control node H provides the active level signal, an active level signal can be provided at the second sensing reset control node RSC2, the fourth switch circuit 402 can be turned on, and the inactive level signal from the second inactive level supply terminal can be written to the second pull-up node PU2 through the fourth switch circuit 402 to reset the second pull-up node PU2.

In some embodiments, the second sensing reset control circuit 401 includes: an eighty-first transistor M81 and an eighty-second transistor M82, and the fourth switch circuit 402 includes: an eighty-third transistor M83.

A control electrode and a first electrode of the eighty-first transistor M81 are both connected to the sensing control node H, and a second electrode of the eighty-first transistor M81 is connected to the second sensing reset control node RSC2.

A control electrode of the eighty-second transistor M82 is connected to the sensing reset signal input terminal S-RST, a first electrode of the eighty-second transistor M82 is connected to the second sensing reset control node RSC2, and a second electrode of the eighty-second transistor M82 is connected to the second power supply terminal.

A control electrode of the eighty-third transistor M83 is connected to the second sensing reset control node RSC2, a first electrode of the eighty-third transistor M83 is connected to the second pull-up node PU2, and a second electrode of the eighty-third transistor M83 is connected to the second inactive level supply terminal.

Figure 25:
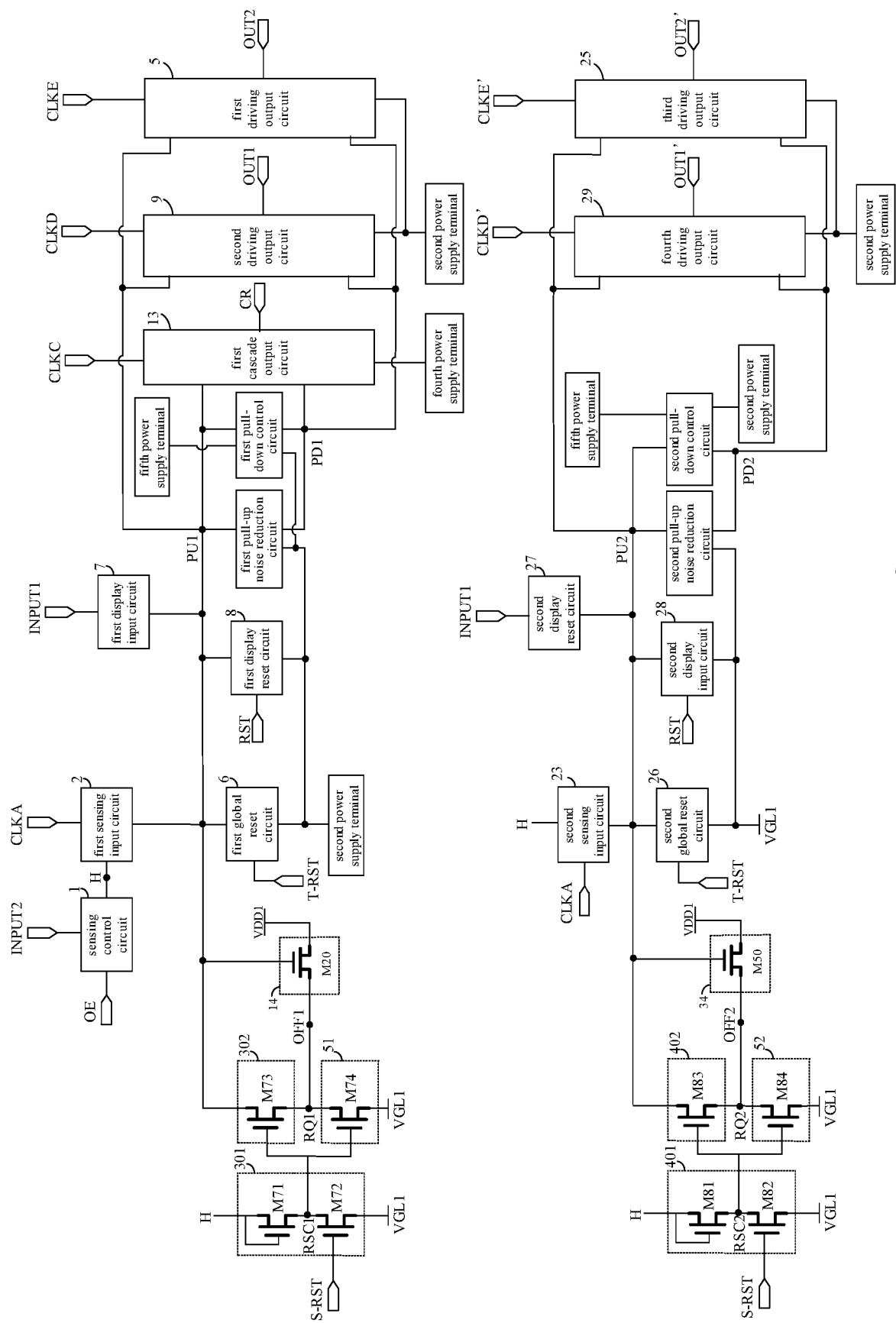
FIG. 25 is a schematic diagram of yet another circuit structure of the shift register unit according to the embodiments of the present disclosure.

FIG. 25 is a schematic diagram showing yet another circuit structure of the shift register unit according to the embodiments of the present disclosure. As shown in FIG. 25, as an anti-leakage design for the second sensing reset circuit 4 shown in FIG. 24, in some embodiments, the shift register unit further includes: a second voltage control circuit 34 and a second sensing reset anti-leakage circuit 52.

In such case, the second inactive level supply terminal is the second power supply terminal, which provides an inactive level signal.

The second voltage control circuit 34 is connected to the third power supply terminal, the second pull-up node PU2, and a second voltage control node OFF2, and is configured to write an active level signal provided by the third power supply terminal to the second voltage control node OFF2 in response to control of an active level signal at the second pull-up node PU2.

The fourth switch circuit 402 is connected to the second power supply terminal through the second sensing reset anti-leakage circuit 52, and is connected to the second sensing reset anti-leakage circuit 52 at a second sensing reset anti-leakage node RQ2, and the second sensing reset anti-leakage node RQ2 is connected to the second voltage control node OFF2.

The second sensing reset anti-leakage circuit 52 is connected to the second sensing reset control node RSC2, and is configured to form a path between the second sensing reset anti-leakage node RQ2 and the second power supply terminal in response to control of an active level signal at the second sensing reset control node RSC2, and cut off the path between the second sensing reset anti-leakage node RQ2 and the second power supply terminal in response to control of an inactive level signal at the second sensing reset control node RSC2.

In some embodiments, a control electrode of a fiftieth transistor M50 is connected to the second pull-up node PU2, a first electrode of the fiftieth transistor M50 is connected to the third power supply terminal, and a second electrode of the fiftieth transistor M50 is connected to the second voltage control node OFF2.

The second sensing reset anti-leakage circuit 52 includes: an eighty-fourth transistor M84. A control electrode of the eighty-fourth transistor M84 is connected to the second sensing reset control node RSC2, a first electrode of the eighty-fourth transistor M84 is connected to the second sensing reset anti-leakage node RQ2, and a second electrode of the eighty-fourth transistor M84 is connected to the second power supply terminal.

Figure 26:
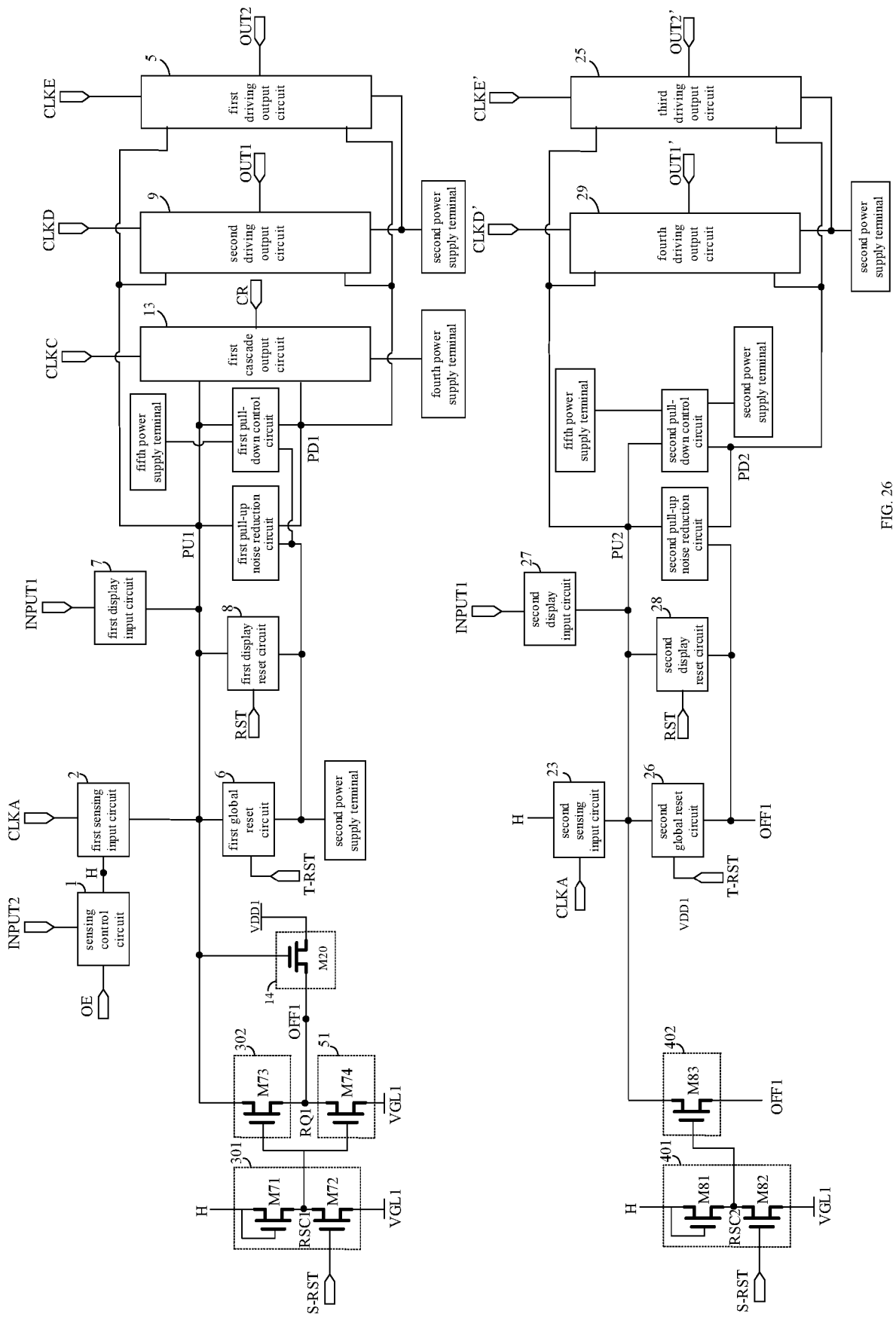
FIG. 26 is a schematic diagram of yet another circuit structure of the shift register unit according to the embodiments of the present disclosure.

FIG. 26 is a schematic diagram showing yet another circuit structure of the shift register unit according to the embodiments of the present disclosure. As shown in FIG. 26, as another anti-leakage design for the second sensing reset circuit 4 shown in FIG. 24, the shift register unit is provided with the foregoing first voltage control circuit 14, and the second inactive level supply terminal is the first voltage control node connected to the first voltage control circuit 14. That is, the fourth switch circuit 402 may share the anti-leakage design with the other structure, which facilitates simplifying the circuit structure.

Figure 27A:
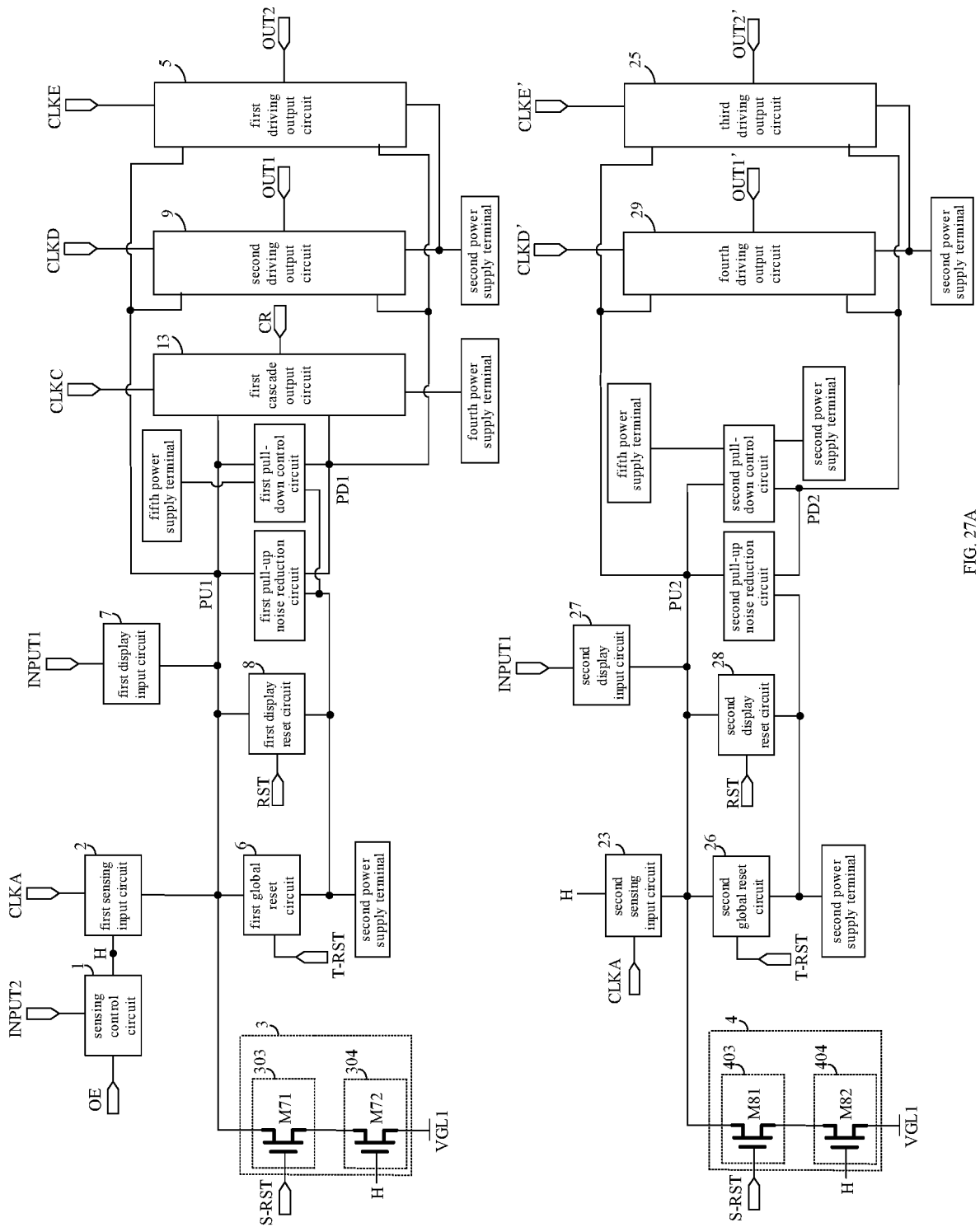
FIG. 27A is a schematic diagram of yet another circuit structure of the shift register unit according to the embodiments of the present disclosure.
Figure 27B:
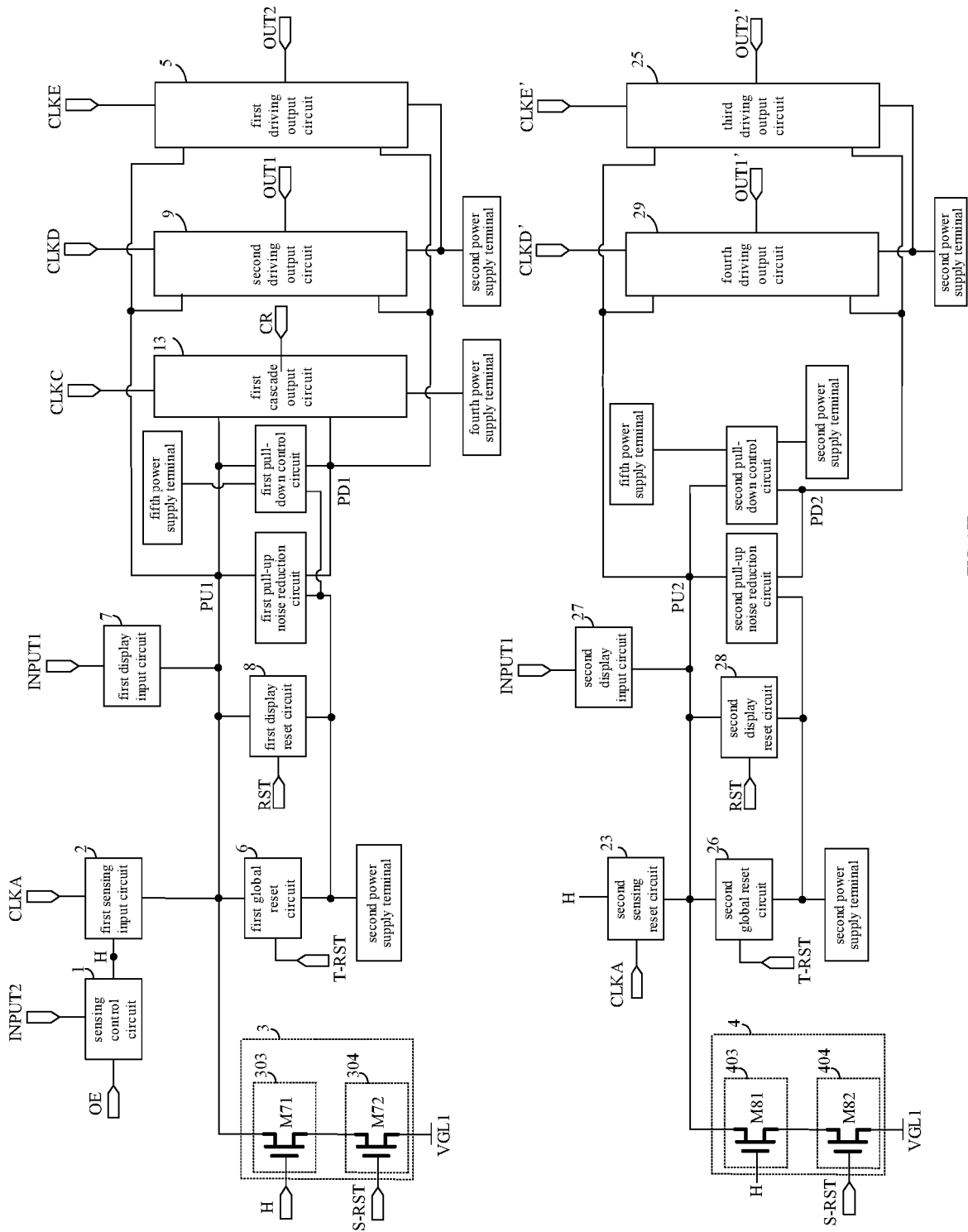
FIG. 27B is a schematic diagram of yet another circuit structure of the shift register unit according to the embodiments of the present disclosure.

FIG. 27A is a schematic diagram showing yet another circuit structure of the shift register unit according to the embodiments of the present disclosure, and FIG. 27B is a schematic diagram showing yet another circuit structure of the shift register unit according to the embodiments of the present disclosure. As shown in FIG. 27A and FIG. 27B, the shift register unit includes a first sensing reset circuit 3 including a second switch circuit 303 and a third switch circuit 304 (that is, the first sensing reset circuit 3 adopts the circuit structures shown in FIG. 17A and FIG. 17B). In such case, the second sensing reset circuit 4 includes: a fifth switch circuit 403 and a sixth switch circuit 404 that are connected in series between the second pull-up node PU2 and the second power supply terminal.

The fifth switch circuit 403 is located between the sixth switch circuit 404 and the second pull-up node PU2.

One of the fifth switch circuit 403 and the sixth switch circuit 404 is connected to the sensing reset signal input terminal S-RST, and the other is connected to the sensing control node H.

The fifth switch circuit 403 and the sixth switch circuit 404 are configured to form a path between the second power supply terminal and the second pull-up node PU2 in response to control of an active level signal provided by the sensing reset signal input terminal S-RST and an active level signal at the sensing control node H, and cut off the path between the second power supply terminal and the second pull-up node PU2 in response to control of a low level signal provided by at least one of the sensing reset signal input terminal S-RST and the sensing control node H.

In some embodiments, the fifth switch circuit 403 includes: an eighty-first transistor M81, and the sixth switch circuit 404 includes: an eighty-second transistor M82. A control electrode of one of the eighty-first transistor M81 and the eighty-second transistor M82 is connected to the sensing reset signal input terminal S-RST, and a control electrode of the other is connected to the sensing control node H; and a first electrode of the eighty-first transistor M81 is connected to the second pull-up node PU2, a second electrode of the eighty-first transistor M81 is connected to a first electrode of the eighty-second transistor M82, and a second electrode of the eighty-second transistor M82 is connected to the second power supply terminal.

Figure 28A:
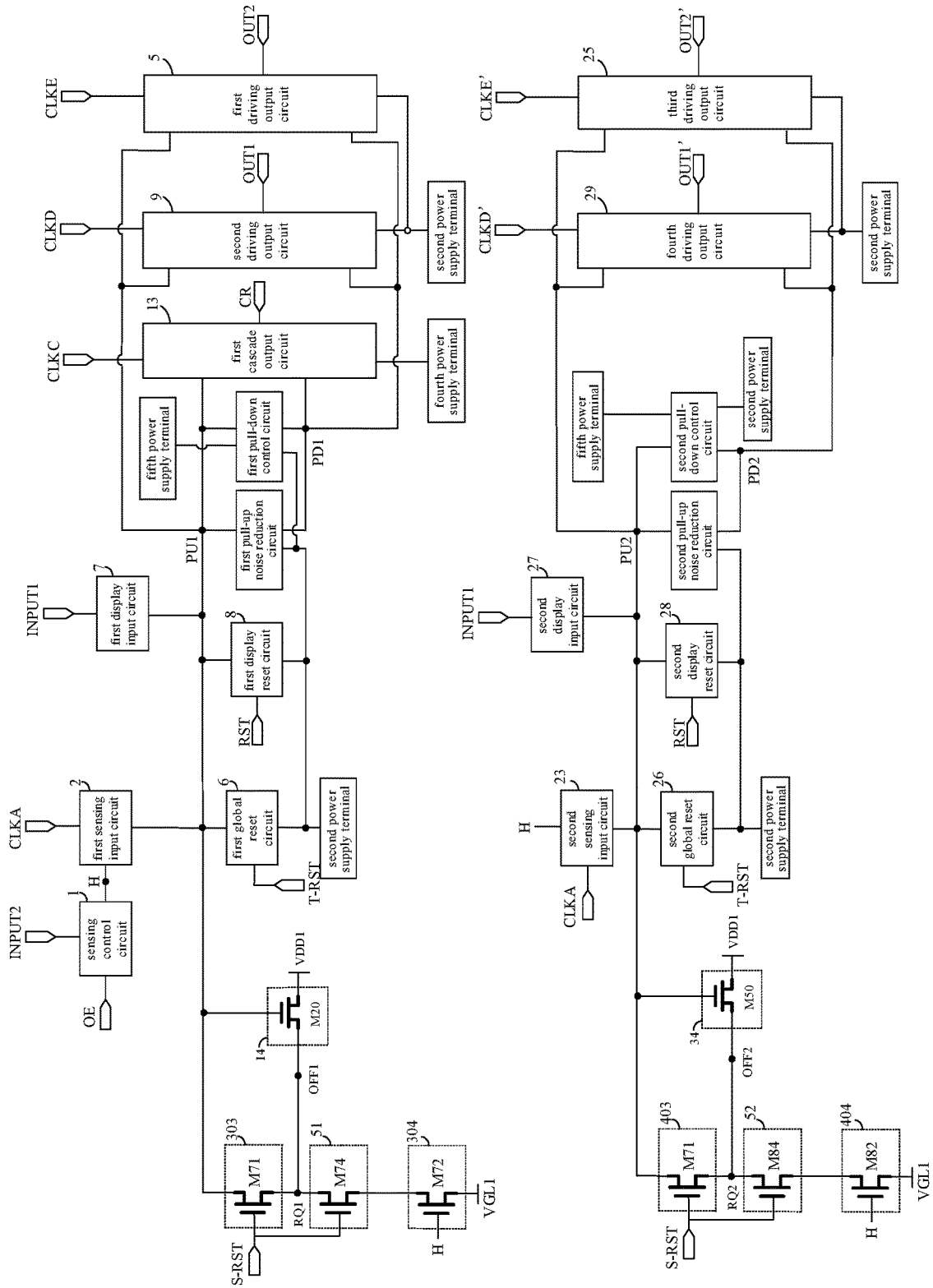
FIG. 28A is a schematic diagram of yet another circuit structure of the shift register unit according to the embodiments of the present disclosure.
Figure 28B:
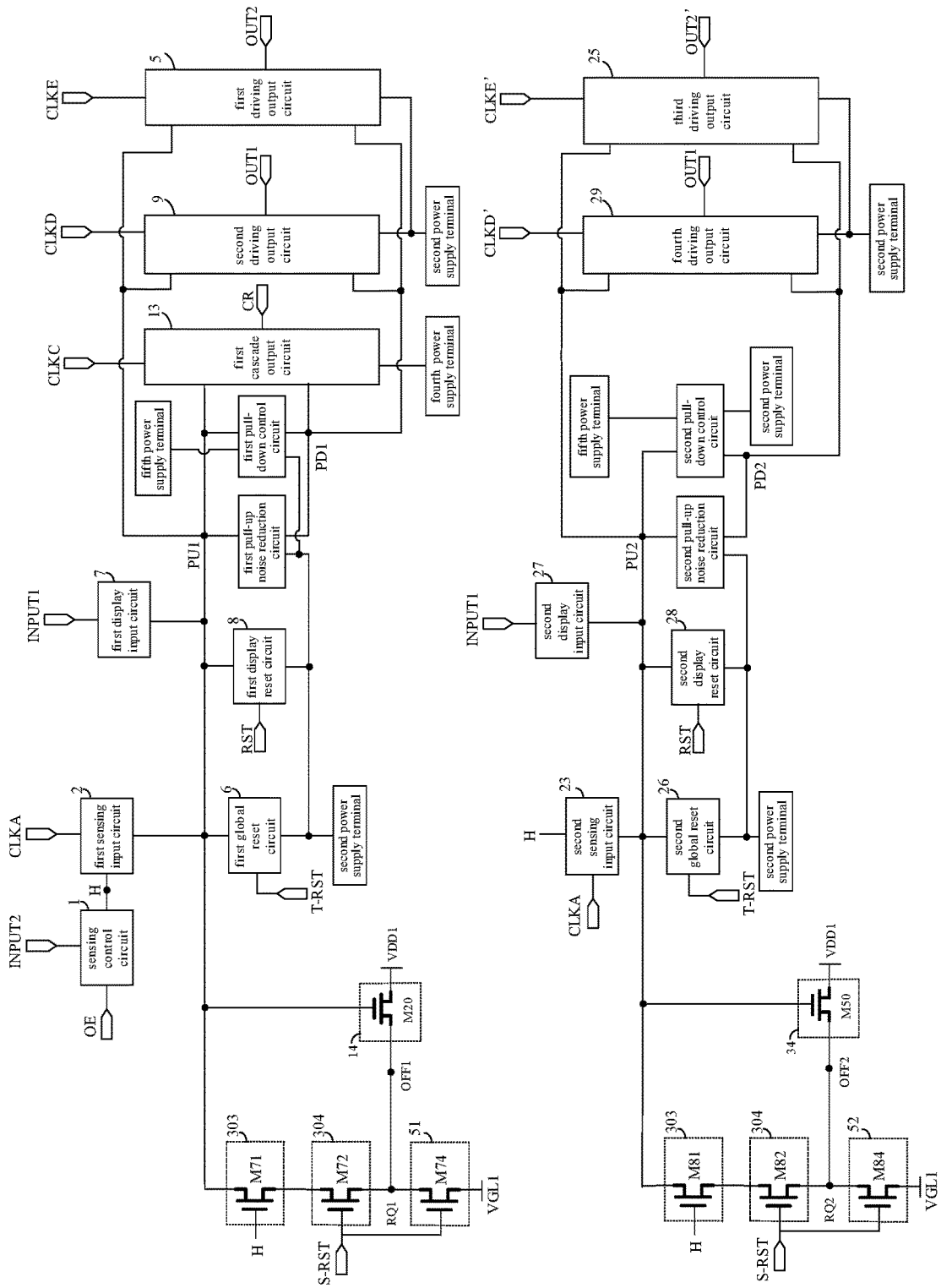
FIG. 28B is a schematic diagram of yet another circuit structure of the shift register unit according to the embodiments of the present disclosure.

FIG. 28A is a schematic diagram showing yet another circuit structure of the shift register unit according to the embodiments of the present disclosure, and FIG. 28B is a schematic diagram showing yet another circuit structure of the shift register unit according to the embodiments of the present disclosure. As still another anti-leakage design for the second sensing reset circuit 4, in some embodiments, the shift register unit further includes: a second voltage control circuit 34 and a second sensing reset anti-leakage circuit 52.

The second voltage control circuit 34 is connected to the third power supply terminal, the second pull-up node PU2, and a second voltage control node OFF2, and is configured to write an active level signal provided by the third power supply terminal to the second voltage control node OFF2 in response to control of an active level signal at the second pull-up node PU2.

As an optional solution, with reference to FIG. 28A, the fifth switch circuit 403 is connected to the sensing reset signal input terminal S-RST, is connected to the sixth switch circuit 404 through the second sensing reset anti-leakage circuit 52, and is connected to the second sensing reset anti-leakage circuit 52 at a second sensing reset anti-leakage node RQ2, and the second sensing reset anti-leakage node RQ2 is connected to the second voltage control node OFF2.

The second sensing reset anti-leakage circuit 52 is connected to the sensing reset signal input terminal S-RST, and is configured to form a path between the second sensing reset anti-leakage node RQ2 and the sixth switch circuit 404 in response to control of an active level signal at the sensing reset signal input terminal S-RST, and cut off the path between the second sensing reset anti-leakage node RQ2 and the sixth switch circuit 404 in response to control of an inactive level signal at the sensing reset signal input terminal S-RST.

As another optional solution, with reference to FIG. 28B, the sixth switch circuit 404 is connected to the sensing reset signal input terminal S-RST, is connected to the second power supply terminal through the second sensing reset anti-leakage circuit 52, and is connected to the second sensing reset anti-leakage circuit 52 at a second sensing reset anti-leakage node RQ2, and the second sensing reset anti-leakage node RQ2 is connected to the second voltage control node OFF2.

The second sensing reset anti-leakage circuit 52 is connected to the sensing reset signal input terminal S-RST, and is configured to form a path between the second sensing reset anti-leakage node RQ2 and the second power supply terminal in response to control of an active level signal at the sensing reset signal input terminal S-RST, and cut off the path between the second sensing reset anti-leakage node RQ2 and the second power supply terminal in response to control of an inactive level signal at the sensing reset signal input terminal S-RST.

In some embodiments, a control electrode of a fiftieth transistor M50 is connected to the second pull-up node PU2, a first electrode of the fiftieth transistor M50 is connected to the third power supply terminal, and a second electrode of the fiftieth transistor M50 is connected to the second voltage control node OFF2.

The second sensing reset anti-leakage circuit 52 includes: an eighty-fourth transistor M84. A control electrode of the eighty-fourth transistor M84 is connected to the sensing reset signal input terminal S-RST, and a first electrode of the eighty-fourth transistor M84 is connected to the second sensing reset anti-leakage node RQ2.

With reference to FIG. 28A, in the case where the fifth switch circuit 403 is connected to the sensing reset signal input terminal S-RST, a second electrode of the eighty-fourth transistor M84 is connected to the third switch circuit.

With reference to FIG. 28B, in the case where the sixth switch circuit 404 is connected to the sensing reset signal input terminal S-RST, a second electrode of the eighty-fourth transistor M84 is connected to the second power supply terminal.

Figure 29:
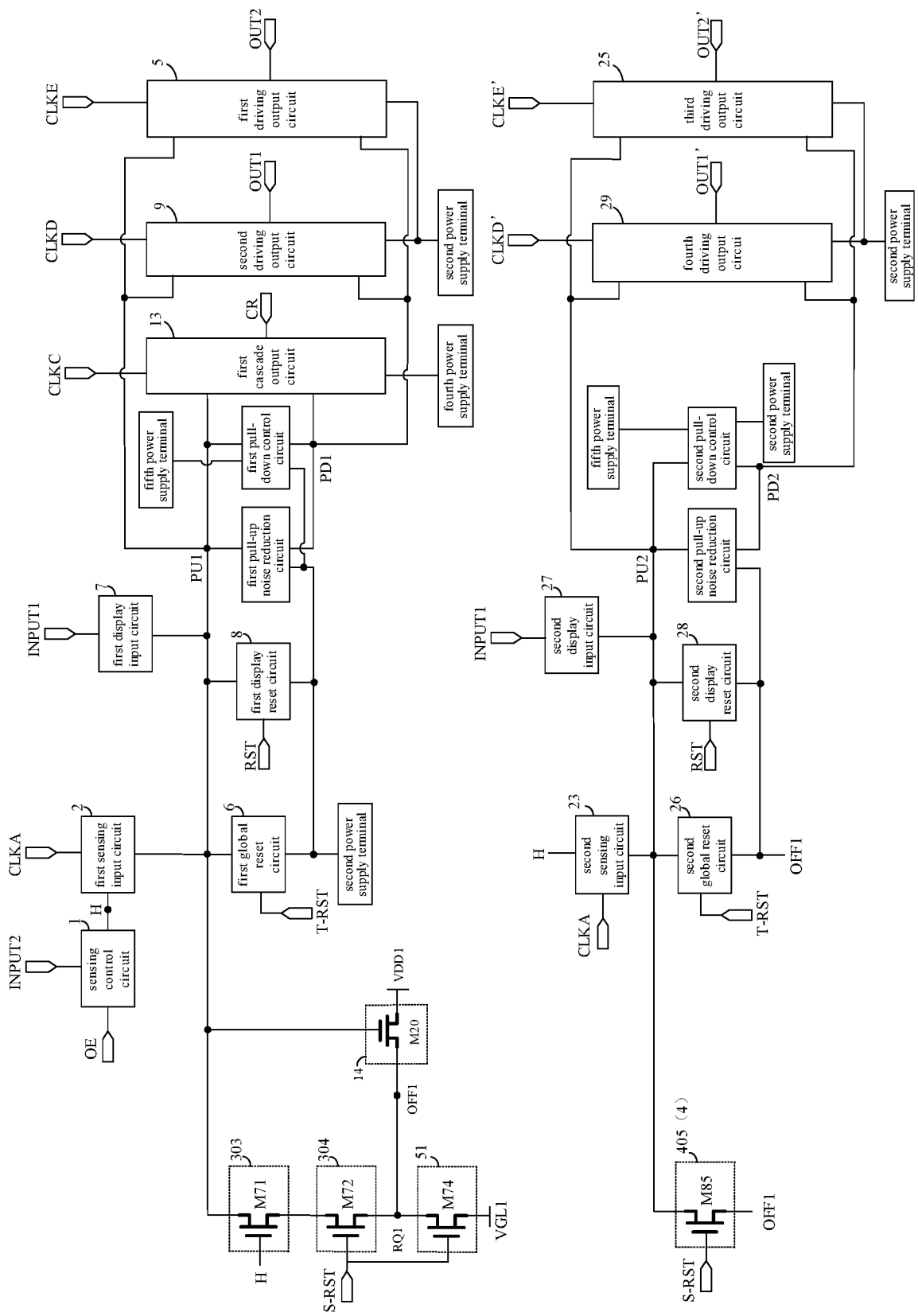
FIG. 29 is a schematic diagram of yet another circuit structure of the shift register unit according to the embodiments of the present disclosure.

FIG. 29 is a schematic diagram showing yet another circuit structure of the shift register unit according to the embodiments of the present disclosure. As shown in FIG. 29, as another solution of the second sensing reset circuit, the shift register unit includes a first sensing reset circuit 3 including a second switch circuit 303 and a third switch circuit 304 (that is, the first sensing reset circuit 3 adopts the circuit structures shown in FIG. 17A and FIG. 17B), and also includes the foregoing first voltage control circuit 14. In such case, the second sensing reset circuit 4 includes: a seventh switch circuit 405.

The seventh switch circuit 405 is connected to the second pull-up node PU2, the sensing reset signal input terminal S-RST, and the first voltage control node OFF1 connected to the first voltage control circuit 4, and is configured to form a path between the second pull-up node PU2 and the first voltage control node OFF1 in response to control of an active level signal provided by the sensing reset signal input terminal S-RST, and cut off the path between the second pull-up node PU2 and the first voltage control node OFF1 in response to control of an inactive level signal provided by the sensing reset signal input terminal S-RST.

In some embodiments, the seventh switch circuit 405 includes: an eighty-fifth transistor M85. A control electrode of the eighty-fifth transistor M85 is connected to the sensing reset signal input terminal S-RST, a first electrode of the eighty-fifth transistor M85 is connected to the second pull-up node PU2, and a second electrode of the eighty-fifth transistor M85 is connected to the first voltage control node OFF1.

In some embodiments, the shift register unit not only includes the second sensing input circuit 23, the second display input circuit 27, the third driving output circuit 25, and the fourth driving output circuit 29 in the above embodiments, but also includes: a second global reset circuit 26, a second display reset circuit 28, a second pull-down control circuit 31, and a second pull-up noise reduction circuit 32.

The second global reset circuit 26 is connected to the global reset signal input terminal T-RST, the inactive level supply terminal, and the second pull-up node PU2, and is configured to write an inactive level signal provided by the inactive level supply terminal to the second pull-up node PU2 in response to control of an active level signal provided by the global reset signal input terminal T-RST.

The second display reset circuit 28 is connected to the display reset signal input terminal RST, the inactive level supply terminal, and the second pull-up node PU2, and is configured to write an inactive level signal provided by the inactive level supply terminal to the second pull-up node PU2 in response to control of an active level signal provided by the display reset signal input terminal RST.

The second pull-down control circuit 31 is connected to the second power supply terminal, a sixth power supply terminal, the second pull-up node PU2, and the second pull-down node PD2, and is configured to write a voltage having a phase opposite to that of the voltage at the second pull-up node PU2 to the second pull-down node PD2. The sixth power supply terminal provides a sixth operating voltage VDDB.

The second pull-up noise reduction circuit 32 is connected to the inactive level supply terminal, the second pull-up node PU2, and the second pull-down node PD2, and is configured to write an inactive level signal provided by the inactive level supply terminal to the second pull-up node PU2 in response to control of an active level signal at the second pull-down node PD2.

In such case, the third driving output circuit 25 is further connected to the second pull-down node PD2 and the fourth power supply terminal, and is further configured to write an inactive level signal provided by the fourth power supply terminal to the third driving signal output terminal in response to control of an active level signal at the second pull-down node PD2.

The fourth driving output circuit 29 is further connected to the second pull-down node PD2 and the fourth power supply terminal, and is further configured to write an inactive level signal provided by the fourth power supply terminal to the fourth driving signal output terminal in response to control of an active level signal at the second pull-down node PD2.

Figure 30:
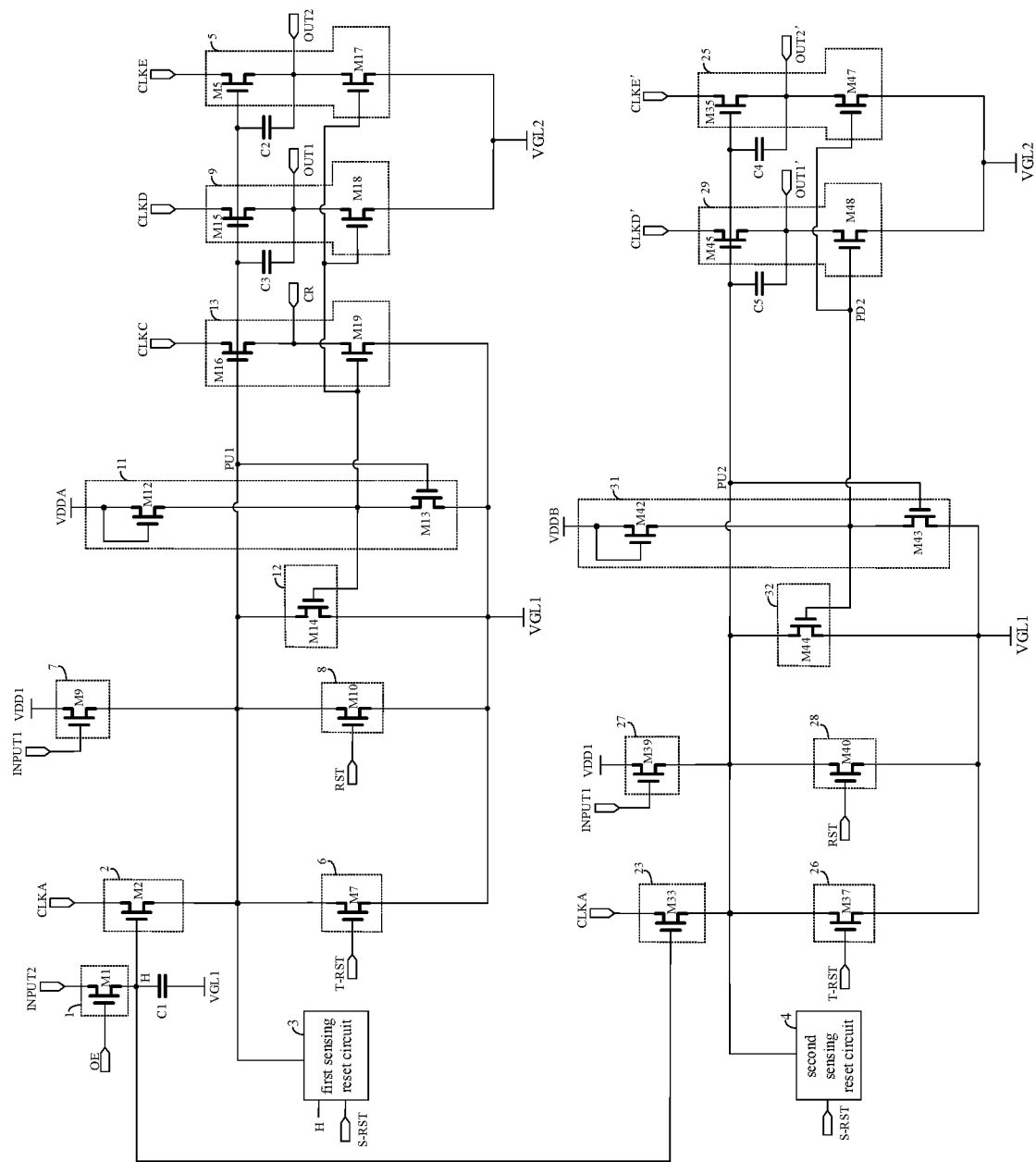
FIG. 30 is a schematic diagram of yet another circuit structure of the shift register unit according to the embodiments of the present disclosure.

FIG. 30 is a schematic diagram showing yet another circuit structure of the shift register unit according to the embodiments of the present disclosure. As shown in FIG. 30, the shift register unit shown in FIG. 30 is a specific implementation based on the shift register unit illustrated above, and specific circuit structures of the sensing control circuit 1, the first sensing input circuit 2, the first driving output circuit 5, the first display input circuit 7, the second driving output circuit 9, the first cascade output circuit 13, the first global reset circuit 6, the first display reset circuit 8, the first pull-down control circuit 11, the first pull-up noise reduction circuit 12, and the second sensing input circuit 23 in these embodiments may refer to those in the content of the above embodiments, and thus will not be repeated here.

In some embodiments, the second display input circuit 27 includes a thirty-ninth transistor M39, a control electrode of the thirty-ninth transistor M39 is connected to the display signal input terminal INPUT1, a first electrode of the thirty-ninth transistor M39 is connected to the third power supply terminal, and a second electrode of the thirty-ninth transistor M39 is connected to the second pull-up node PU2.

The third driving output circuit 25 includes a thirty-fifth transistor M35 and a forty-seventh transistor M47, and the fourth driving output circuit 29 includes a forty-fifth transistor M45 and a forty-eighth transistor M48.

A control electrode of the thirty-fifth transistor M35 is connected to the second pull-up node PU2, a first electrode of the thirty-fifth transistor M35 is connected to the third driving clock signal input terminal CLKE', and a second electrode of the thirty-fifth transistor M35 is connected to the third driving signal output terminal OUT2'.

A control electrode of the forty-seventh transistor M47 is connected to the second pull-down node PD2, a first electrode of the forty-seventh transistor M47 is connected to the third driving signal output terminal OUT2', and a second electrode of the forty-seventh transistor M47 is connected to the fourth power supply terminal.

A control electrode of the forty-fifth transistor M45 is connected to the second pull-up node PU2, a first electrode of the forty-fifth transistor M45 is connected to the fourth driving clock signal input terminal CLKD', and a second electrode of the forty-fifth transistor M45 is connected to the fourth driving signal output terminal OUT1'.

A control electrode of the forty-eighth transistor M48 is connected to the second pull-down node PD2, a first electrode of the forty-eighth transistor M48 is connected to the fourth driving signal output terminal OUT1', and a second electrode of the forty-eighth transistor M48 is connected to the fourth power supply terminal.

In some embodiments, a fourth capacitor C4 and a fifth capacitor C5 are configured for the third driving signal output terminal OUT2' and the fourth driving signal output terminal OUT1', respectively.

In some embodiments, the second global reset circuit 26 includes a thirty-seventh transistor M37, the second display reset circuit 28 includes a fortieth transistor M40, the second pull-down control circuit 31 includes a forty-second transistor M42 and a forty-third transistor M43, and the second pull-up noise reduction circuit 32 includes a forty-fourth transistor M44.

A control electrode of the thirty-seventh transistor M37 is connected to the global reset signal input terminal T-RST, a first electrode of the thirty-seventh transistor M37 is connected to the second pull-up node PU2, and a second electrode of the thirty-seventh transistor M37 is connected to the inactive level supply terminal.

A control electrode of the fortieth transistor M40 is connected to the display reset signal input terminal RST, a first electrode of the fortieth transistor M40 is connected to the second pull-up node PU2, and a second electrode of the fortieth transistor M40 is connected to the inactive level supply terminal.

A control electrode of the forty-second transistor M42 is connected to the sixth power supply terminal, a first electrode of the forty-second transistor M42 is connected to the sixth power supply terminal, and a second electrode of the forty-second transistor M42 is connected to the second pull-down node PD2.

A control electrode of the forty-third transistor M43 is connected to the second pull-up node PU2, a first electrode of the forty-third transistor M43 is connected to the second pull-down node PD2, and a second electrode of the forty-third transistor M43 is connected to the inactive level supply terminal.

A control electrode of the forty-fourth transistor M44 is connected to the second pull-down node PD2, a first electrode of the forty-fourth transistor M44 is connected to the second pull-up node PU2, and a second electrode of the forty-fourth transistor M44 is connected to the inactive level supply terminal.

Figure 31:
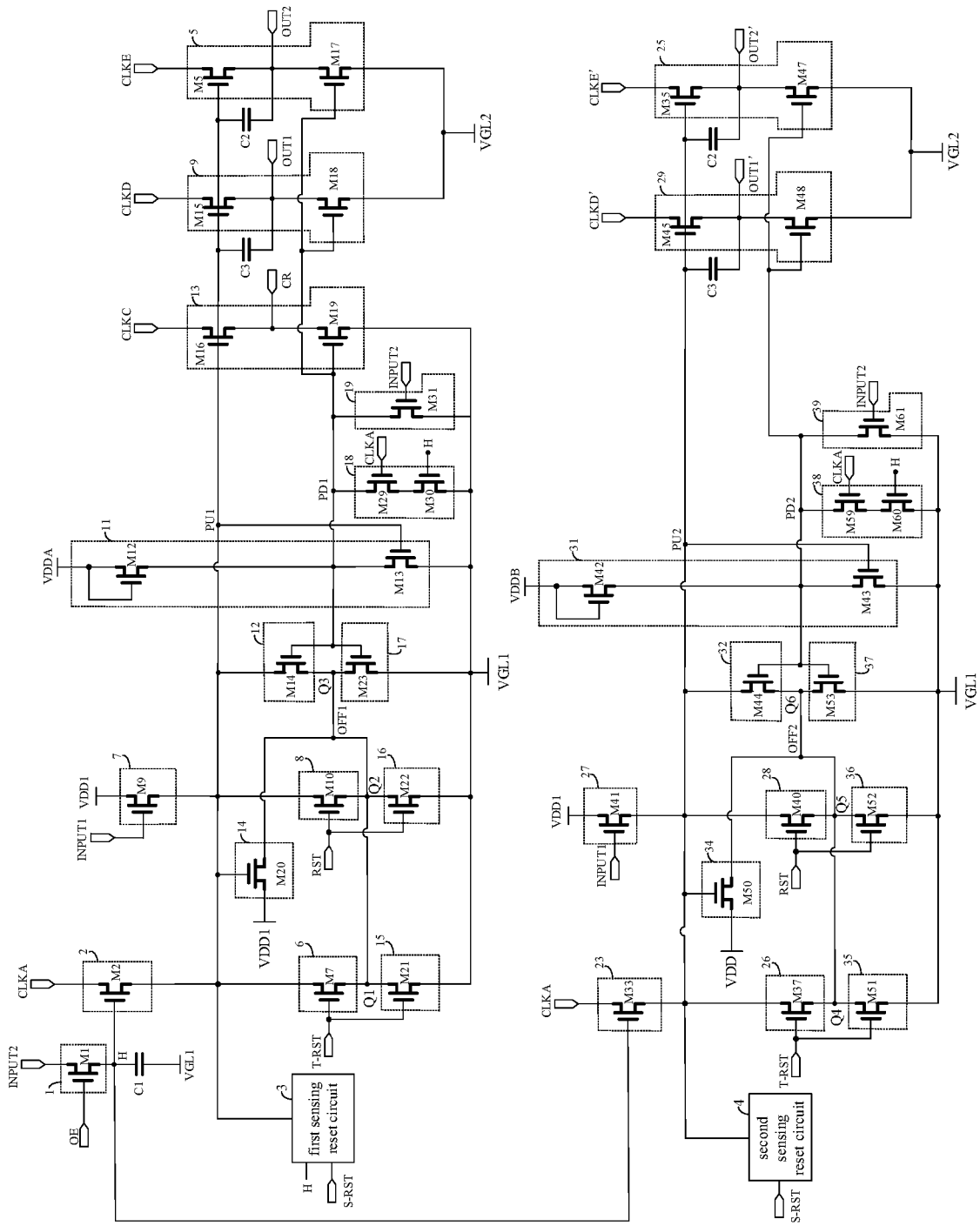
FIG. 31 is a schematic diagram of yet another circuit structure of the shift register unit according to the embodiments of the present disclosure.

FIG. 31 is a schematic diagram showing yet another circuit structure of the shift register unit according to the embodiments of the present disclosure. As shown in FIG. 31, as an anti-leakage design, in some embodiments, a first inactive level supply terminal is the second power supply terminal.

The shift register unit further includes: a second voltage control circuit 34. The second voltage control circuit 34 is connected to the third power supply terminal, the second pull-up node PU2, and a second voltage control node OFF2, and is configured to write an active level signal provided by the third power supply terminal to the second voltage control node OFF2 in response to control of an active level signal at the second pull-up node PU2.

The shift register unit further includes: at least one of a fourth anti-leakage circuit 35, a fifth anti-leakage circuit 36, and a sixth anti-leakage circuit 37.

The second global reset circuit 26 is connected to the second power supply terminal through the fourth anti-leakage circuit 35, and is connected to the fourth anti-leakage circuit 35 at a fourth anti-leakage node Q4, and the fourth anti-leakage node Q4 is connected to the second voltage-control node OFF2. The fourth anti-leakage circuit 35 is connected to the sensing reset signal input terminal T-RST, and is configured to form a path between the fourth anti-leakage node Q4 and the second power supply terminal in response to control of an active level signal provided by the sensing reset signal input terminal T-RST, and cut off the path between the fourth anti-leakage node Q4 and the second power supply terminal in response to control of an inactive level signal provided by the sensing reset signal input terminal T-RST.

The second display reset circuit 28 is connected to the second power supply terminal through the fifth anti-leakage circuit 36, and is connected to the fifth anti-leakage circuit 36 at a fifth anti-leakage node Q5, and the fifth anti-leakage node Q5 is connected to the second voltage control node OFF2. The fifth anti-leakage circuit 36 is connected to the display reset signal input terminal RST, and is configured to form a path between the fifth anti-leakage node Q5 and the second power supply terminal in response to control of an active level signal provided by the display reset signal input terminal RST, and cut off the path between the fifth anti-leakage node Q5 and the second power supply terminal in response to control of an inactive level signal provided by the display reset signal input terminal RST.

The second pull-up noise reduction circuit 32 is connected to the second power supply terminal through the sixth anti-leakage circuit 37, and is connected to the sixth anti-leakage circuit 37 at a sixth anti-leakage node Q6, and the sixth anti-leakage node Q6 is connected to the second voltage control node OFF2. The sixth anti-leakage circuit 37 is connected to the second pull-down node PD2, and is configured to form a path between the sixth anti-leakage node Q6 and the second power supply terminal in response to control of an active level signal at the second pull-down node PD2, and cut off the path between the sixth anti-leakage node Q6 and the second power supply terminal in response to control of an inactive level signal at the second pull-down node PD2.

FIG. 31 illustrates an exemplary case where the shift register unit includes all of the fourth anti-leakage circuit 35, the fifth anti-leakage circuit 36, and the sixth anti-leakage circuit 37. In practical applications, at least one of the fourth anti-leakage circuit 35, the fifth anti-leakage circuit 36, and the sixth anti-leakage circuit 37 may be configured according to actual needs.

In some embodiments, the second voltage control circuit 34 includes a fiftieth transistor M50, a control electrode of the fiftieth transistor M50 is connected to the first pull-up node PU1, a first electrode of the fiftieth transistor M50 is connected to the active level supply terminal, and a second electrode of the fiftieth transistor M50 is connected to the second voltage control node OFF2.

In some embodiments, the fourth anti-leakage circuit 35 includes a fifty-first transistor M51, a control electrode of the fifty-first transistor M51 is connected to the sensing reset signal input terminal T-RST, a first electrode of the fifty-first transistor M51 is connected to the sensing reset circuit and the second voltage control node OFF2, and a second electrode of the fifty-first transistor M51 is connected to the second power supply terminal.

In some embodiments, the fifth anti-leakage circuit 36 includes a fifty-second transistor M52, a control electrode of the fifty-second transistor M52 is connected to the display reset signal input terminal RST, a first electrode of the fifty-second transistor M52 is connected to the display reset circuit and the second voltage control node OFF2, and a second electrode of the fifty-second transistor M52 is connected to the second power supply terminal.

In some embodiments, the sixth anti-leakage circuit 37 includes: a fifty-third transistor M53, a control electrode of the fifty-third transistor M53 is connected to the second pull-down node PD2, a first electrode of the fifty-third transistor M53 is connected to the second pull-down control circuit and the second voltage control node OFF2, and a second electrode of the fifty-third transistor M53 is connected to the second power supply terminal.

Figure 32:
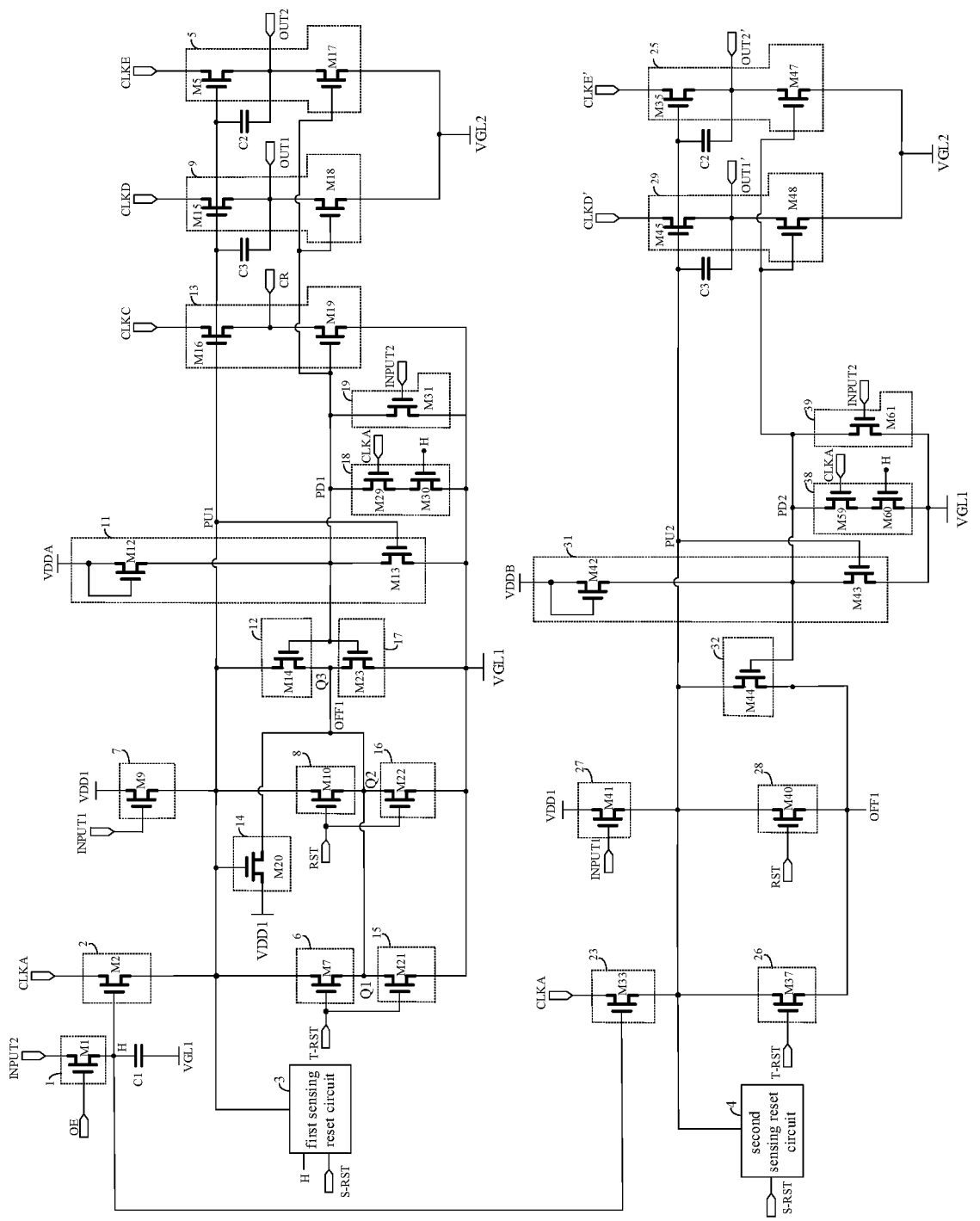
FIG. 32 is a schematic diagram of yet another circuit structure of the shift register unit according to the embodiments of the present disclosure.

FIG. 32 is a schematic diagram showing yet another circuit structure of the shift register unit according to the embodiments of the present disclosure. As shown in FIG. 32, in some embodiments, in a case where the shift register unit includes the first voltage control circuit 14, the inactive level supply terminal is the first voltage control node OFF1.

In such case, leakage prevention of the second global reset circuit 26, the second display reset circuit 28, and the second pull-up noise reduction circuit 32 in the shift register unit can be achieved using the first anti-leakage circuit 15, the second anti-leakage circuit 16, and/or the third anti-leakage circuit 17, and thus there is no need to dispose the fourth anti-leakage circuit 35, the fifth anti-leakage circuit 36, and the sixth anti-leakage circuit 37 in the shift register unit, which facilitates simplifying the circuit structure.

With reference to FIG. 31 and FIG. 32, in some embodiments, the shift register unit further includes a third pull-down noise reduction circuit 38 and/or a fourth pull-down noise reduction circuit 39.

The third pull-down noise reduction circuit 38 is connected to the second pull-down node PD2, the second power supply terminal, the sensing control node H, and the clock control signal input terminal CLKA, and the third pull-down noise reduction circuit 38 is configured to write an inactive level signal provided by the second power supply terminal to the second pull-down node PD2 in response to control of an active level signal at the sensing control node H and an active level signal provided by the clock control signal input terminal CLKA to perform noise reduction on an output voltage of the second pull-down node PD2.

The fourth pull-down noise reduction circuit 39 is connected to the second pull-down node PD2, the second power supply terminal, and the sensing signal input terminal INPUT2, and the fourth pull-down noise reduction circuit 39 is configured to write an inactive level signal provided by the second power supply terminal to the second pull-down node PD2 in response to control of an active level signal provided by the sensing signal input terminal INPUT2 to perform noise reduction on an output voltage of the second pull-down node PD2.

In some embodiments, the third pull-down noise reduction circuit 38 includes a fifty-ninth transistor M59 and a sixtieth transistor M60, and the fourth pull-down noise reduction circuit 39 includes a sixty-first transistor M61.

A control electrode of the fifty-ninth transistor M59 is connected to the clock control signal input terminal CLKA, a first electrode of the fifty-ninth transistor M59 is connected to the second pull-down node PD2, and a second electrode of the fifty-ninth transistor M59 is connected to a first electrode of the sixtieth transistor M60.

A control electrode of the sixtieth transistor M60 is connected to the sensing control node H, and a second electrode of the sixtieth transistor M60 is connected to the second power supply terminal.

A control electrode of the sixty-first transistor M61 is connected to the sensing signal input terminal INPUT2, a first electrode of the sixty-first transistor M61 is connected to the second pull-down node PD2, and a second electrode of the sixty-first transistor M61 is connected to the second power supply terminal.

It should be noted that, in a case where the shift register unit includes the second sensing input circuit 23, the second display input circuit 27, the third driving output circuit 25, and the fourth driving output circuit 29 in the above embodiments, the shift register unit may operate according to the timing shown in any one of FIG. 11, FIG. 12, and FIG. 15.

In addition, new circuit structures of the shift register unit may be obtained by combining parts of the circuit structures in the above embodiments, and should also belong to the scope of the present disclosure.

Figure 33:
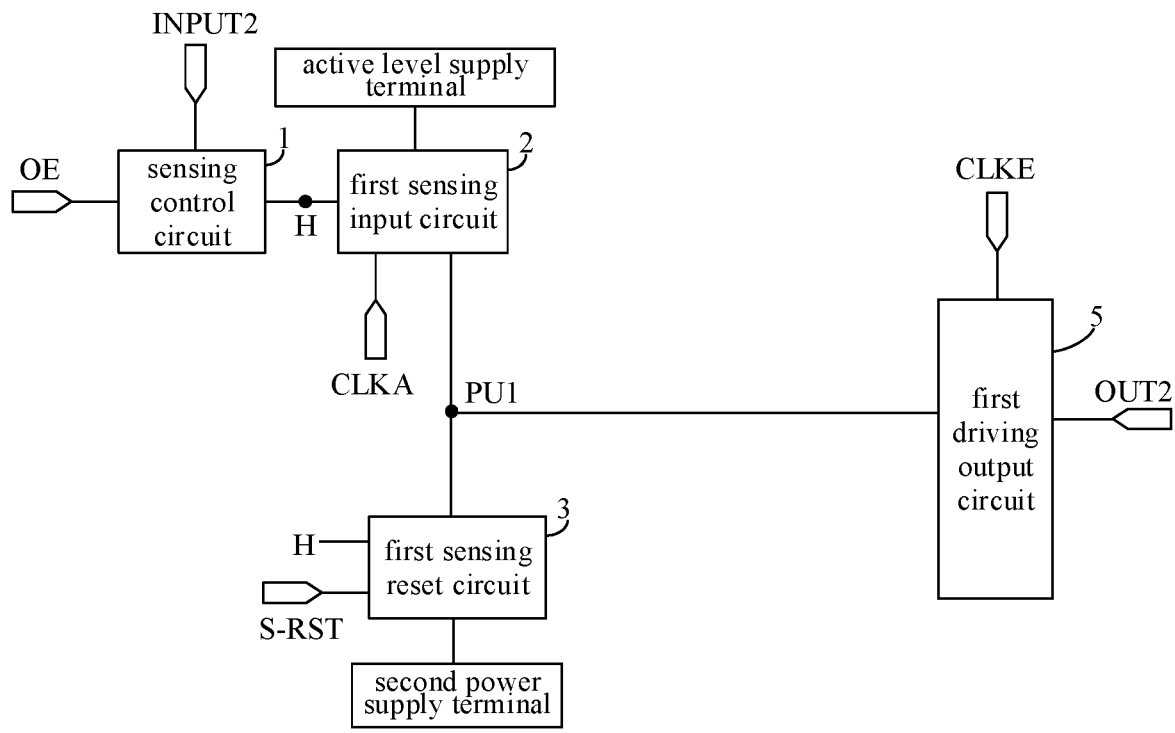
FIG. 33 is a schematic diagram of yet another circuit structure of the shift register unit according to the embodiments of the present disclosure.

FIG. 33 is a schematic diagram of a circuit structure of a shift register unit according to an embodiment of the present disclosure. As shown in FIG. 33, the shift register unit includes: a sensing control circuit 1, a first sensing input circuit 2, a first sensing reset circuit 3, and a first driving output circuit 5

The sensing control circuit 1 is connected to a sensing signal input terminal INPUT2, a random signal input terminal OE, and a sensing control node H, and is configured to write a signal provided by the sensing signal input terminal INPUT2 to the sensing control node H in response to control of an active level signal provided by the random signal input terminal OE.

The first sensing input circuit 2 is connected to an active level supply terminal, a clock control signal input terminal CLKA, the sensing control node H, and a first pull-up node PU1, is controlled by a signal at the sensing control node H and a signal provided by the clock control signal input terminal CLKA, and is configured to write an active level signal provided by the active level supply terminal to the first pull-up node PU1 in response to control of an active level signal at the sensing control node H and an active level signal provided by the clock control signal input terminal CLKA.

The first sensing reset circuit 3 is connected to a sensing reset signal input terminal S-RST, the sensing control node H, the first pull-up node PU1, and a second power supply terminal, and is configured to write an inactive level signal provided by the second power supply terminal to the first pull-up node PU1 in response to control of a signal provided by the sensing reset signal input terminal S-RST and an active level signal at the sensing control node H.

The first driving output circuit 5 is connected to the first pull-up node PU1, a first driving clock signal input terminal CLKE, and a first driving signal output terminal OUT2, and is configured to write a signal provided by the first driving clock signal input terminal CLKE to the first driving signal output terminal OUT2 in response to control of an active level signal at the first pull-up node PU1.

Unlike the first sensing input circuit 2 in the above embodiments, the first sensing input circuit 2 in this embodiment is controlled not only by the sensing control node H but also by the clock control signal input terminal CLKA, and can write the active level signal to the first pull-up node only when the sensing control node H provides the active level signal and the clock control signal input terminal CLKA provides the active level signal.

The shift register unit provided by the embodiment is provided with the first sensing reset circuit 3 that can be used to reset a voltage at the first pull-up node after a sensing output phase is completed. A detailed description of the first sensing reset circuit may refer to that in the content of the above embodiments, and thus will not be repeated here.

Figure 34:
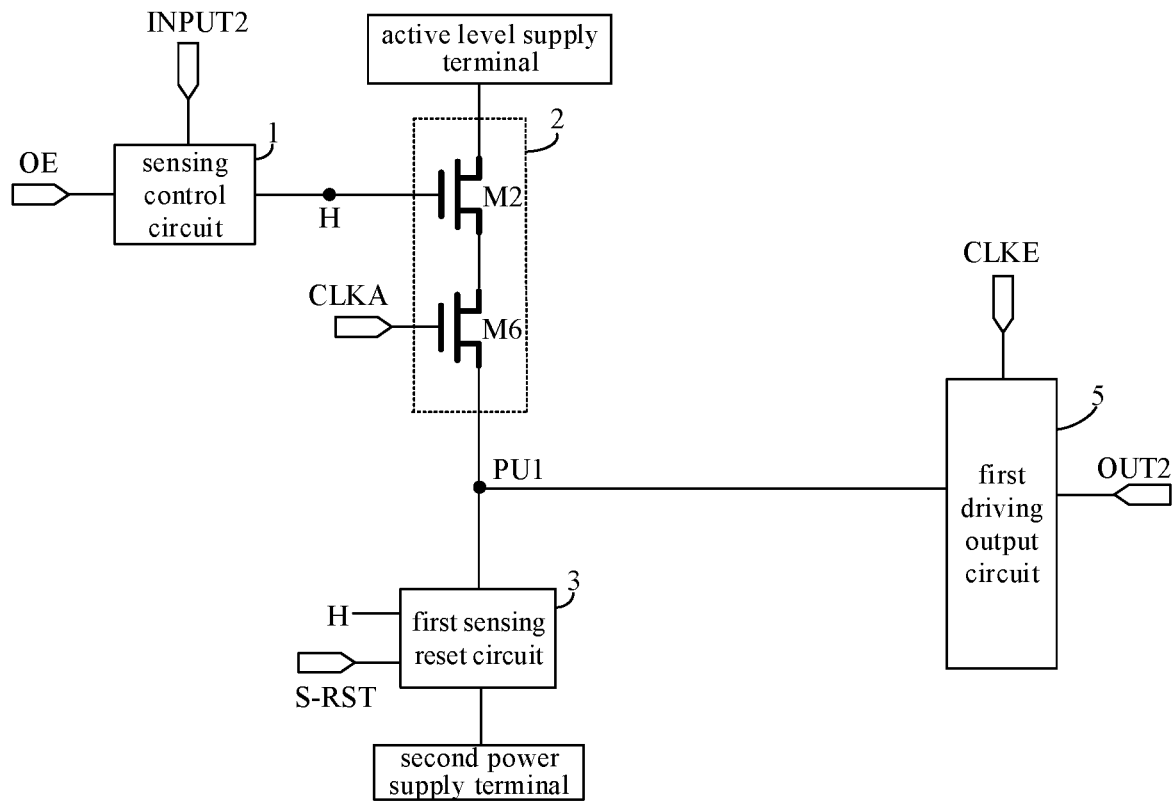
FIG. 34 is a schematic diagram of yet another circuit structure of the shift register unit according to the embodiments of the present disclosure.

FIG. 34 is a schematic diagram showing another circuit structure of the shift register unit according to an embodiment of the present disclosure. As shown in FIG. 34, the shift register unit shown in FIG. 34 is a specific implementation based on the shift register unit shown in FIG. 33. In some embodiments, the first sensing input circuit 2 includes a second transistor M2 and a sixth transistor M6.

A control electrode of the second transistor M2 is connected to the sensing control node H, a first electrode of the second transistor M2 is connected to the active level supply terminal, and a second electrode of the second transistor M2 is connected to a first electrode of the sixth transistor M6.

A control electrode of the sixth transistor M6 is connected to the clock control signal input terminal CLKA, and a second electrode of the sixth transistor M6 is connected to the first pull-up node PU1.

In some embodiments, the active level supply terminal is the clock control signal input terminal CLKA.

It should be noted that, in the embodiments illustrated by FIG. 33 and FIG. 34, the shift register unit may optionally include the following circuits provided by the above embodiments: the first display input circuit 7, the second driving output circuit 9, the first cascade output circuit 13, the first global reset circuit 6, the first display reset circuit 8, the first pull-down control circuit 11, and part or all of the first pull-up noise reduction circuit 12, the first pull-down noise reduction circuit 18, the first voltage control circuit 14, the first anti-leakage circuit 15, the second anti-leakage circuit 16, the third anti-leakage circuit 17, the second pull-down noise reduction circuit 19, the second sensing input circuit 23, the second display input circuit 27, the third driving output circuit 25, the fourth driving output circuit 29, the second cascade output circuit 22, the second sensing reset circuit 4, the second global reset circuit 26, the second display reset circuit 28, the second pull-down control circuit 31, the second pull-up noise reduction circuit 32, the second voltage control circuit 35, the fourth anti-leakage circuit 35, the fifth anti-leakage circuit 36, the sixth anti-leakage circuit 37, the third pull-down noise reduction circuit 38, and the fourth pull-down noise reduction circuit 39; and the combinations of the above circuits are not shown in drawings.

Figure 35:
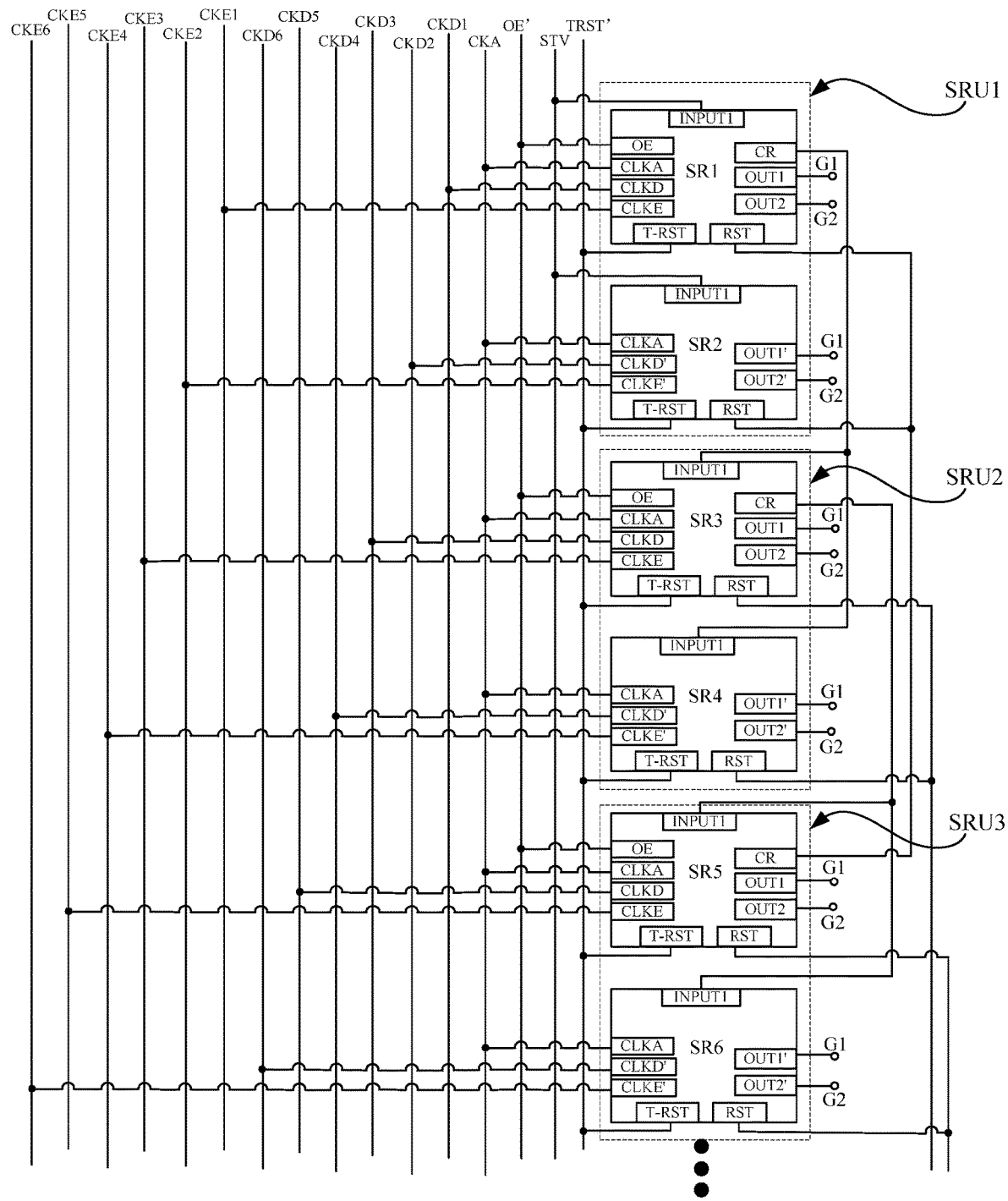
FIG. 35 is a schematic diagram of a circuit structure of a gate driving circuit according to the embodiments of the present disclosure.
Figure 36:
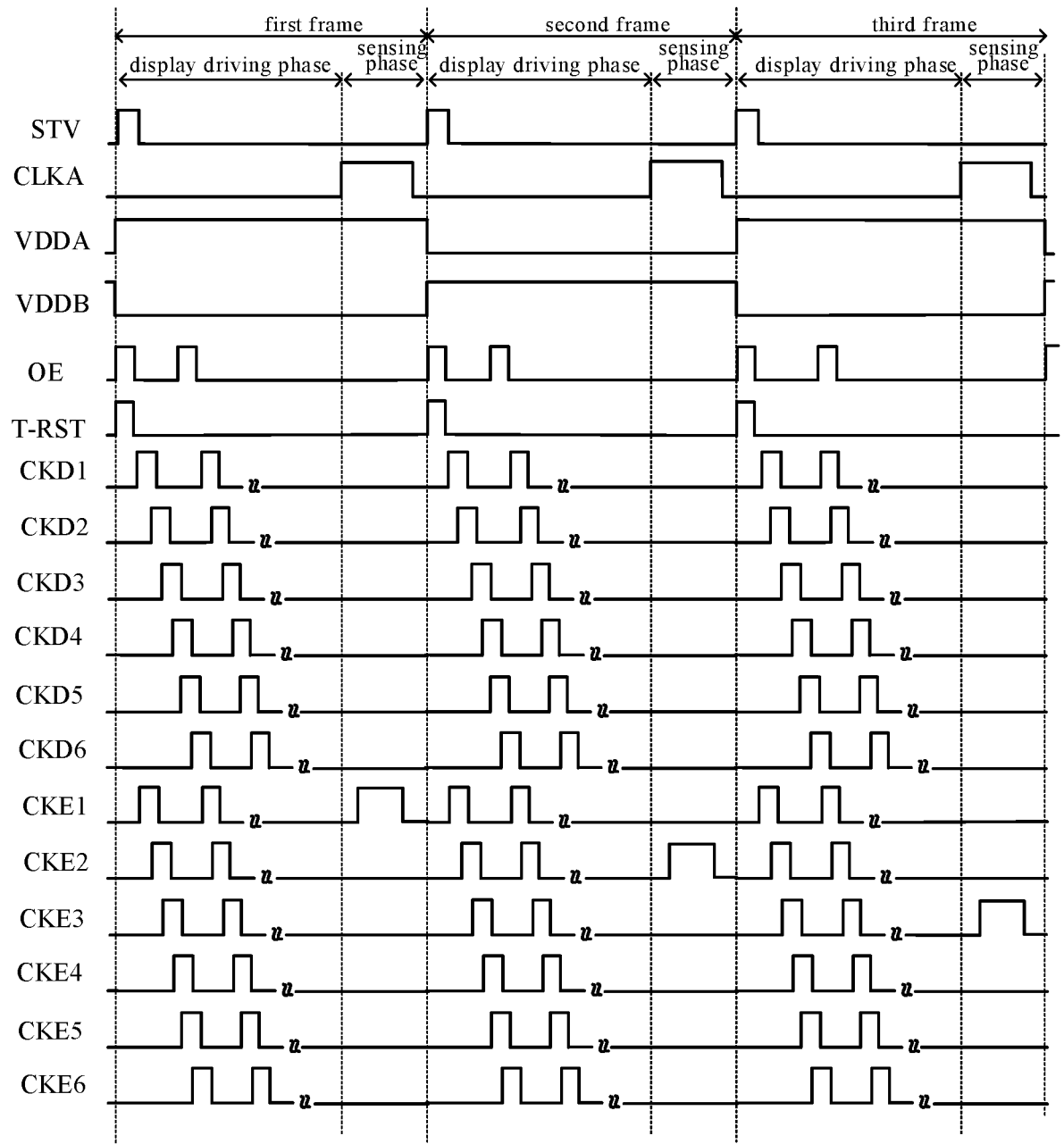
FIG. 36 is a timing diagram of the gate driving circuit shown in FIG. 35.

Based on the same inventive concept, the embodiments of the present disclosure further provide a gate driving circuit. FIG. 35 is a schematic diagram showing a circuit structure of the gate driving circuit according to the embodiments of the present disclosure, and FIG. 36 is a timing diagram of the gate driving circuit shown in FIG. 35. As shown in FIG. 35 and FIG. 36, the gate driving circuit includes a plurality of cascaded shift register units SRU1 to SRU3, each of which may adopt the shift register unit provided by any one of the above embodiments, and a detailed description of the shift register unit may refer to that in the content of the above embodiments, and thus will not be repeated here.

In some embodiments, each of the shift register units SRU1 to SRU3 is configured to drive gate lines corresponding to two rows of pixel units, that is, each of the shift register units SRU1 to SRU3 includes the first driving output circuit 5, the second driving output circuit 9, the third driving output circuit 25, the fourth driving output circuit 29, and the cascade output circuit 13. In such case, the shift register unit SRU1/SRU2/SRU3 in each stage may be regarded as two shift register circuits, for example, the shift register unit SRU1 includes shift register circuits SR1 and SR2, the shift register unit SRU2 includes shift register circuits SR3 and SR4, and the shift register unit SRU3 includes shift register circuits SR5 and SR 6.

In an exemplary embodiment, 2N rows of pixel units are disposed in a display panel, so that N shift register units may be disposed in the gate driving circuit. The N shift register units are cascaded, which may be regarded as 2N shift register circuits being cascaded, the odd-numbered shift register circuit SR(2n−1) is provided with the sensing signal input terminal INPUT2, the random signal input terminal OE, and the first cascade signal output terminal CR, while the even-numbered shift register circuit SR2n is not provided with the sensing signal input terminal INPUT2, the random signal input terminal OE, and the first cascade signal output terminal CR, where 1≤n≤N and N being an integer.

FIG. 35 illustrates a case of three stages of shift register units SRU1 to SRU3 (six stages of shift register circuits SR1 to SR6), but such case is only for the purpose of illustration.

In some embodiments, in each stage of shift register units SRU1 to SRU3, the sensing signal input terminal INPUT2 is connected to the first cascade signal output terminal CR. The clock control signal input terminal CLKA of each stage of shift register units SRU1 to SRU3 is connected to a clock control signal line CKA, the global reset signal input terminal T-RST of each stage of shift register units SRU1 to SRU3 is connected to a global reset signal supply terminal TRST', and the random signal input terminal OE of each stage of shift register units is connected to a random signal input line OE'.

The display signal input terminal INPUT1 of the shift register unit SRU1 in the first stage is connected to a frame start signal input terminal STV, and the display signal input terminal INPUT1 of each of the shift register units in other stages than the first stage is connected to the first cascade signal output terminal CR of the shift register unit in the previous stage; the global reset signal input terminal T-RST of the shift register unit in each stage is connected to the global reset signal supply terminal TRST'; and the display reset signal input terminal RST of the shift register unit in the $N^{th}$ stage and the display reset signal input terminal RST of the shift register unit in the $(N-1)^{th}$ stage are connected to a frame end reset signal line, and the display reset signal input terminal RST of each of the shift register units in other stages than the $N^{th}$ and $(N-1)^{th}$ stages is connected to the first cascade signal output terminals CR of the shift register unit in a stage after the next stage.

Apparently, a specific cascading mode may be adjusted according to actual needs in practical applications.

In some embodiments, the global reset signal supply terminal TRST' and the frame start signal input terminal STV are the same terminal, that is, the global reset signal input terminals T-RST of the shift register units in all stages are connected to the frame start signal input terminal STV. Reference may be made to the description of the related content in the above embodiments for detail.

In some embodiments, six first driving clock signal lines CKE1 to CKE6 and six second driving clock signal lines CKD1 to CKD6 are provided for the gate driving circuit.

The first driving clock signal input terminal CLKE of the shift register unit SRU(3i+1) in the (3i+1) th stage is connected to the first driving clock signal line CKE1, the second driving clock signal input terminal CLKD of the shift register unit SRU(3i+1) in the $(3i+1)^{th}$ stage is connected to the second driving clock signal line CKD1, the third driving clock signal input terminal CLKE' of the shift register unit SRU(3i+1) in the $(3i+1)^{th}$ stage is connected to the first driving clock signal line CKE2, the fourth driving clock signal input terminal CLKD' of the shift register unit SRU (3i+1) in the $(3i+1)^{th}$ stage is connected to the second driving clock signal line CKD2, and the cascade clock signal input terminal (not shown in FIG. 35) of the shift register unit SRU(3i+1) in the $(3i+1)^{th}$ stage is connected to the second driving clock signal line CKD2.

The first driving clock signal input terminal CLKE of the shift register unit SRU(3i+2) in the $(3i+2)^{th}$ stage is connected to the first driving clock signal line CKE3, the second driving clock signal input terminal CLKD of the shift register unit SRU(3i+2) in the $(3i+2)^{th}$ stage is connected to the second driving clock signal line CKD3, the third driving clock signal input terminal CLKE' of the shift register unit SRU(3i+2) in the $(3i+2)^{th}$ stage is connected to the first driving clock signal line CKE4, the fourth driving clock signal input terminal CLKD' of the shift register unit SRU (3i+2) in the $(3i+2)^{th}$ stage is connected to the second driving clock signal line CKD4, and the cascade clock signal input terminal (not shown in FIG. 35) of the shift register unit SRU(3i+2) in the $(3i+2)^{th}$ stage is connected to the second driving clock signal line CKD4.

The first driving clock signal input terminal CLKE of the shift register unit SRU(3i+3) in the $(3i+3)^{th}$ stage is connected to the first driving clock signal line CKE5, the second driving clock signal input terminal CLKD of the shift register unit SRU(3i+3) in the $(3i+3)^{th}$ stage is connected to the second driving clock signal line CKD5, the third driving clock signal input terminal CLKE' of the shift register unit SRU(3i+3) in the (3i+3) th stage is connected to the first driving clock signal line CKE6, the fourth driving clock signal input terminal CLKD' of the shift register unit SRU (3i+3) in the $(3i+3)^{th}$ stage is connected to the second driving clock signal line CKD6, and the cascade clock signal input terminal (not shown in FIG. 35) of the shift register unit SRU(3i+3) in the $(3i+3)^{th}$ stage is connected to the second driving clock signal line CKD6. Here, i is a positive integer and 3i+3≤N.

Apparently, in the embodiments of the present disclosure, the cascading of the shift register units may be implemented by adopting other cascading solutions.

Based on the same inventive concept, the embodiments of the present disclosure further provide a display panel, including the gate driving circuit provided by the above embodiments, and a detailed description of the gate driving circuit may refer to that in the content of the above embodiments, and thus will not be repeated here.

In some embodiments, the gate driving circuit is formed on an array substrate of the display panel by way of GOA.

Based on the same inventive concept, the embodiments of the present disclosure further provide a display device, including the display panel provided by the above embodiments, and a detailed description of the display panel may refer to that in the content of the above embodiments, and thus will not be repeated here.

The display device provided by the embodiments of the present disclosure may be any product or component with a display function, such as a liquid crystal display screen, a wearable device, a mobile phone, a tablet personal computer, a television, a display, a notebook computer, a digital photo frame, or a navigator. The inclusion of other essential components of the display device should be understood by those of ordinary skill in the art, will not be described here, and should not be considered as a limitation to the present disclosure.

Figure 37:
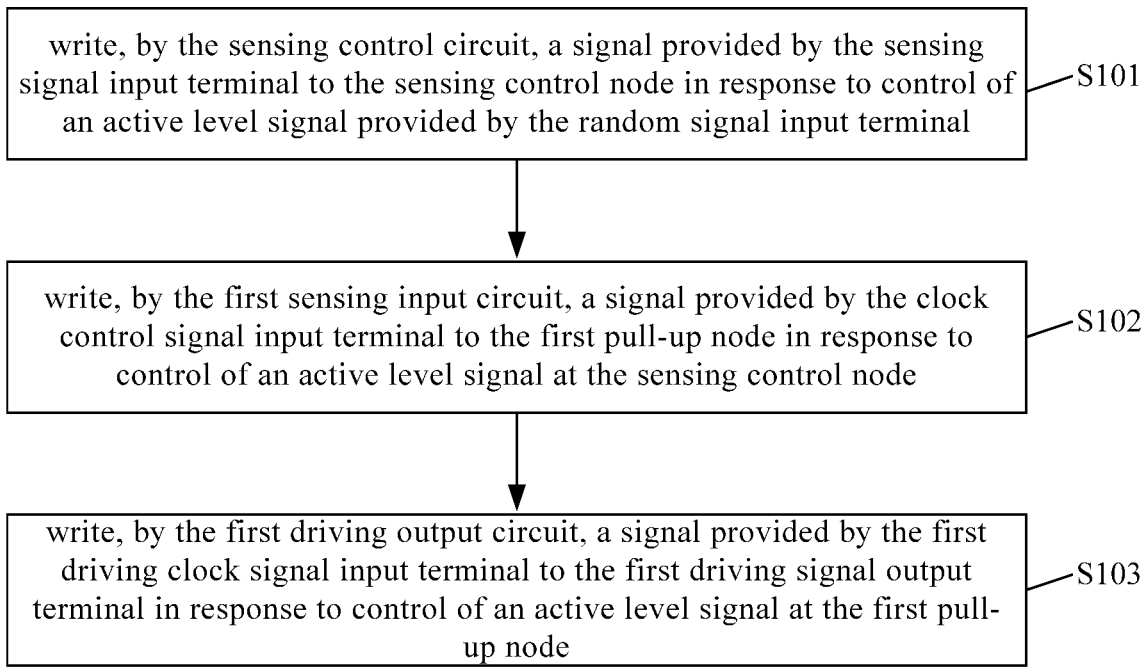
FIG. 37 is a flowchart illustrating a gate driving method according to the embodiments of the present disclosure.

Based on the same inventive concept, the embodiments of the present disclosure further provide a gate driving method. The gate driving method is based on the shift register unit provided by the above embodiments, and a detailed description of the shift register unit may refer to that in the content of the above embodiments, and thus will not be repeated here. FIG. 37 is a flowchart illustrating the gate driving method according to the embodiments of the present disclosure. As shown in FIG. 37, the gate driving method includes:

step S101, writing, by the sensing control circuit, a signal provided by the sensing signal input terminal to the sensing control node in response to control of an active level signal provided by the random signal input terminal;

step S102, writing, by the first sensing input circuit, a signal provided by the clock control signal input terminal to the first pull-up node in response to control of an active level signal at the sensing control node; and step S103, writing, by the first driving output circuit, a signal provided by the first driving clock signal input terminal to the first driving signal output terminal in response to control of an active level signal at the first pull-up node.

A detailed description of the above steps S101 to S103 may refer to the content of the above embodiments, and thus will not be repeated here.

Figure 38:
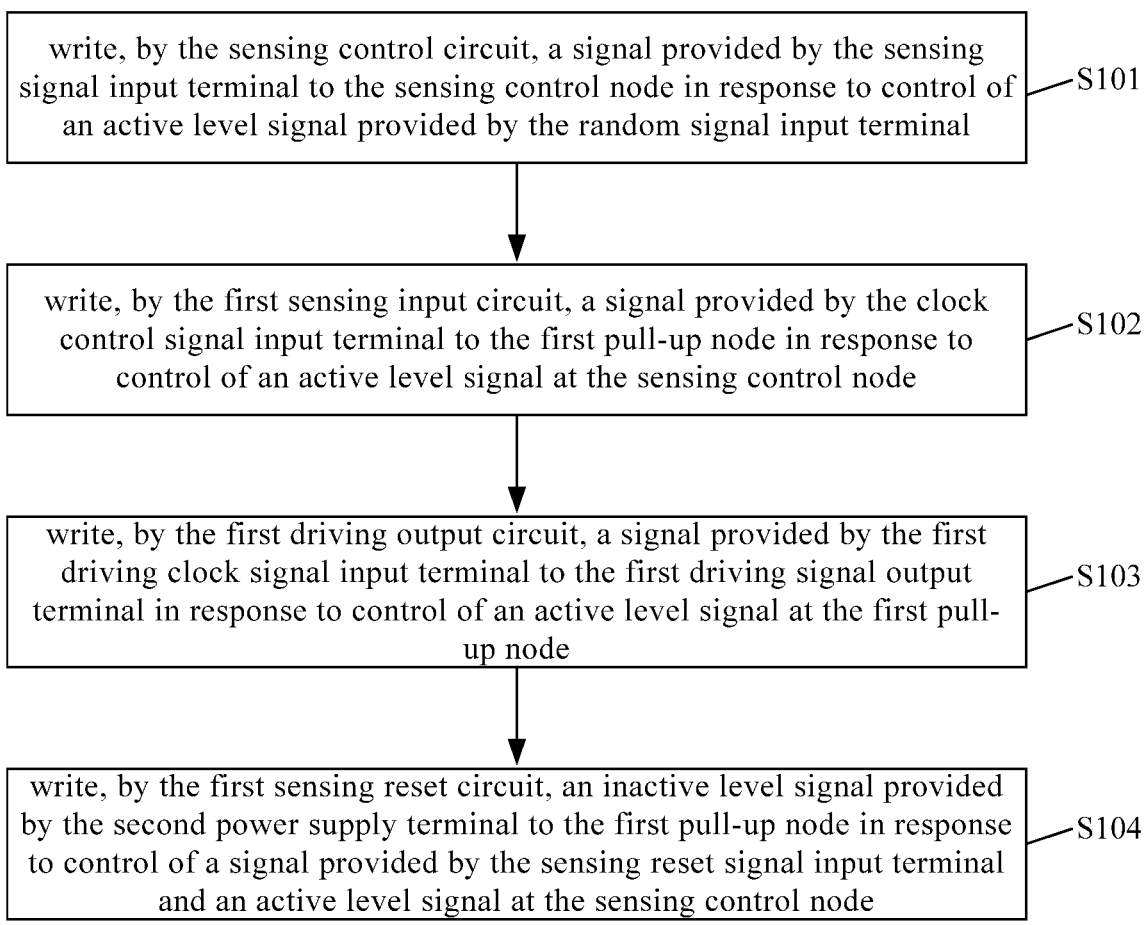
FIG. 38 is a flowchart illustrating another gate driving method according to the embodiments of the present disclosure.

FIG. 38 is a flowchart illustrating another gate driving method according to the embodiments of the present disclosure. As shown in FIG. 38, in addition to the steps S101 to S103, the gate driving method further includes step S104 after the step S103.

In the step S104, the first sensing reset circuit writes an inactive level signal provided by the second power supply terminal to the first pull-up node in response to control of a signal provided by the sensing reset signal input terminal and an active level signal at the sensing control node.

With the step S104, the voltage at the first pull-up node can be reset by the first sensing reset circuit after the sensing output phase is completed.

Figure 39:
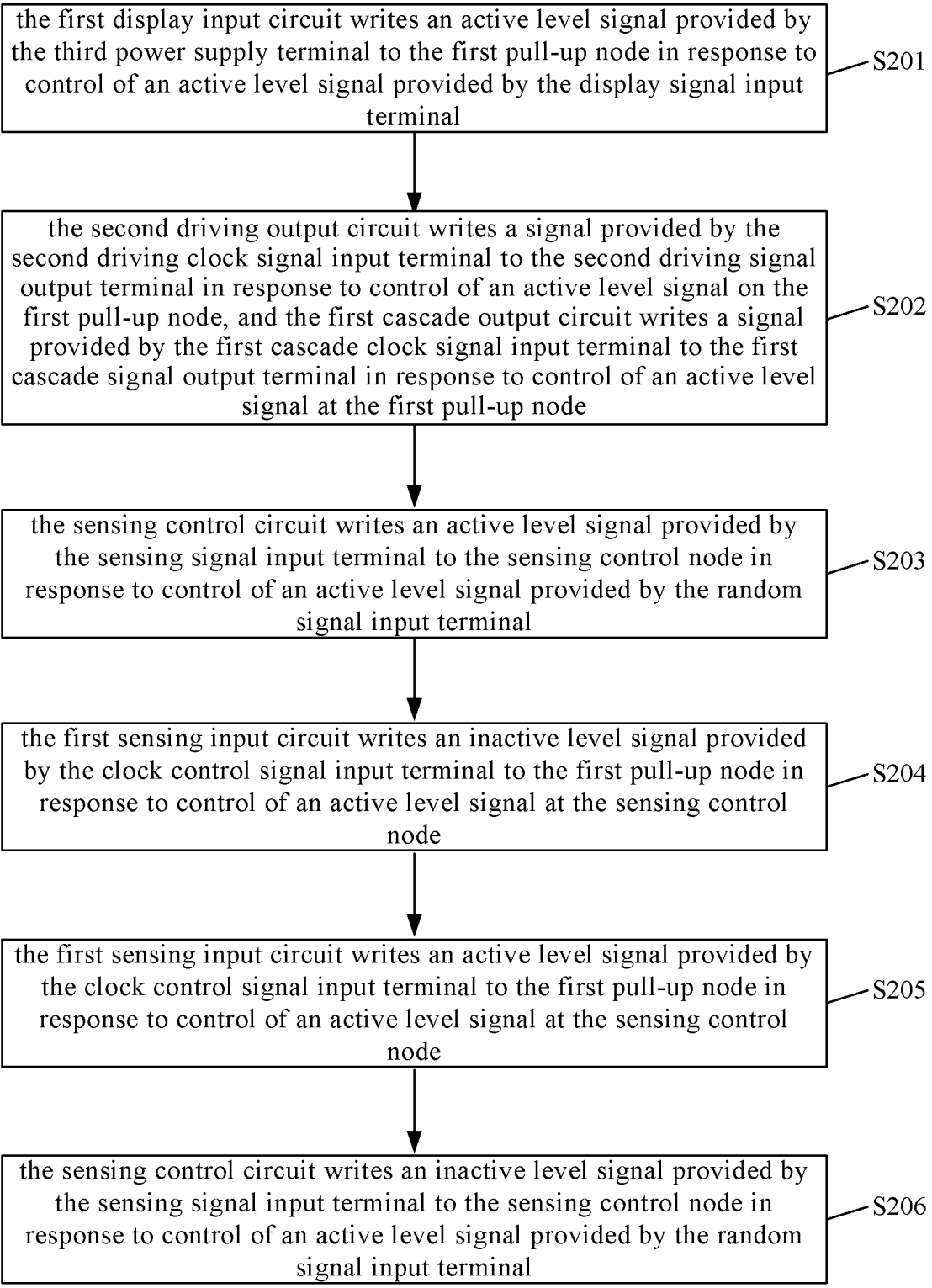
FIG. 39 is a flowchart illustrating still another gate driving method according to the embodiments of the present disclosure.

FIG. 39 is a flowchart illustrating still another gate driving method according to the embodiments of the present disclosure. As shown in FIG. 39, in some embodiments, the shift register unit is provided with the first display input circuit, the second driving output circuit, and the first cascade output circuit, and the gate driving method includes steps S201 to S206.

In the step S201, the first display input circuit writes an active level signal provided by the third power supply terminal to the first pull-up node in response to control of an active level signal provided by the display signal input terminal.

In the step S202, the second driving output circuit writes a signal provided by the second driving clock signal input terminal to the second driving signal output terminal in response to control of an active level signal at the first pull-up node, and the first cascade output circuit writes a signal provided by the first cascade clock signal input terminal to the first cascade signal output terminal in response to control of an active level signal at the first pull-up node.

In the step S203, the sensing control circuit writes an active level signal provided by the sensing signal input terminal to the sensing control node in response to control of an active level signal provided by the random signal input terminal.

In the step S204, the first sensing input circuit writes an inactive level signal provided by the clock control signal input terminal to the first pull-up node in response to control of an active level signal at the sensing control node.

The step S204 and the step S203 start simultaneously, and the step S204 ends at a start moment of the sensing output phase.

In the step S205, the first sensing input circuit writes an active level signal provided by the clock control signal input terminal to the first pull-up node in response to control of an active level signal at the sensing control node.

The step S205 is performed in the sensing output phase.

In the step S206, the sensing control circuit writes an inactive level signal provided by the sensing signal input terminal to the sensing control node in response to control of an active level signal provided by the random signal input terminal.

The step S206 is performed after the sensing output phase ends.

Reference may be made to the relevant description of the operating timing shown in FIG. 11 for a detailed description of the steps S201 to S206.

Figure 40:
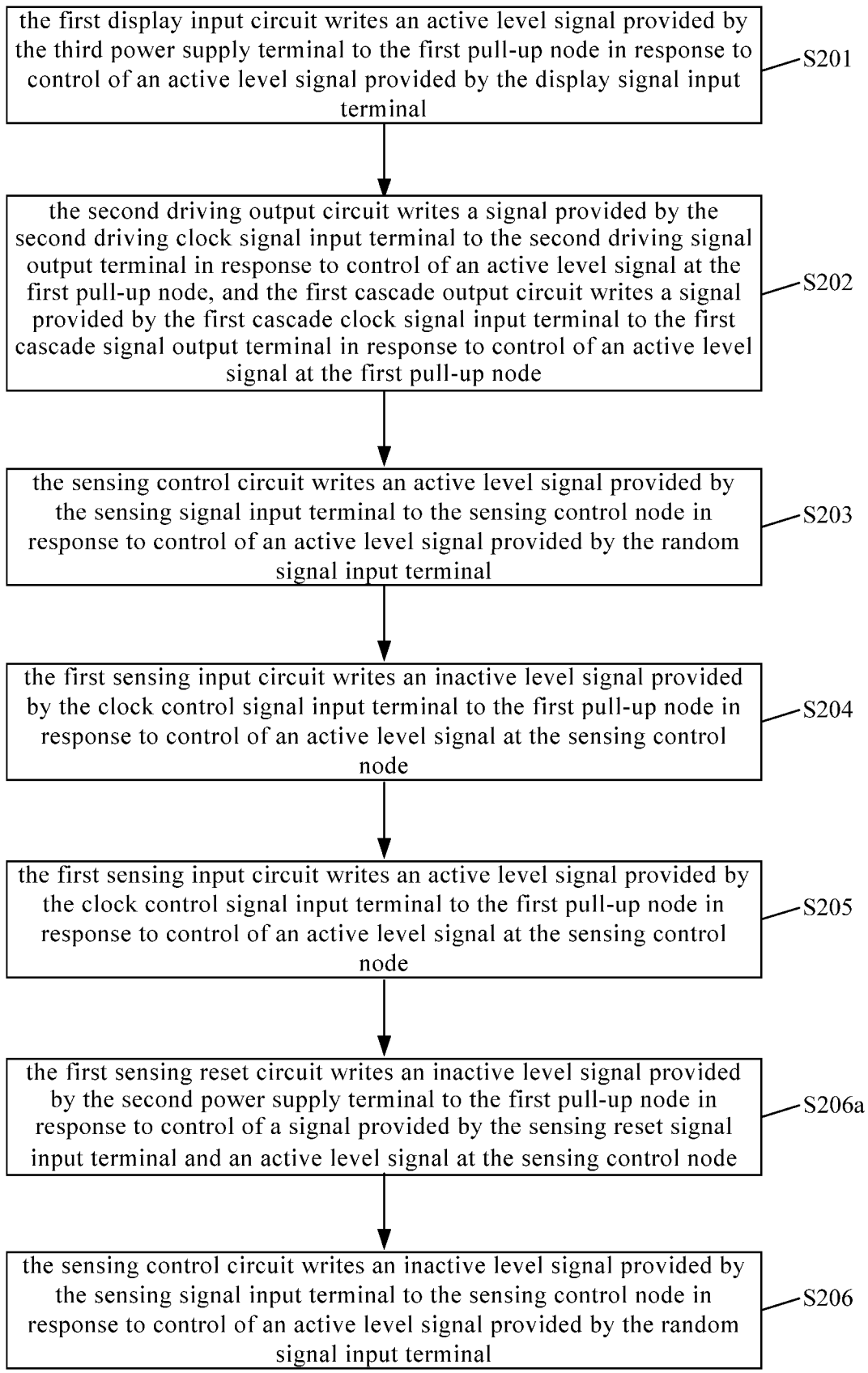
FIG. 40 is a flowchart illustrating yet another gate driving method according to the embodiments of the present disclosure.

FIG. 40 is a flowchart illustrating yet another gate driving method according to the embodiments of the present disclosure. As shown in FIG. 40, in some embodiments, the shift register unit is not only provided with the first display input circuit, the second driving output circuit, and the first cascade output circuit but also provided with the first sensing reset circuit, and the gate driving method not only includes the above steps S201 to S206 but also includes step S206*a* between the step S205 and the step S206.

In step S206*a*, the first sensing reset circuit writes an inactive level signal provided by the second power supply terminal to the first pull-up node in response to control of a signal provided by the sensing reset signal input terminal and an active level signal at the sensing control node.

Reference may be made to the relevant description of the operating timing shown in FIG. 12 or FIG. 15 for a detailed description of each step in the gate driving method provided by these embodiments.

It should be understood that the above embodiments are merely exemplary embodiments adopted to illustrate the principle of the present disclosure, and the present disclosure is not limited thereto. Various modifications and improvements can be made by those of ordinary skill in the art without departing from the spirit and essence of the present disclosure, and those modifications and improvements are also considered to fall within the scope of the present disclosure.

What is claimed is:

1. A shift register unit, comprising:
 a sensing control circuit connected to a sensing signal input terminal, a random signal input terminal, and a sensing control node, and configured to write a signal provided by the sensing signal input terminal to the sensing control node in response to control of an active level signal provided by the random signal input terminal;
 a first sensing input circuit connected to a clock control signal input terminal, the sensing control node, and a first pull-up node, and configured to write a signal provided by the clock control signal input terminal to the first pull-up node only in response to control of an active level signal at the sensing control node; and
 a first driving output circuit connected to the first pull-up node, a first driving clock signal input terminal, and a first driving signal output terminal, and configured to write a signal provided by the first driving clock signal input terminal to the first driving signal output terminal in response to control of an active level signal at the first pull-up node,
 wherein the shift register unit further comprises:
 a first display input circuit connected to a display signal input terminal, a third power supply terminal, and the first pull-up node, and configured to write an active level signal provided by the third power supply terminal to the first pull-up node in response to control of an active level signal provided by the display signal input terminal;
 a second driving output circuit connected to the first pull-up node, a second driving clock signal input terminal, and a second driving signal output terminal, and configured to write a signal provided by the second driving clock signal input terminal to the second driving signal output terminal in response to control of an active level signal at the first pull-up node; and
 a first cascade output circuit connected to the first pull-up node, a first cascade clock signal input terminal, and a first cascade signal output terminal, and configured to write a signal provided by the first cascade clock signal input terminal to the first cascade signal output terminal in response to control of an active level signal at the first pull-up node.

2. The shift register unit of claim 1, further comprising:
 a first voltage control circuit connected to the third power supply terminal, the first pull-up node, and a first voltage control node, and configured to write an active level signal provided by the third power supply terminal to the first voltage control node in response to control of an active level signal at the first pull-up node; and the shift register unit further comprising: a first sensing input anti-leakage circuit, wherein the first sensing input circuit is connected to the clock control signal input terminal through the first sensing input anti-leakage circuit, and is connected to the first sensing input anti-leakage circuit at a first sensing input anti-leakage node, and the first sensing input anti-leakage node is connected to the first voltage control node; and the first sensing input anti-leakage circuit is connected to the sensing control node, and is configured to form a path between the first sensing input anti-leakage node and the clock control signal input terminal in response to control of an active level signal at the sensing control node, and cut off the path between the first sensing input anti-leakage node and the clock control signal input terminal in response to control of an inactive level signal at the sensing control node.

3. The shift register unit of claim 2, wherein the first sensing input circuit comprises: a second transistor;
a control electrode of the second transistor is connected to the sensing control node, a first electrode of the second transistor is connected to the clock control signal input terminal, and a second electrode of the second transistor is connected to the first pull-up node;
the first voltage control circuit comprises: a twentieth transistor;
a control electrode of the twentieth transistor is connected to the first pull-up node, a first electrode of the twentieth transistor is connected to the third power supply terminal, and a second electrode of the twentieth transistor is connected to the first voltage control node;
the first sensing input anti-leakage circuit includes: a third transistor; and
a control electrode of the third transistor is connected to the sensing control node, a first electrode of the third transistor is connected to the clock control signal input terminal, and a second electrode of the third transistor is connected to the first sensing input anti-leakage node.

4. The shift register unit of claim 1, further comprising: a first sensing input anti-leakage circuit, wherein the first sensing input circuit is connected to the clock control signal input terminal through the first sensing input anti-leakage circuit, and is connected to the first sensing input anti-leakage circuit at a first sensing input anti-leakage node; and
the first sensing input anti-leakage circuit is connected to a preset input control signal input terminal and the first cascade signal output terminal, and is configured to form a path between the first sensing input anti-leakage node and the clock control signal input terminal in response to control of an active level signal provided by the preset input control signal input terminal, cut off the path between the first sensing input anti-leakage node and the clock control signal input terminal in response to control of an inactive level signal provided by the preset input control signal input terminal, and write an active level signal to the first sensing input anti-leakage node in response to control of an active level signal provided by the first cascade signal output terminal when the path between the first sensing input anti-leakage node and the clock control signal input terminal is cut off.

5. The shift register unit of claim 4, wherein the first sensing input anti-leakage circuit comprises: a third transistor and a fourth transistor;
a control electrode of the third transistor is connected to the preset input control signal input terminal, a first electrode of the third transistor is connected to the clock control signal input terminal, and a second electrode of the third transistor is connected to the first sensing input anti-leakage node; and
a control electrode and a first electrode of the fourth transistor are both connected to the first cascade signal output terminal, and a second electrode of the fourth transistor is connected to the first sensing input anti-leakage node.

6. The shift register unit of claim 1, further comprising:
a first global reset circuit connected to a global reset signal input terminal, a second power supply terminal, and the first pull-up node, and configured to write an inactive level signal provided by the second power supply terminal to the first pull-up node in response to control of an active level signal provided by the global reset signal input terminal;
a first display reset circuit connected to a display reset signal input terminal, the second power supply terminal, and the first pull-up node, and configured to write an inactive level signal provided by the second power supply terminal to the first pull-up node in response to control of an active level signal provided by the display reset signal input terminal;
a first pull-down control circuit connected to the second power supply terminal, a fifth power supply terminal, the first pull-up node, and a first pull-down node, and configured to write a voltage having a phase opposite to that of a voltage at the first pull-up node to the first pull-down node; and
a first pull-up noise reduction circuit connected to the second power supply terminal, the first pull-up node, and the first pull-down node, and configured to write an inactive level signal provided by the second power supply terminal to the first pull-up node in response to control of an active level signal at the first pull-down node;
wherein the first cascade output circuit is further connected to the first pull-down node and the second power supply terminal, and is further configured to write an inactive level signal provided by the second power supply terminal to the first cascade signal output terminal in response to control of an active level signal at the first pull-down node;
the first driving output circuit is further connected to the first pull-down node and a fourth power supply terminal, and is further configured to write an inactive level signal provided by the fourth power supply terminal to the first driving signal output terminal in response to control of an active level signal at the first pull-down node; and
the second driving output circuit is further connected to the first pull-down node and the fourth power supply terminal, and is further configured to write an inactive level signal provided by the fourth power supply terminal to the second driving signal output terminal in response to control of an active level signal at the first pull-down node,
the shift register unit further comprises:
a first voltage control circuit connected to the third power supply terminal, the first pull-up node, and a first voltage control node, and configured to write an active level signal provided by the third power supply terminal to the first voltage control node in response to control of an active level signal at the first pull-up node; and the shift register unit further comprises: at least one of a first anti-leakage circuit, a second anti-leakage circuit, and a third anti-leakage circuit;

wherein the first global reset circuit is connected to the second power supply terminal through the first anti-leakage circuit, and is connected to the first anti-leakage circuit at a first anti-leakage node, and the first anti-leakage node is connected to the first voltage control node; and the first anti-leakage circuit is connected to the global reset signal input terminal, and is configured to form a path between the first anti-leakage node and the second power supply terminal in response to control of an active level signal provided by the global reset signal input terminal, and cut off the path between the first anti-leakage node and the second power supply terminal in response to control of an inactive level signal provided by the global reset signal input terminal;

the first display reset circuit is connected to the second power supply terminal through the second anti-leakage circuit, and is connected to the second anti-leakage circuit at a second anti-leakage node, and the second anti-leakage node is connected to the first voltage control node; and the second anti-leakage circuit is connected to the display reset signal input terminal, and is configured to form a path between the second anti-leakage node and the second power supply terminal in response to control of an active level signal provided by the display reset signal input terminal, and cut off the path between the second anti-leakage node and the second power supply terminal in response to control of an inactive level signal provided by the display reset signal input terminal; and the first pull-up noise reduction circuit is connected to the second power supply terminal through the third anti-leakage circuit, and is connected to the third anti-leakage circuit at a third anti-leakage node, and the third anti-leakage node is connected to the first voltage control node; and the third anti-leakage circuit is connected to the first pull-down node, and is configured to form a path between the third anti-leakage node and the second power supply terminal in response to control of an active level signal at the first pull-down node, and cut off the path between the third anti-leakage node and the second power supply terminal in response to control of an inactive level signal at the first pull-down node.

7. The shift register unit of claim 1, further comprising:
a first sensing reset circuit connected to a sensing reset signal input terminal, the sensing control node, the first pull-up node, and a second power supply terminal, and configured to write an inactive level signal provided by the second power supply terminal to the first pull-up node in response to control of a signal provided by the sensing reset signal input terminal and an active level signal at the sensing control node.

8. The shift register unit of claim 7, wherein the first sensing reset circuit comprises:
a first sensing reset control circuit connected to the sensing reset signal input terminal, a first sensing reset control node, the sensing control node, and the second power supply terminal, and configured to write an active level signal at the sensing control node to the first sensing reset control node in response to control of an inactive level signal provided by the sensing reset signal input terminal and the active level signal at the sensing control node;

a first switch circuit connected to the first sensing reset control node, the first pull-up node, and the second power supply terminal, and configured to form a path between the second power supply terminal and the first pull-up node in response to control of an active level signal at the first sensing reset control node, and cut off the path between the second power supply terminal and the first pull-up node in response to control of an inactive level signal at the first sensing reset control node;

the shift register unit further comprises: a first voltage control circuit connected to a third power supply terminal, the first pull-up node, and a first voltage control node, and configured to write an active level signal provided by the third power supply terminal to the first voltage control node in response to control of an active level signal at the first pull-up node;

the shift register unit further comprises: a first sensing reset anti-leakage circuit, wherein the first switch circuit is connected to the second power supply terminal through the first sensing reset anti-leakage circuit, and is connected to the first sensing reset anti-leakage circuit at a first sensing reset anti-leakage node, and the first sensing reset anti-leakage node is connected to the first voltage control node; and the first sensing reset anti-leakage circuit is connected to the first sensing reset control node, and is configured to form a path between the first sensing reset anti-leakage node and the second power supply terminal in response to control of an active level signal at the first sensing reset control node, and cut off the path between the first sensing reset anti-leakage node and the second power supply terminal in response to control of an inactive level signal at the first sensing reset control node.

9. The shift register unit of claim 8, wherein the first sensing reset control circuit comprises: a seventy-first transistor and a seventy-second transistor, and the first switch circuit comprises: a seventy-third transistor;
a control electrode and a first electrode of the seventy-first transistor are both connected to the sensing control node, and a second electrode of the seventy-first transistor is connected to the first sensing reset control node;
a control electrode of the seventy-second transistor is connected to the sensing reset signal input terminal, a first electrode of the seventy-second transistor is connected to the first sensing reset control node, and a second electrode of the seventy-second transistor is connected to the second power supply terminal;
a control electrode of the seventy-third transistor is connected to the first sensing reset control node, a first electrode of the seventy-third transistor is connected to the first pull-up node, and a second electrode of the seventy-third transistor is connected to the second power supply terminal;
the first voltage control circuit comprises: a twentieth transistor;
a control electrode of the twentieth transistor is connected to the first pull-up node, a first electrode of the twentieth transistor is connected to the third power supply terminal, and a second electrode of the twentieth transistor is connected to the first voltage control node;
the first sensing reset anti-leakage circuit comprises: a seventy-fourth transistor; and a control electrode of the seventy-fourth transistor is connected to the first sensing reset control node, a first electrode of the seventy-fourth transistor is connected to the first sensing reset anti-leakage node, and a second electrode of the seventy-fourth transistor is connected to the second power supply terminal.

10. The shift register unit of claim 7, wherein the first sensing reset circuit comprises: a second switch circuit and a third switch circuit connected in series between the first pull-up node and a second power supply terminal, and the second switch circuit is between the third switch circuit and the first pull-up node;
   one of the second switch circuit and the third switch circuit is connected to the sensing reset signal input terminal, and the other is connected to the sensing control node; and
   the second switch circuit and the third switch circuit are configured to form a path between the second power supply terminal and the first pull-up node in response to control of an active level signal provided by the sensing reset signal input terminal and an active level signal at the sensing control node, and cut off the path between the second power supply terminal and the first pull-up node in response to control of a low level signal provided by at least one of the sensing reset signal input terminal and the sensing control node;
   the shift register unit further comprises: a first voltage control circuit connected to a third power supply terminal, the first pull-up node, and a first voltage control node, and configured to write an active level signal provided by the third power supply terminal to the first voltage control node in response to control of an active level signal at the first pull-up node;
   the shift register unit further comprises: a first sensing reset anti-leakage circuit;
   wherein the second switch circuit is connected to the sensing reset signal input terminal, is connected to the third switch circuit through the first sensing reset anti-leakage circuit, and is connected to the first sensing reset anti-leakage circuit at a first sensing reset anti-leakage node, and the first sensing reset anti-leakage node is connected to the first voltage control node; and
   the first sensing reset anti-leakage circuit is connected to the sensing reset signal input terminal, and is configured to form a path between the first sensing reset anti-leakage node and the third switch circuit in response to control of an active level signal at the sensing reset signal input terminal, and cut off the path between the first sensing reset anti-leakage node and the third switch circuit in response to control of an inactive level signal at the sensing reset signal input terminal; or
   the third switch circuit is connected to the sensing reset signal input terminal, is connected to the second power supply terminal through the first sensing reset anti-leakage circuit, and is connected to the first sensing reset anti-leakage circuit at the first sensing reset anti-leakage node, and the first sensing reset anti-leakage node is connected to the first voltage control node; and
   the first sensing reset anti-leakage circuit is connected to the sensing reset signal input terminal, and is configured to form a path between the first sensing reset anti-leakage node and the second power supply terminal in response to control of an active level signal at the sensing reset signal input terminal, and cut off the path between the first sensing reset anti-leakage node and the second power supply terminal in response to control of an inactive level signal at the sensing reset signal input terminal.

11. The shift register unit of claim 10, wherein the second switch circuit comprises: a seventy-first transistor, and the third switch circuit comprises: a seventy-second transistor;
   a control electrode of one of the seventy-first transistor and the seventy-second transistor is connected to the sensing reset signal input terminal, and a control electrode of the other is connected to the sensing control node;
   a first electrode of the seventy-first transistor is connected to the first pull-up node, a second electrode of the seventy-first transistor is connected to a first electrode of the seventy-second transistor, and a second electrode of the seventy-second transistor is connected to the second power supply terminal;
   the first voltage control circuit comprises: a twentieth transistor;
   a control electrode of the twentieth transistor is connected to the first pull-up node, a first electrode of the twentieth transistor is connected to the third power supply terminal, and a second electrode of the twentieth transistor is connected to the first voltage control node;
   the first sensing reset anti-leakage circuit comprises: a seventy-fourth transistor, a control electrode of the seventy-fourth transistor is connected to the sensing reset signal input terminal, and a first electrode of the seventy-fourth transistor is connected to the first sensing reset anti-leakage node;
   in a case where the second switch circuit is connected to the sensing reset signal input terminal, a second electrode of the seventy-fourth transistor is connected to the third switch circuit; and
   in a case where the third switch circuit is connected to the sensing reset signal input terminal, the second electrode of the seventy-fourth transistor is connected to the second power supply terminal.

12. The shift register unit of claim 1, further comprising:
   a second sensing input circuit connected to the clock control signal input terminal, the sensing control node, and a second pull-up node, and configured to write a signal provided by the clock control signal input terminal to the second pull-up node in response to control of an active level signal at the sensing control node;
   a second display input circuit connected to the display signal input terminal and the second pull-up node, and configured to write an active level signal to the second pull-up node in response to control of an active level signal provided by the display signal input terminal;
   a third driving output circuit connected to the second pull-up node, a third driving clock signal input terminal, and a third driving signal output terminal, and configured to write a signal provided by the third driving clock signal input terminal to the third driving signal output terminal in response to control of an active level signal at the second pull-up node; and
   a fourth driving output circuit connected to the second pull-up node, a fourth driving clock signal input terminal, and a fourth driving signal output terminal, and configured to write a signal provided by the fourth driving clock signal input terminal to the fourth driving signal output terminal in response to control of an active level signal at the second pull-up node.

13. The shift register unit of claim 12, further comprising:
a first voltage control circuit connected to the third power supply terminal, the first pull-up node, and a first voltage control node, and configured to write an active level signal provided by the third power supply terminal to the first voltage control node in response to control of an active level signal at the first pull-up node;

the shift register unit further comprising: a first sensing input anti-leakage circuit, wherein the first sensing input circuit is connected to the clock control signal input terminal through the first sensing input anti-leakage circuit, and is connected to the first sensing input anti-leakage circuit at a first sensing input anti-leakage node, and the first sensing input anti-leakage node is connected to the first voltage control node;

the first sensing input anti-leakage circuit is connected to the sensing control node, and is configured to form a path between the first sensing input anti-leakage node and the clock control signal input terminal in response to control of an active level signal at the sensing control node, and cut off the path between the first sensing input anti-leakage node and the clock control signal input terminal in response to control of an inactive level signal at the sensing control node; and the second sensing input circuit is connected to the first sensing input anti-leakage node, so to be connected to the clock control signal input terminal through the first sensing input anti-leakage node and the first sensing input anti-leakage circuit.

14. The shift register unit of claim 12, further comprising:
a second cascade output circuit connected to the second pull-up node, a second cascade clock signal input terminal, and a second cascade signal output terminal, and configured to write a signal provided by the second cascade clock signal input terminal to the second cascade signal output terminal in response to control of an active level signal at the second pull-up node; and the shift register unit further comprising: a second sensing input anti-leakage circuit, wherein the second sensing input circuit is connected to a clock control signal input terminal through the second sensing input anti-leakage circuit, and is connected to the second sensing input anti-leakage circuit at a second sensing input anti-leakage node; and the second sensing input anti-leakage circuit is connected to a preset input control signal input terminal and the second cascade signal output terminal, and is configured to form a path between the second sensing input anti-leakage node and the clock control signal input terminal in response to control of an active level signal provided by the preset input control signal input terminal, cut off the path between the second sensing input anti-leakage node and the clock control signal input terminal in response to control of an inactive level signal provided by the preset input control signal input terminal, and write an active level signal to the second sensing input anti-leakage node in response to control of an active level signal provided by the second cascade signal output terminal when the path between the second sensing input anti-leakage node and the clock control signal input terminal is cut off.

15. The shift register unit of claim 12, further comprising:
a second global reset circuit connected to a global reset signal input terminal, a first inactive level supply terminal, and the second pull-up node, and configured to write an inactive level signal provided by the first inactive level supply terminal to the second pull-up node in response to control of an active level signal provided by the global reset signal input terminal;

a second display reset circuit connected to a display reset signal input terminal, the first inactive level supply terminal, and the second pull-up node, and configured to write an inactive level signal provided by the first inactive level supply terminal to the second pull-up node in response to control of an active level signal provided by the display reset signal input terminal;

a second pull-down control circuit connected to a second power supply terminal, a sixth power supply terminal, the second pull-up node, and a second pull-down node, and configured to write a voltage having a phase opposite to that of a voltage at the second pull-up node to the second pull-down node; and a second pull-up noise reduction circuit connected to the first inactive level supply terminal, the second pull-up node, and the second pull-down node, and configured to write an inactive level signal provided by the first inactive level supply terminal to the second pull-up node in response to control of an active level signal at the second pull-down node;

wherein the third driving output circuit is further connected to the second pull-down node and a fourth power supply terminal, and is further configured to write an inactive level signal provided by the fourth power supply terminal to the third driving signal output terminal in response to control of an active level signal at the second pull-down node; and the fourth driving output circuit is further connected to the second pull-down node and the fourth power supply terminal, and is further configured to write an inactive level signal provided by the fourth power supply terminal to the fourth driving signal output terminal in response to control of an active level signal at the second pull-down node;

wherein the first inactive level supply terminal is the second power supply terminal;

or, the shift register unit comprises a first voltage control circuit connected to the third power supply terminal, the first pull-up node, and a first voltage control node, and configured to write an active level signal provided by the third power supply terminal to the first voltage control node in response to control of an active level signal at the first pull-up node, and the first inactive level supply terminal is the first voltage control node connected to the first voltage control circuit.

16. The shift register unit of claim 12, comprising a first sensing reset circuit comprising a second switch circuit and a third switch circuit; and the shift register unit further comprising a second sensing reset circuit, wherein the second sensing reset circuit comprises: a fifth switch circuit and a sixth switch circuit connected in series between the second pull-up node and a second power supply terminal, and the fifth switch circuit is between the sixth switch circuit and the second pull-up node;

one of the fifth switch circuit and the sixth switch circuit is connected to a sensing reset signal input terminal, and the other is connected to the sensing control node; and the fifth switch circuit and the sixth switch circuit are configured to form a path between the second power supply terminal and the second pull-up node in response to control of an active level signal provided by the sensing reset signal input terminal and an active level signal at the sensing control node, and cut off the path between the second power supply terminal and the second pull-up node in response to control of a low level signal provided by at least one of the sensing reset signal input terminal and the sensing control node, the shift register unit further comprises:

a second voltage control circuit connected to a third power supply terminal, the second pull-up node, and a second voltage control node, and configured to write an active level signal provided by the third power supply terminal to the second voltage control node in response to control of an active level signal at the second pull-up node;

the shift register unit further comprises: a second sensing reset anti-leakage circuit;

wherein the fifth switch circuit is connected to the sensing reset signal input terminal, is connected to the sixth switch circuit through the second sensing reset anti-leakage circuit, and is connected to the second sensing reset anti-leakage circuit at a second sensing reset anti-leakage node, and the second sensing reset anti-leakage node is connected to the second voltage control node; and the second sensing reset anti-leakage circuit is connected to the sensing reset signal input terminal, and is configured to form a path between the second sensing reset anti-leakage node and the sixth switch circuit in response to control of an active level signal at the sensing reset signal input terminal, and cut off the path between the second sensing reset anti-leakage node and the sixth switch circuit in response to control of an inactive level signal at the sensing reset signal input terminal; or the sixth switch circuit is connected to the sensing reset signal input terminal, is connected to the second power supply terminal through the second sensing reset anti-leakage circuit, and is connected to the second sensing reset anti-leakage circuit at a second sensing reset anti-leakage node, and the second sensing reset anti-leakage node is connected to the second voltage control node; and the second sensing reset anti-leakage circuit is connected to the sensing reset signal input terminal, and is configured to form a path between the second sensing reset anti-leakage node and the second power supply terminal in response to control of an active level signal at the sensing reset signal input terminal, and cut off the path between the second sensing reset anti-leakage node and the second power supply terminal in response to control of an inactive level signal at the sensing reset signal input terminal.

17. A gate driving circuit, comprising: a plurality of shift register units that are cascaded, each of the plurality of shift register units is the shift register unit of claim 1.

18. A gate driving method based on the shift register unit of claim 1, comprising:

writing, by the sensing control circuit, a signal provided by the sensing signal input terminal to the sensing control node in response to control of an active level signal provided by the random signal input terminal;

writing, by the first sensing input circuit, a signal provided by the clock control signal input terminal to the first pull-up node in response to control of an active level signal at the sensing control node; and writing, by the first driving output circuit, a signal provided by the first driving clock signal input terminal to the first driving signal output terminal in response to control of an active level signal at the first pull-up node.

19. A shift register unit, comprising:

a sensing control circuit connected to a sensing signal input terminal, a random signal input terminal, and a sensing control node, and configured to write a signal provided by the sensing signal input terminal to the sensing control node in response to control of an active level signal provided by the random signal input terminal;

a first sensing input circuit connected to an active level supply terminal, a clock control signal input terminal, the sensing control node, and a first pull-up node, controlled by a signal at the sensing control node and a signal provided by the clock control signal input terminal, and configured to write an active level signal provided by the active level supply terminal to the first pull-up node in response to control of an active level signal at the sensing control node and an active level signal provided by the clock control signal input terminal;

a first sensing reset circuit connected to a sensing reset signal input terminal, the sensing control node, the first pull-up node, and a second power supply terminal, and configured to write an inactive level signal provided by the second power supply terminal to the first pull-up node in response to control of a signal provided by the sensing reset signal input terminal and an active level signal at the sensing control node; and a first driving output circuit connected to the first pull-up node, a first driving clock signal input terminal, and a first driving signal output terminal, and configured to write a signal provided by the first driving clock signal input terminal to the first driving signal output terminal in response to control of an active level signal at the first pull-up node.

* * * * *